United States Patent [19]
Arai et al.

[11] Patent Number: 5,770,958
[45] Date of Patent: Jun. 23, 1998

[54] PERIODIC WAVEFORM GENERATING CIRCUIT

[75] Inventors: Kunihiro Arai; Hideaki Matsuzaki, both of Kanagawa, Japan

[73] Assignee: Nippon Telegraph and Telephone Corporation, Tokyo, Japan

[21] Appl. No.: 831,995

[22] Filed: Apr. 1, 1997

[30] Foreign Application Priority Data

Apr. 4, 1996 [JP] Japan ................................. 8-082178
Dec. 20, 1996 [JP] Japan ................................. 8-341975

[51] Int. Cl.$^6$ ............................ H03B 19/00; H03K 17/70
[52] U.S. Cl. ......................... 327/114; 327/291; 327/498; 327/568
[58] Field of Search ..................... 331/57, 115, 132–134; 327/291, 113, 114, 115, 116, 498, 499, 500, 501, 124, 172, 175, 568–570, 169, 192, 195, 196, 326, 397, 602; 326/123, 132, 134, 135

[56] References Cited

U.S. PATENT DOCUMENTS

| | | | |
|---|---|---|---|
| 3,201,603 | 8/1965 | Gerlach | 327/500 |
| 3,740,576 | 6/1973 | Haraszti | 326/123 |
| 4,553,047 | 11/1985 | Dillinger et al. | 331/57 |
| 5,313,117 | 5/1994 | Maezawa | 326/134 |
| 5,479,129 | 12/1995 | Fernandez et al. | 327/568 |

OTHER PUBLICATIONS

IEEE Electron Device Letters, vol. 16, No. 5, May 1995, pp. 178–180. "Static Random Access Memories Based on Resonat Interband Tunneling Diodes in the InAs/GaSb/AlSb Material System", J. Shen et. al.(Motorola).

MIT Lincoln Labo. Solid State Reserch Quarterly Technical Report, 30 Sep. 1993, pp.35–41. "7.2 Tunnel–Diode Shift Register Using Tunnel–Diode Coupling", T.C.L.G.Sollner et. al.

*Primary Examiner*—Toan Tran
*Attorney, Agent, or Firm*—Blakely Sokoloff; Taylor & Zafman

[57] ABSTRACT

A first partial circuit is formed by grounding the emitter electrode of a first negative differential resistive element, connecting the emitter electrode of a second negative differential resistive element to the collector electrode of the first negative differential resistive element, and connecting a first field-effect transistor in parallel with the first negative differential resistive element. A second partial circuit is formed by grounding the emitter electrode of a third negative differential resistive element, connecting the emitter electrode of a fourth negative differential resistive element to the collector electrode of the third negative differential resistive element, and connecting a second field-effect transistor in parallel with the third negative differential resistive element. An output from the first partial circuit is input to the input of the second partial circuit. The inversion of the output of the second partial circuit is input to the input of the first partial circuit. A clock signal and a signal whose phase is opposite to that of the clock signal are applied to the collector electrodes of the second and fourth negative differential resistive elements, respectively. A frequency-divided signal of the clock signal is output from each partial circuit.

11 Claims, 42 Drawing Sheets

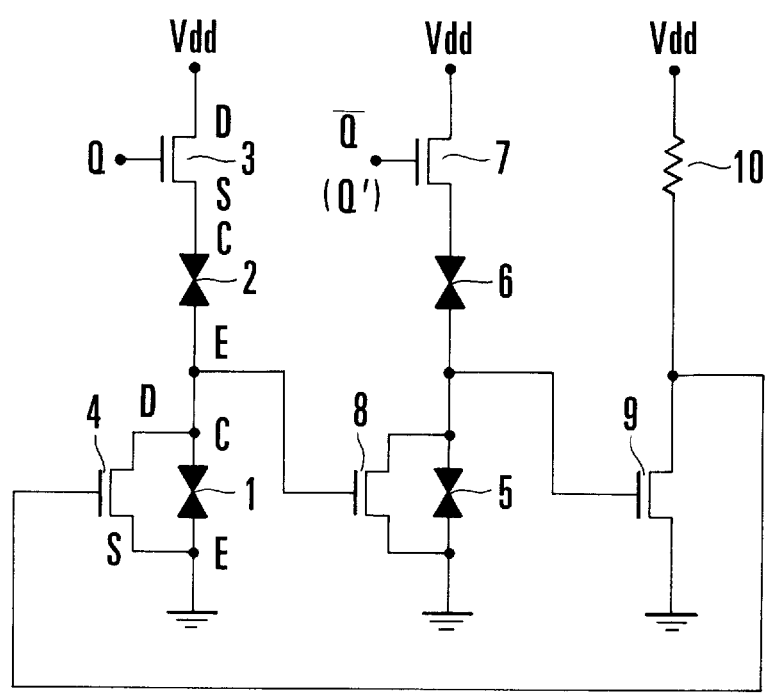
F I G. 1

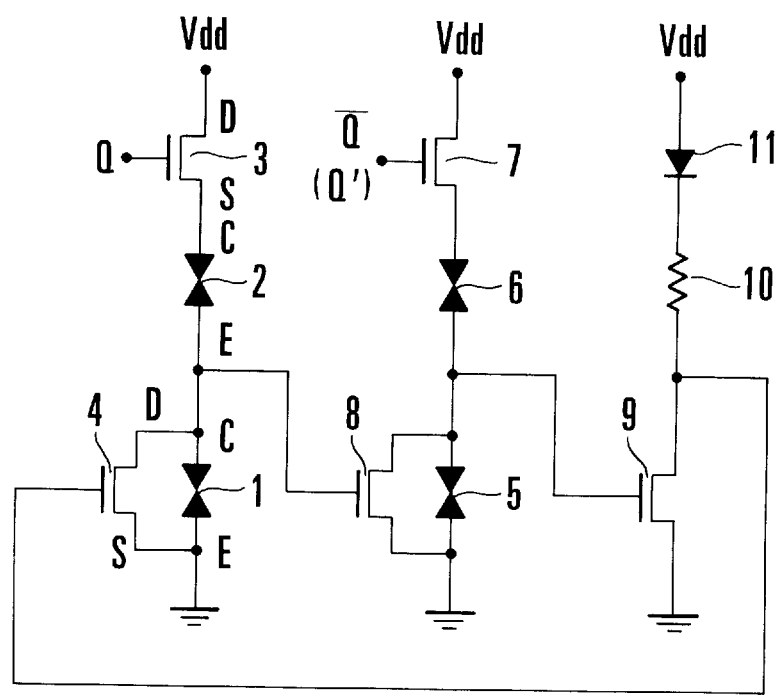
F I G. 2
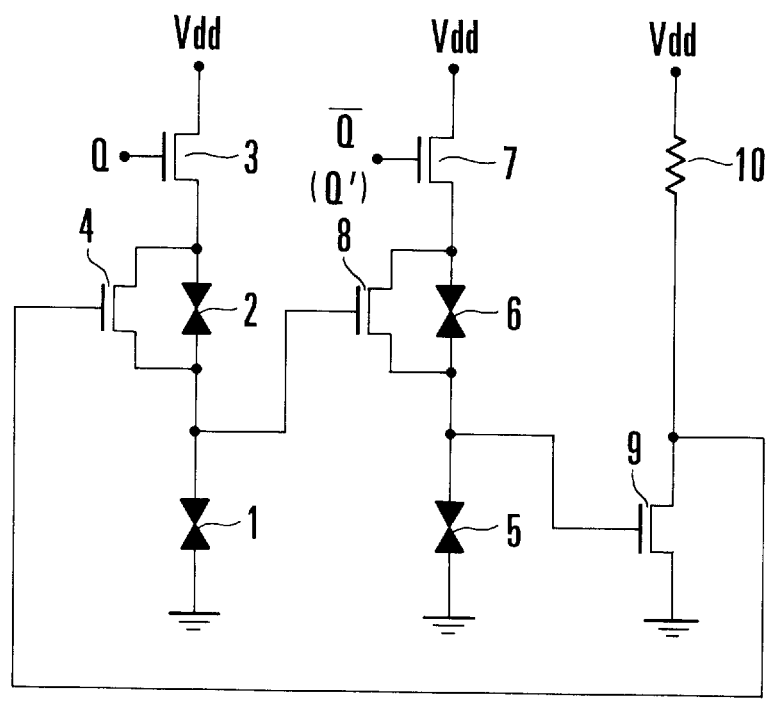
F I G. 3

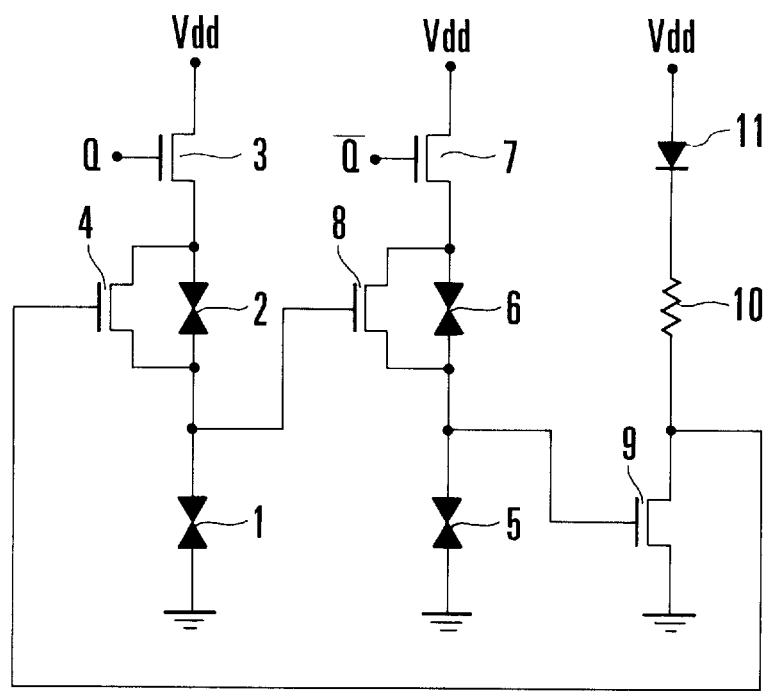
F I G. 4
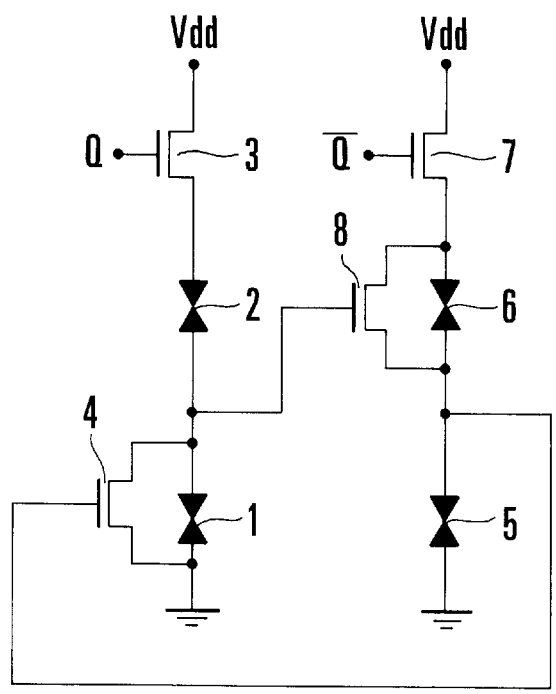
F I G. 5

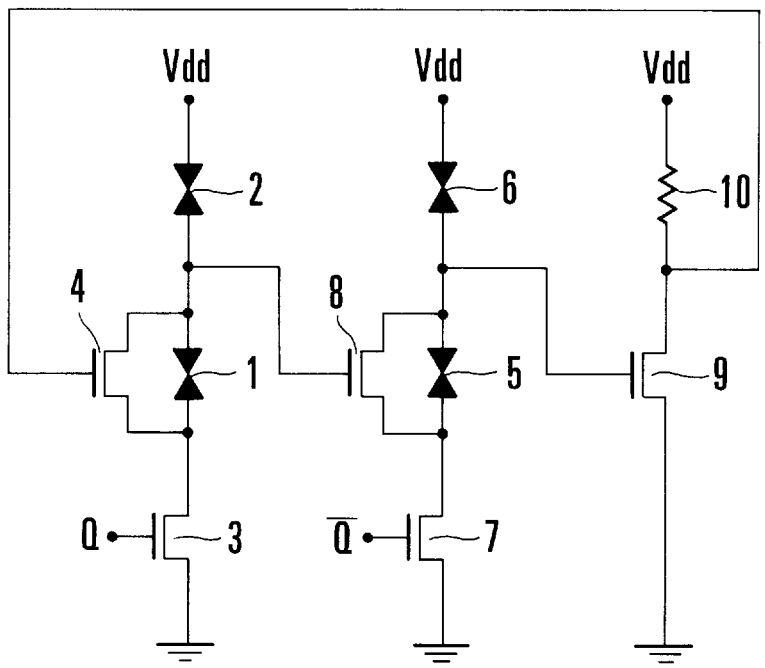
F I G. 6
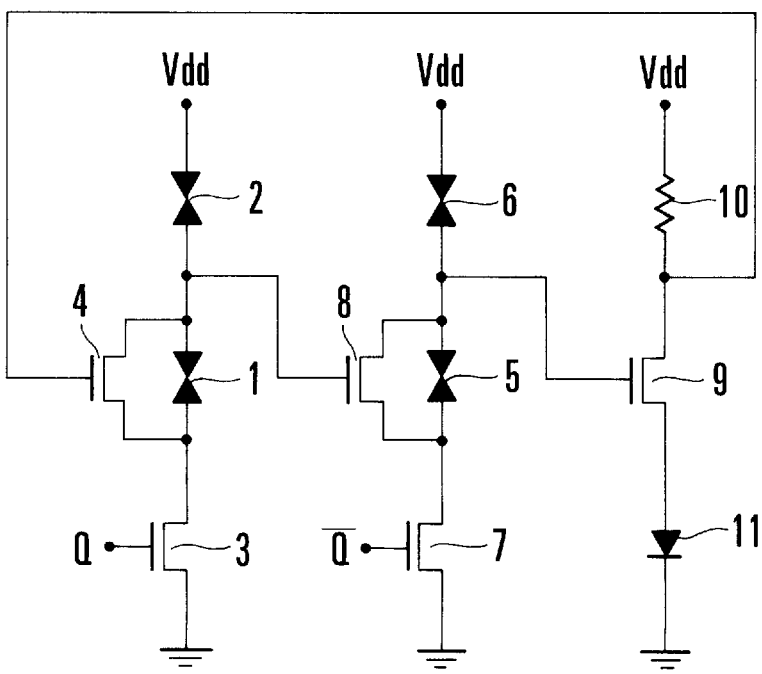
F I G. 7

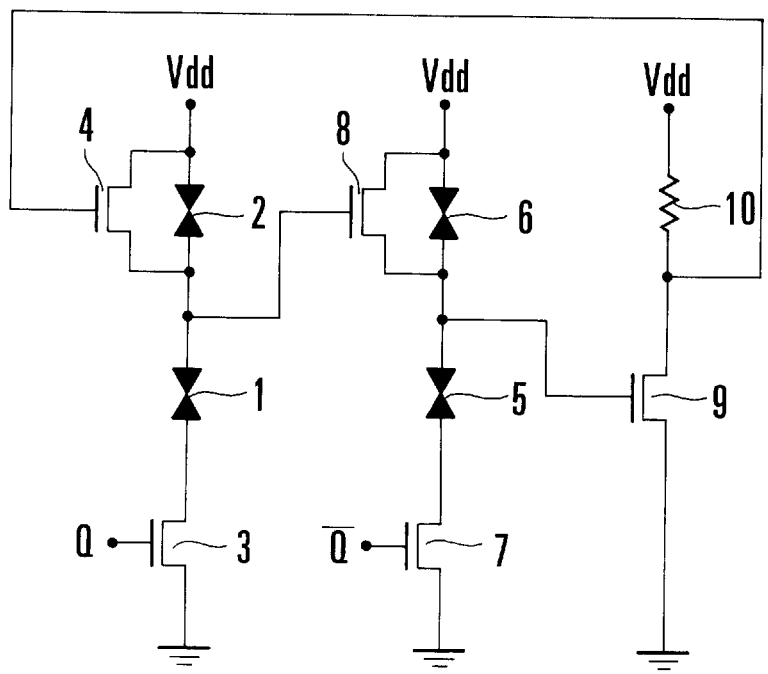
F I G. 8
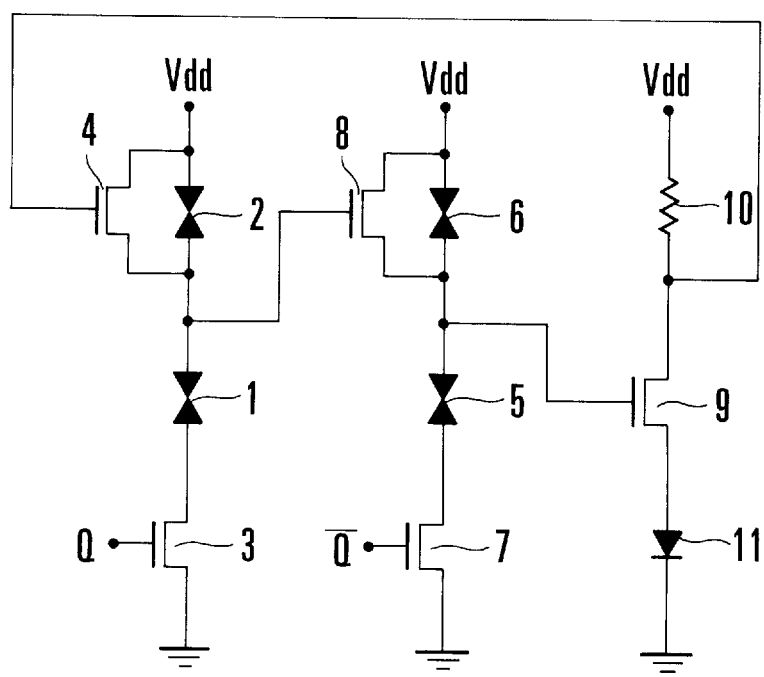
F I G. 9

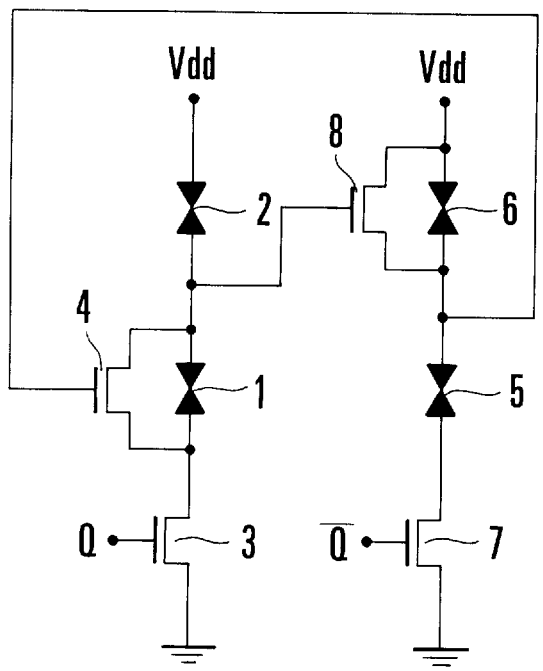
F I G. 10
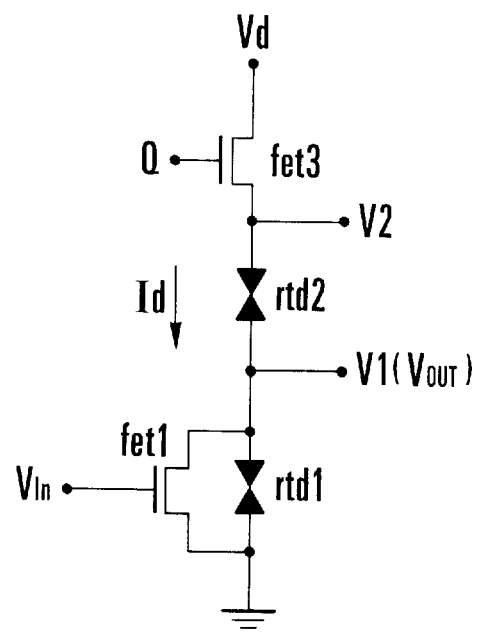
F I G. 11

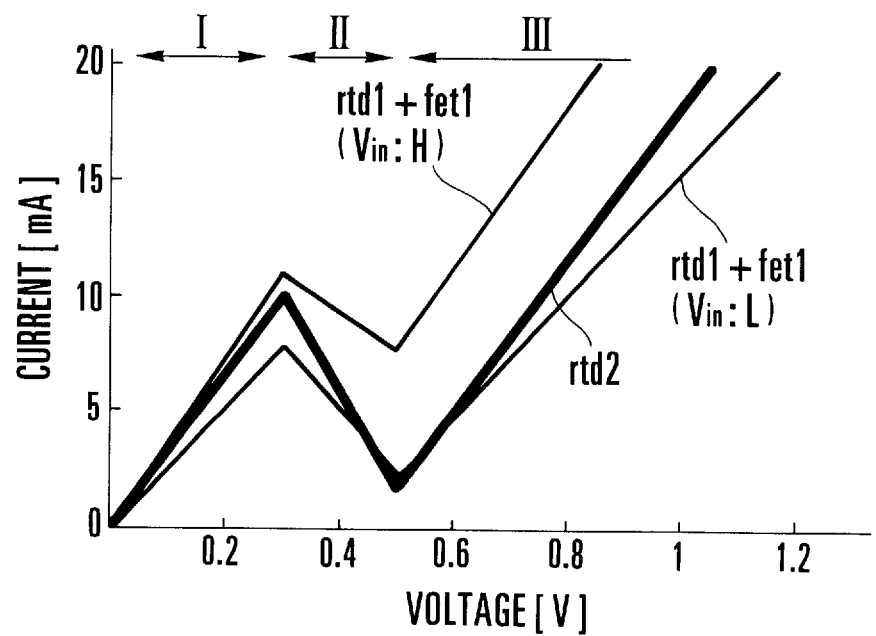
F I G. 12 A
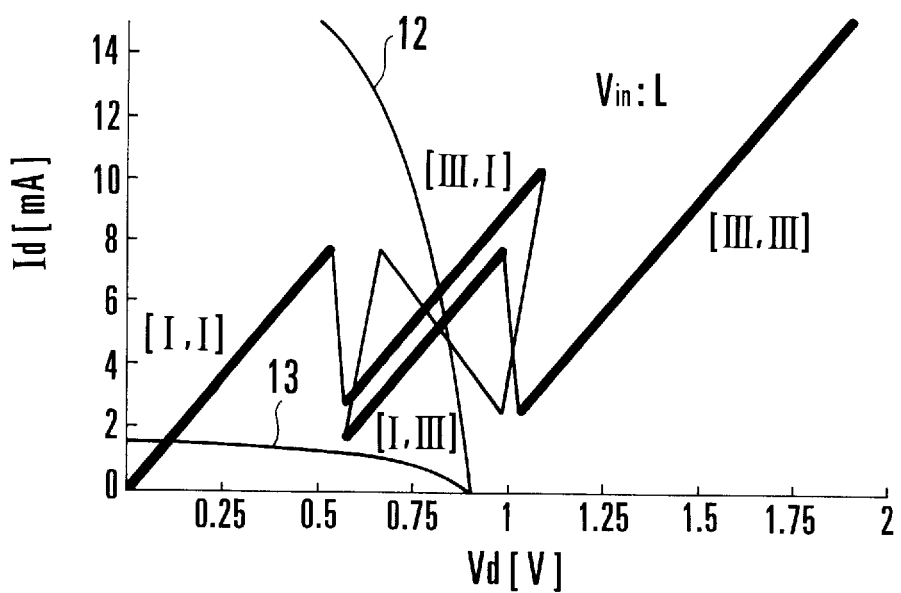
F I G. 12 B

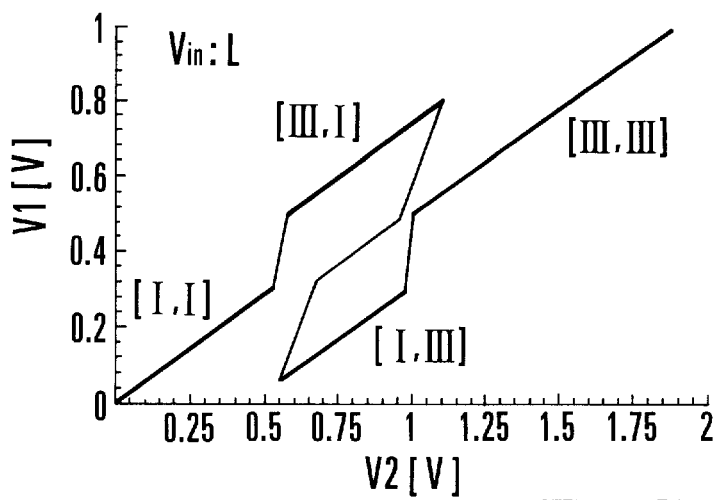
F I G. 13 A
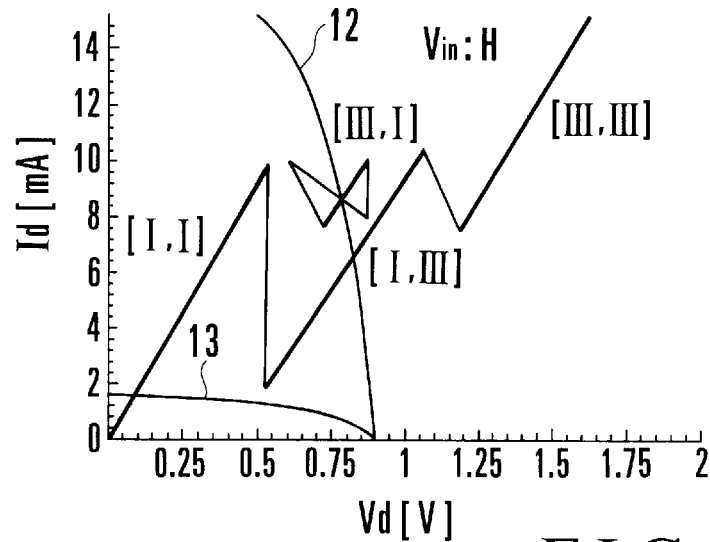
F I G. 13 B
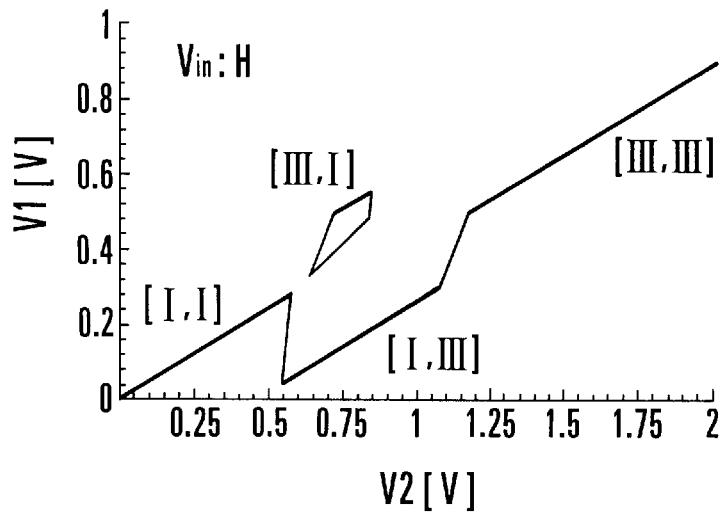
F I G. 13 C

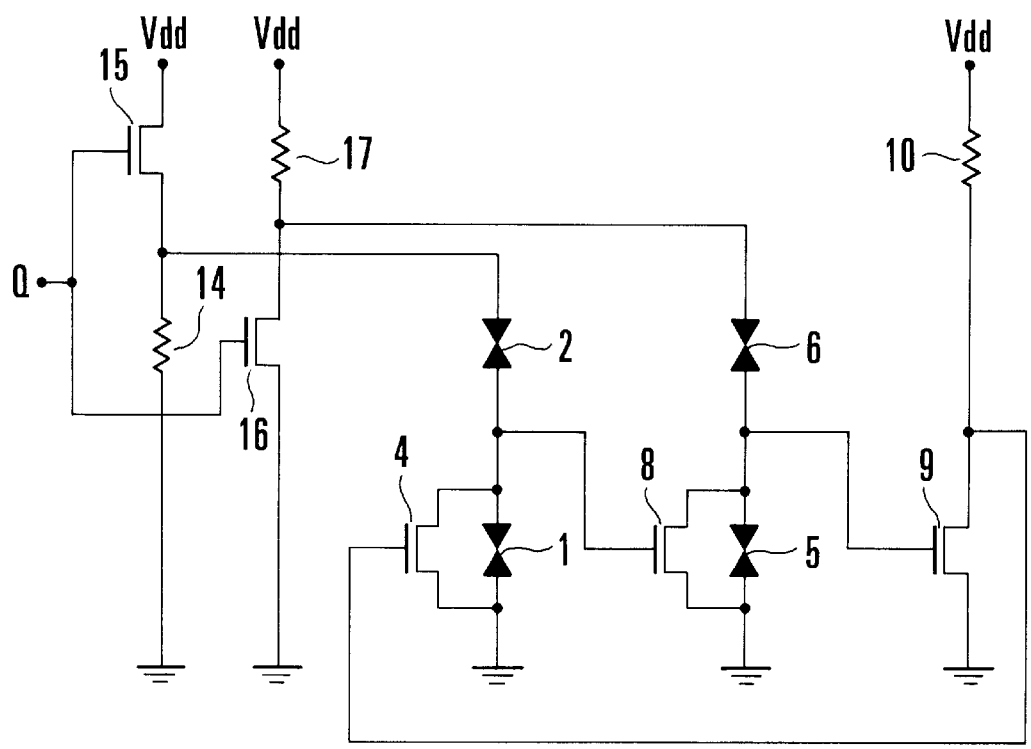
F I G. 16
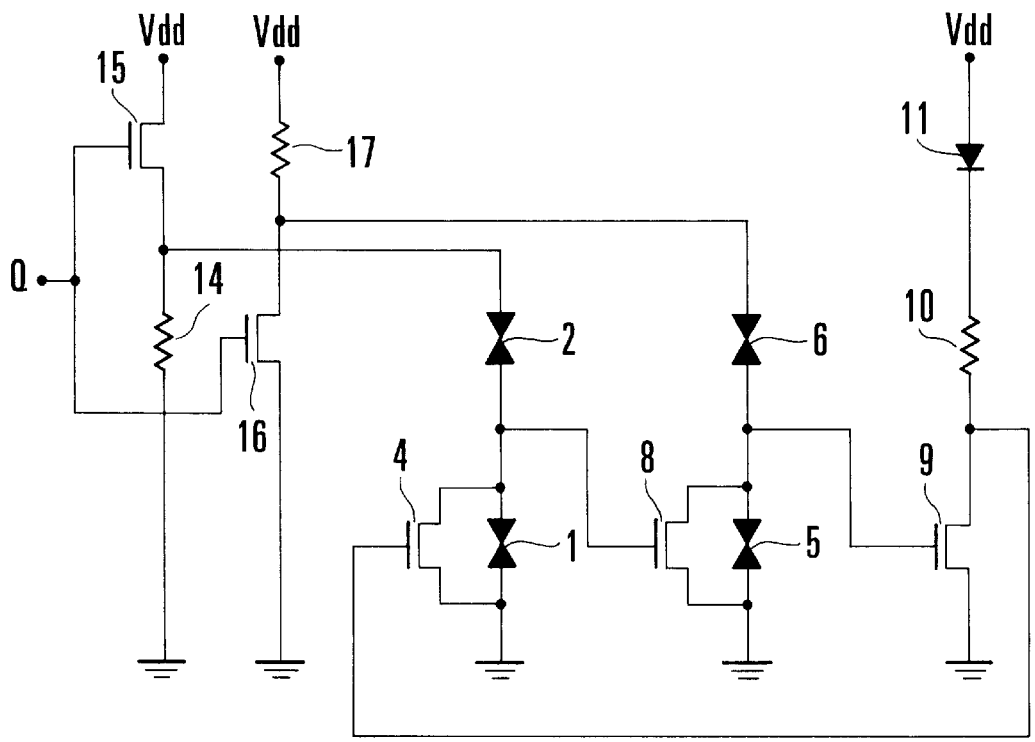
F I G. 17

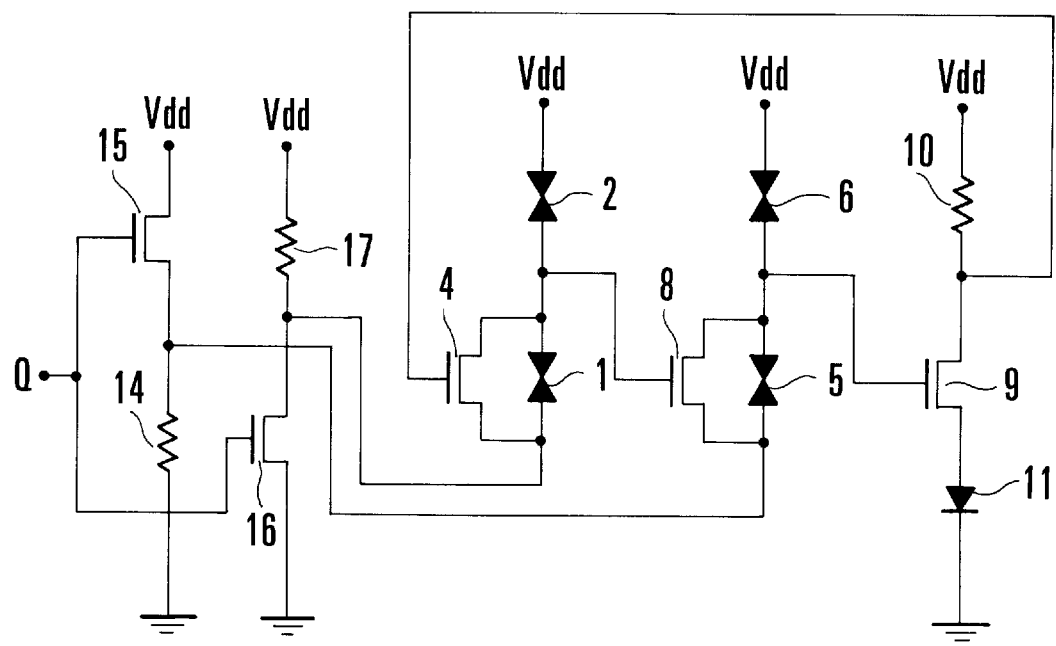
F I G. 22
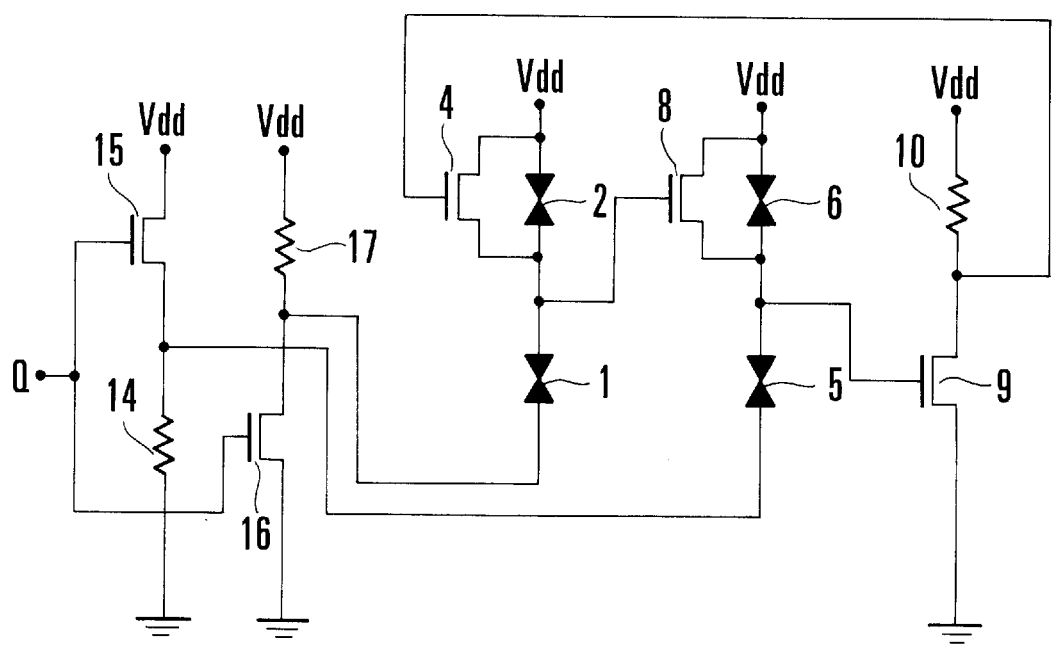
F I G. 23

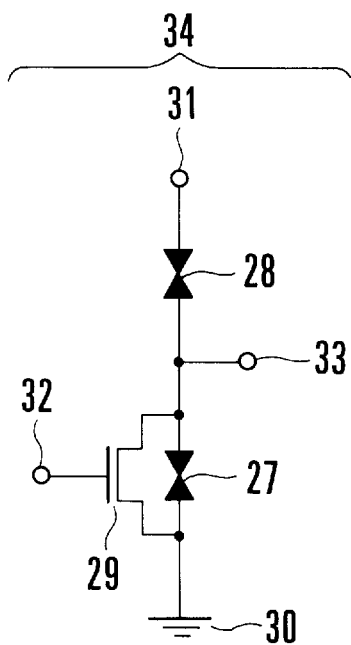
F I G. 27 A
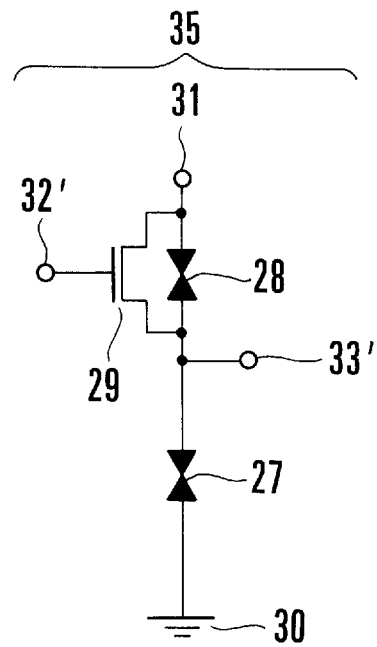
F I G. 27 B
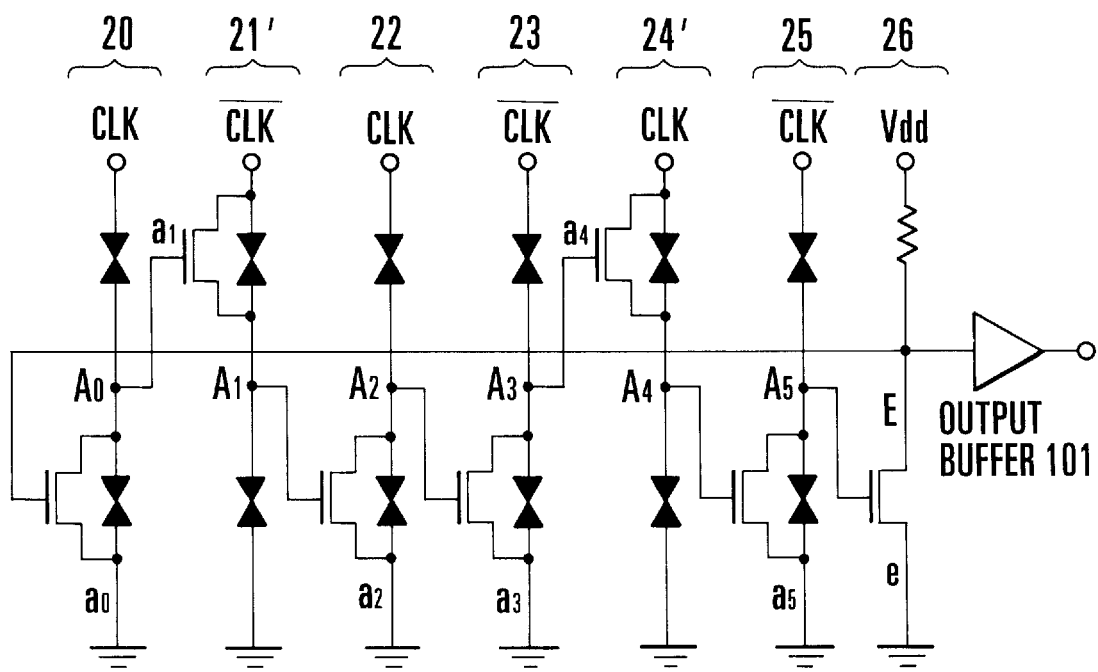
F I G. 28

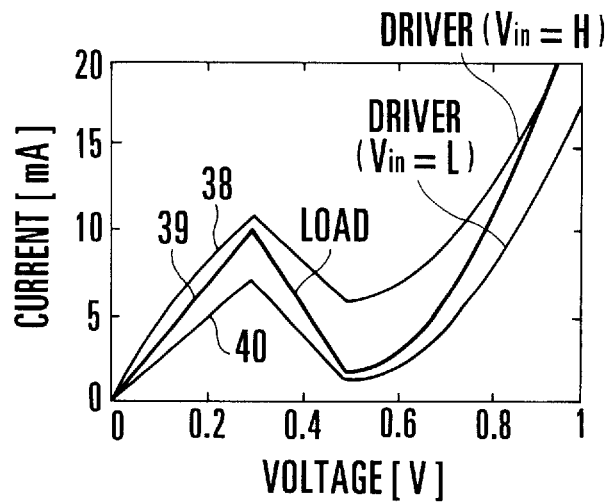
F I G. 31 A
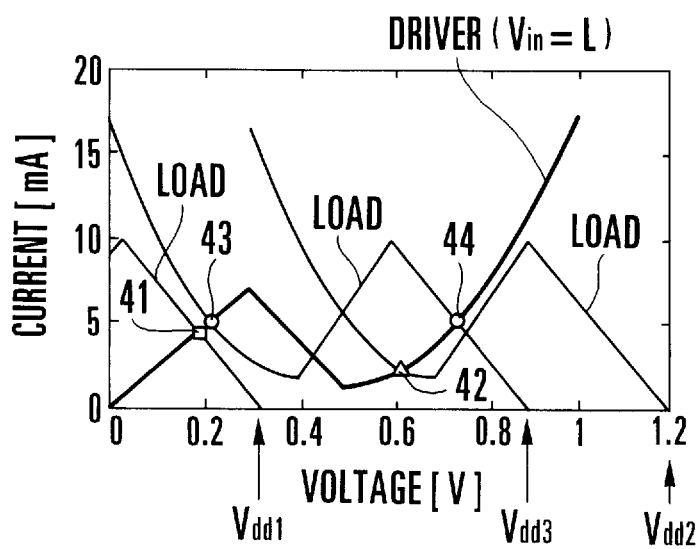
F I G. 31 B

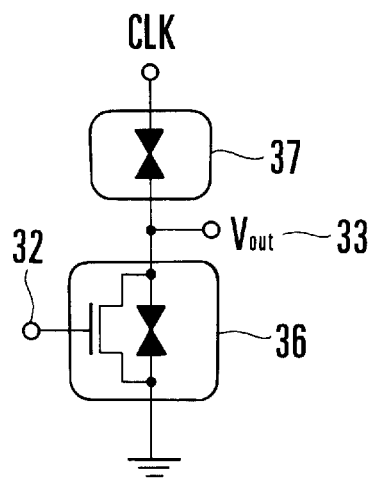
F I G. 33
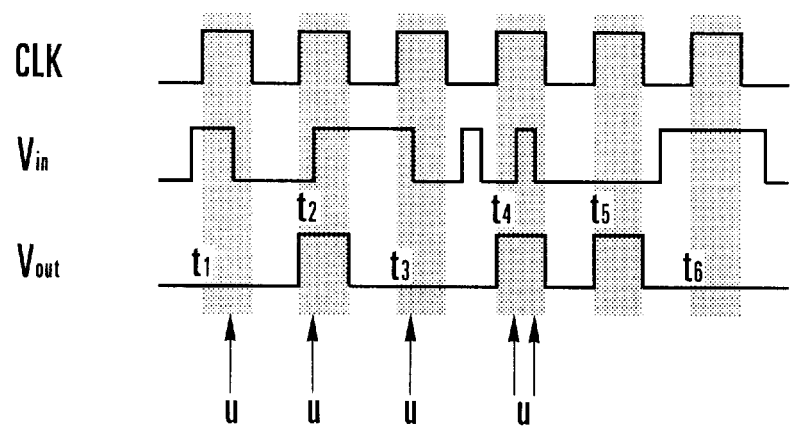
F I G. 34

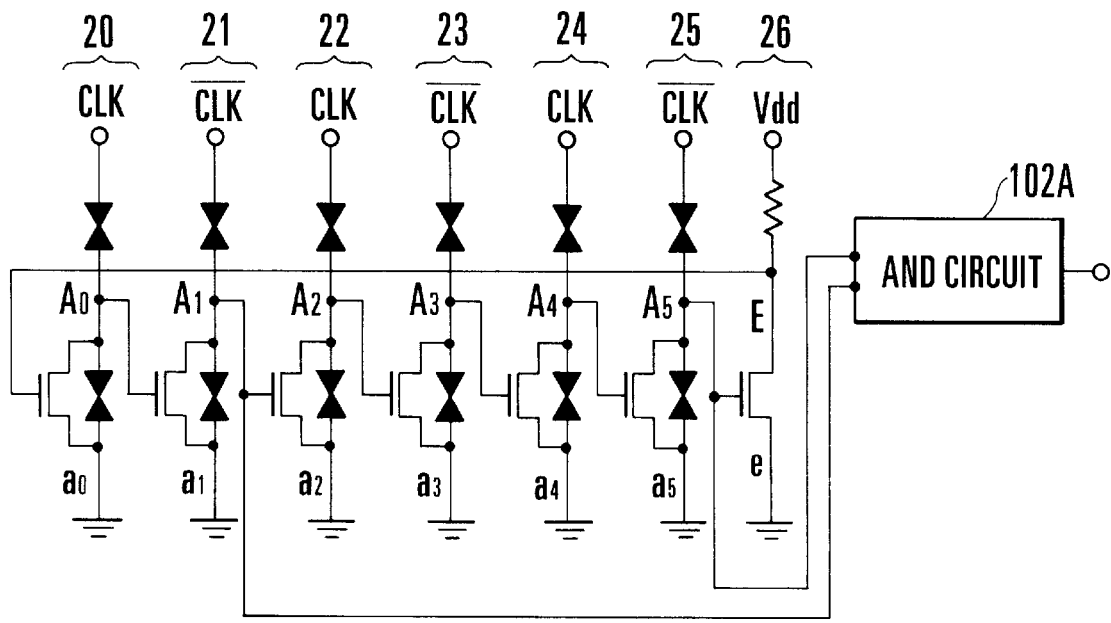
F I G. 37 A
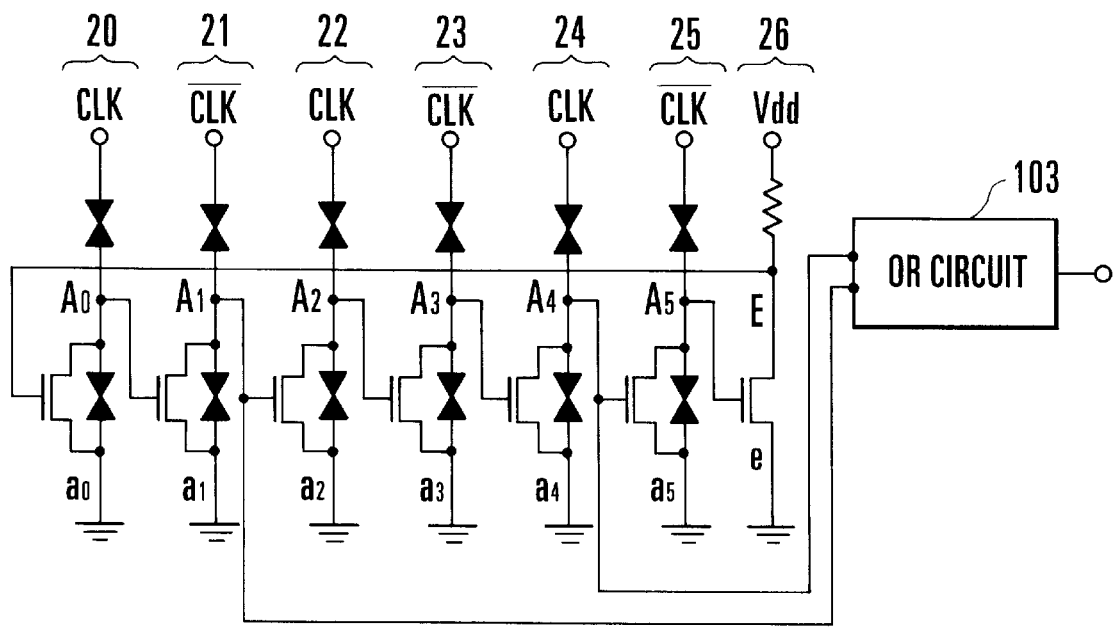
F I G. 37 B

FIG. 39A CLK
FIG. 39B A1 and A5 / A0 and A4
FIG. 39C A1 or A4
FIG. 39D A1 or A1'

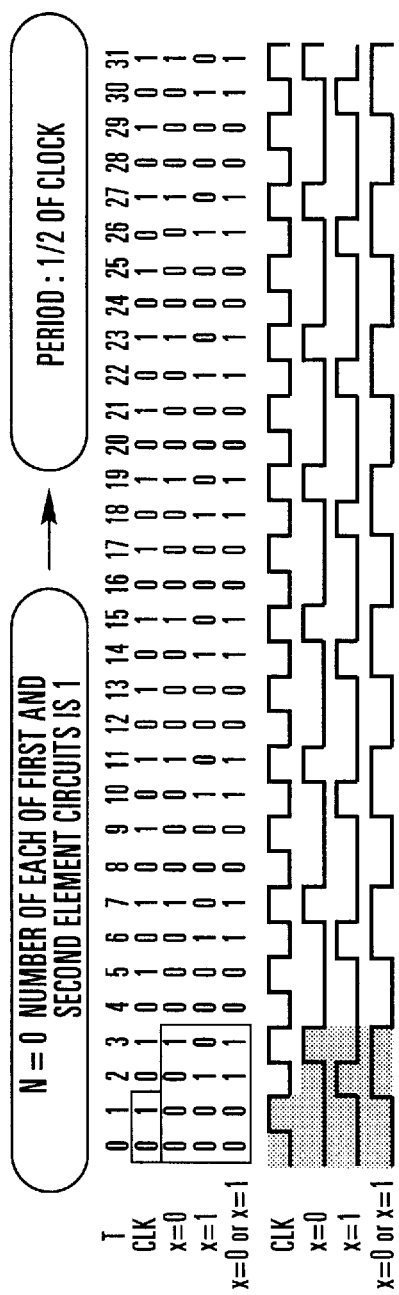
F I G. 40

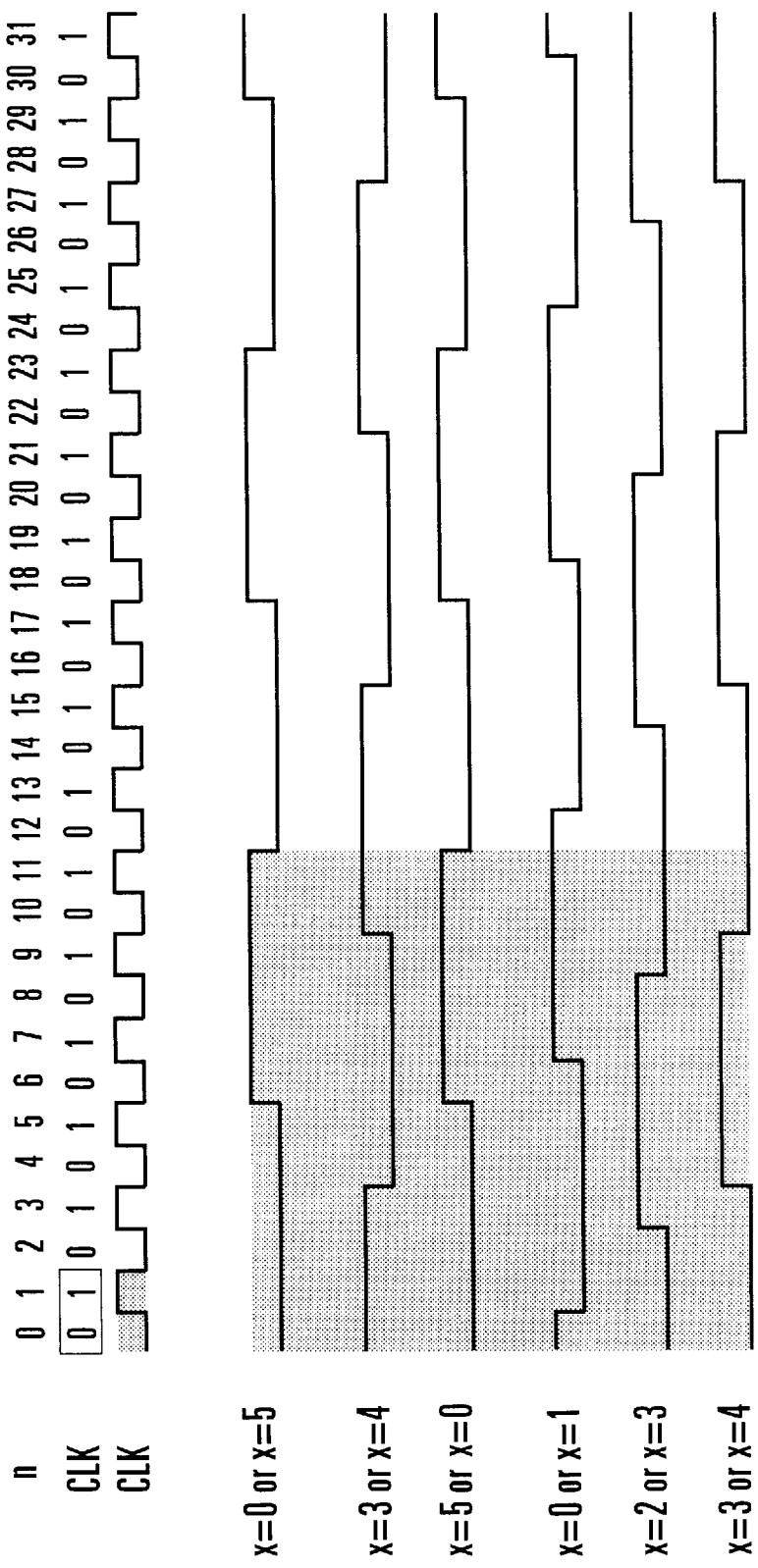
F I G. 47

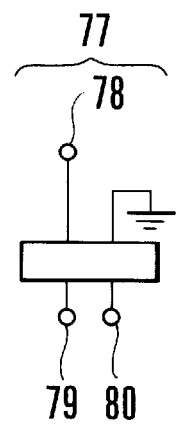 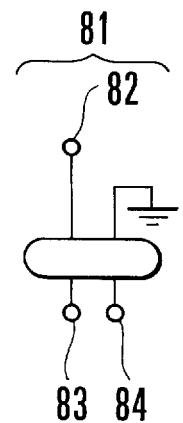
FIG. 48 A   FIG. 48 B
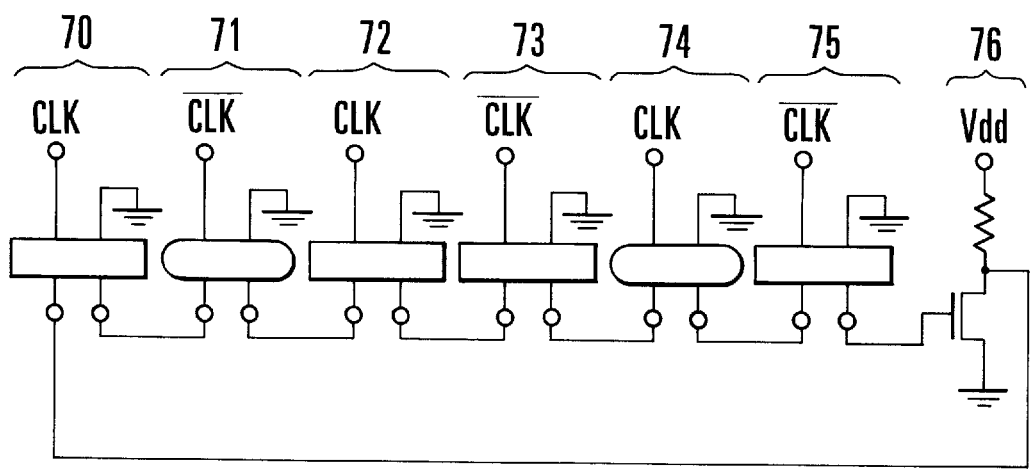
FIG. 48 C

PERIODIC WAVEFORM GENERATING CIRCUIT

BACKGROUND OF THE INVENTION

The present invention relates to a periodic waveform generating circuit.

A prior art close to the present invention is shown in FIG. 49. A ½ static frequency divider constituted by a source coupled field-effect transistor logic circuit (SCFL) is known ((Reference 1) Yohtaro Umeda, Kazuo Osafune, Takatomo Enoki, Hiroshi Ito, and Yasunobu Ishii, "SCFL Static Frequency Divider Using InAlAs/InGaAs/InP HEMTs", the 25th European Microwave Conference, 1995, Proceedings, pp. 222–228).

This conventional circuit has a function of converting an input high-frequency into a high frequency which is ½ the input frequency and outputting this ½ frequency. In FIG. 49, reference symbols GND, IN, $V_{REF}$, $V_{SC}$, $V_{SS}$, and $V_{out}$ denote a ground potential, an input potential, a reference potential, a constant-current source setting potential, a power supply potential, and an output potential, respectively. Assume that $V_{SS}$ takes a negative value and the reference potential $V_{REF}$ takes an intermediate value between a high potential (H) and a low potential (L).

The configuration of the above conventional circuit will be described below. This conventional circuit comprises three circuits: an input buffer circuit, a toggle flip-flop circuit, and an output buffer circuit. Of these circuits, the toggle flip-flop circuit is the principal part of this conventional circuit and has a function of generating a high frequency which is ½ the frequency of an input signal. The input buffer circuit converts an input signal consisting of a high potential (H) and a low potential (L) into differential paired signals, i.e., a pair of (H,L) and a pair of (L,H), suited to signal processing performed by the principal portion (toggle flip-flop circuit) of this circuit. The input buffer circuit also has a function of returning the potential of the H or L signal to a predetermined value. The output buffer circuit receives the result of the signal processing done by the main part (toggle flip-flop circuit) of this circuit, reproduces the potential of the signal, and supplies the signal to the outside.

The principles of operations of this conventional circuit will be described below. First, the principle of operation of the input buffer circuit will be described with reference to FIGS. 49, 50A, 50B, 51A, and 51B. In FIGS. 50A, 50B, 51A, and 51B, thick lines indicate current paths. This input buffer circuit has a pair of field-effect transistors as indicated by $b_i$ in FIG. 49. When the input potential (IN) is a high potential (H), a current flows only through the left-side field-effect transistor as shown in FIGS. 50A and 51A. Conversely, when the input potential (IN) is a low potential (L), a current flows only through the right-side field-effect transistor as shown in FIGS. 50B and 51B. This is so because the current flowing through this pair of field-effect transistors is restricted by a field-effect transistor 101 (FIG. 49) immediately close to a constant-current source, i.e., the power supply $V_{SS}$. When the input potential (IN) is the high potential (H), the input buffer circuit outputs a pair of (L,H) as shown in FIGS. 50A and 51A. When the input potential (IN) is the low potential (L), the input buffer circuit outputs a pair of (H,L) as shown in FIGS. 50B and 51B.

The principle of operation of the toggle flip-flop circuit as the principal part of this conventional circuit will be described below. This toggle flip-flip circuit has six pairs of field-effect transistors as indicated by x, y, a, b, c, and d in FIG. 49. Of these transistor pairs, the gate potentials of the pairs x and y are uniquely determined by the input potential (IN) to the input buffer. That is, when the input potential (IN) is the high potential (H), the input buffer circuit outputs the pair of (L,H) as shown in FIGS. 50A and 51A. Therefore, the gate potential of x is the pair of (L,H) and the gate potential of y is the pair of (H,L). When the input potential (IN) is the low potential (L), the input buffer circuit outputs the pair of (H,L) as shown in FIGS. 50B and 51B. Accordingly, the gate potential of x is the pair of (H,L) and the gate potential of y is the pair of (L,H). This means that the input potential (IN) to the input buffer switches current paths in the field-effect transistor pairs x and y. The potentials of the pairs a, b, c, and d are not uniquely determined by the input potential (IN) to the input buffer. As shown in Table 1, each pair can take one of two states when the input potential (IN) to the input buffer is either H or L. In Table 1, H,L indicates the gate potential of a field-effect transistor pair on a path where a current flows, and h,l indicates the gate potential of a field-effect transistor pair on a path where no current flows.

The outputs from the toggle flip-flop circuit when the input potential (IN) to the input buffer changes in order of H, L, H, L, . . . will be examined below. First, assume that the input potential (IN) to the input buffer is H and the gate potentials of a, b, c, and d are in the states (corresponding to FIG. 50A) shown in the first row of Table 1. In this case, the output from the toggle flip-flop circuit is (l,h). Transistor pairs on paths where a current flows are b and c, and the pairs a and d are not on a path where a current flows. Accordingly, the states of b and c determine the states of a and d.

TABLE 1

| Input potential (IN) to input buffer | a | b | c | d | Current Path |
|---|---|---|---|---|---|
| H | (h,l) | (L,H) | (H,L) | (h,l) | FIG. 50A |
|   | (l,h) | (H,L) | (L,H) | (l,h) | FIG. 51A |
| L | (H,L) | (h,l) | (l,h) | (H,L) | FIG. 50B |
|   | (L,H) | (l,h) | (h,l) | (L,H) | FIG. 51B |

Second, when the input potential (IN) to the input buffer changes to L, the states of a, b, c, and d change to the states (corresponding to FIG. 50B) shown in the third row of Table 1 for the reason explained below. When the input potential (IN) to the input buffer changes from H to L, the current paths change; i.e., a and d are on paths where a current flows, and b and c are no longer on a path where a current flows. Consequently, a and d change from (h,l) to (H,L), and b changes from (L,H) to (h,l) and c changes from (H,L) to (l,h) accordingly. That is, the states of a and d on the current paths determine the states of b and c. At this time, the output from the toggle flip-flop circuit is (L,H).

Third, when the input (IN) to the input buffer changes to H, the states of a, b, c, and d change to the states (corresponding to FIG. 51A) shown in the second row of Table 1 due to the same mechanism as above. At this time, the output from the toggle flip-flop circuit is (h,l).

Fourth, when the input potential (IN) to the input buffer changes to L, the states of a, b, c, and d change to the states (corresponding to FIG. 51B) shown in the fourth row of Table 1 due to the same mechanism as above. At this time, the output from the toggle flip-flop circuit is (H,L).

Furthermore, when the input potential (IN) to the input buffer changes to L, the state of the system returns to the state explained first. That is, as the input potential (IN) to the input buffer changes in order of H, L, H, L, . . . , the toggle flip-flop circuit repetitively outputs the basic units (l,h), (L,H), (h,l), and (H,L). l and L have the same potential, and h and H have the same potential. This demonstrates that this toggle flip-flop circuit has a function of converting the frequency of an input signal into a ½ frequency.

Finally, the principle of operation of the output buffer circuit will be described below. This output buffer circuit has a pair of field-effect transistors as indicated by $b_o$ in FIG. 49. An input to this output buffer circuit is one of (l,h), (L,H), (h,l), and (H,L). When the input is (l,h) or (L,H), a current flows only through the right-side field-effect transistor as shown in FIGS. 50A and 50B. Conversely, when the input is (h,l) or (H,L), a current flows only through the left-side field-effect transistor as shown in FIGS. 51A and 51B. This is so because a current flowing through this field-effect transistor pair $b_o$ is restricted by a field-effect transistor 102 (FIG. 49) immediately close to the constant-current source, i.e., the power supply $V_{SS}$. When the input is (l,h) or (L,H), the output buffer circuit outputs the pair of (H,L) as shown in FIGS. 50A and 50B. When the input is (h,l) or (H,L), the output buffer circuit outputs the pair of (L,H) as shown in FIGS. 51A and 51B. Accordingly, as the input potential (IN) to the input buffer changes in order of H, L, H, L, . . . , the basic units (l,h), (L,H), (h,l), and (H,L) are repetitively applied to the output buffer circuit. Therefore, the output buffer circuit repetitively outputs the basic units (H,L), (H,L), (L,H), and (L,H). When the input (IN) is fixed to the high potential (H) or the low potential (L), this conventional circuit can statically maintain the electrical state of the circuit.

In summary, this conventional circuit functions as a static frequency divider having a function of converting high-frequency inputs H, L, H, L, . . . , into high frequencies (H,L), (H,L), (L,H), (L,H), . . . , and outputting these ½ frequencies.

The operation of the toggle flip-flop circuit of this prior art can also be analyzed as follows by using recurrence formulas as a function of time. The state of an input to each of the field-effect transistor pairs a, b, c, d, x, and y in the toggle flip-flop is defined as H when the left-side field-effect transistor of the pair is H and the right-side field-effect transistor of the pair is L, and is defined as L in an opposite condition. A clock CLK is input to the field-effect transistor pair x. The index of this clock is determined as shown in FIG. 52. The index n is an integer, and the clock is L when n is an even number and H when n is an odd number. The potentials at time m of the field-effect transistor pairs a, b, c, and d are represented by a(m), b(m), c(m), and d(m), respectively, and relations established between them are calculated. Assume that the high potential H and the low potential L are represented by 1 an 0, respectively, in the following analysis.

First, equations [1] to [4] hold in accordance with wiring of the gate electrodes of the field-effect transistor pairs a and d and wiring of the gate electrodes of the field-effect transistor pairs b and c.

$$a(2n)=d(2n) \tag{1}$$

$$c(2n)=1-b(2n) \tag{2}$$

$$a(2n+1)=d(2n+1) \tag{3}$$

$$c(2n+1)=1-b(2n+1) \tag{4}$$

Equations [1] and [3] are obvious because the right and left gate electrodes of the field-effect transistor pair a are coupled with the right and left gate electrodes, respectively, of the field-effect transistor pair d. Similarly, equations [2] and [4] hold because the right and left gate electrodes of the field-effect transistor pair b are coupled with the left and right gate electrodes, respectively, of the field-effect transistor pair c. Also, equation [5] holds when the clock is L (FIGS. 50A and 51A).

$$c(2n)=d(2n) \tag{5}$$

Analogously, equation [6] holds when the clock is H (FIGS. 50B and 51B).

$$a(2n+1)=b(2n+1) \tag{6}$$

Furthermore, comparison of FIGS. 50A and 50B and comparison of FIGS. 51A and 51B show that equations [7] and [8] hold. Also, comparison of FIGS. 50B and 51A and comparison of FIGS. 51B and 50A reveal that equations [9] and [10] hold.

$$a(2n+1)=a(2n) \tag{7}$$

$$d(2n+1)=d(2n) \tag{8}$$

$$b(2n+2)=b(2n+1) \tag{9}$$

$$c(2n+2)=c(2n+1) \tag{10}$$

From equations [1] to [10], the time dependences of the field-effect transistor pairs a, b, c, and d are calculated. First, equation [11] is derived from equations [1], [2], and [5].

$$a(2n)=d(2n)=c(2n)=1-b(2n) \tag{11}$$

Similarly, equation [12] is derived from equations [3], [4], and [6].

$$a(2n+1)=d(2n+1)=b(2n+1)=1-c(2n+1) \tag{12}$$

Equation [13] describing the time development of a is obtained from equations [9], [12], [7], and [11].

$$a(2n+2)=1-a(2n) \tag{13}$$

Details of this deriving process are as follows. From equation [9], $$b(2n+2)=b(2n+1).$$

Meanwhile, from equation [12], $$a(2n+1)=b(2n+1).$$

Therefore, $$b(2n+2)=a(2n+1).$$

Furthermore, since a(2n+1)=a(2n) from equation [7], equation [14] below holds.

$$b(2n+2)=a(2n) \tag{14}$$

Finally, equation [13] can be obtained by the use of 1−a(2n+2)=b(2n+2) (equation [11]).

By solving equation [13], equations [15] can be obtained as general solutions for the time dependence of the field-effect transistor pair a. In equations [15], a(0) is an initial value of a and takes 0 or 1.

$$a(2n)=(-1)^n*(a(0)-0.5)+0.5$$

$$a(2n+1)=(-1)^n*(a(0)-0.5)+0.5 \tag{15}$$

Equations [15] are derived from equation [13] as follows. First, the following equation is obtained by reducing 0.5 from both sides of equation [13] and rearranging the result.

$$a(2n+2)-0.5=(-1)*(a(2n)-0.5)$$

Repetitively applying this equation to the equation itself yields the following equation.

$$\begin{aligned} a(2n+2)-0.5 &= (-1)*(a(2n)-0.5) \\ &= (-1)^{1+1}*(a(2(n-1))-0.5) \\ &= (-1)^{1+2}*(a(2(n-2))-0.5) \\ &= (-1)^{1+n}*(a(2(n-n))-0.5) \\ &= (-1)^{1+n}(a(0)-0.5) \end{aligned}$$

By comparing the second relation with the last relation, the first equation of equations [15] is obtained. The other equation of equations [15] is obtained by using the relation of a(2n) in equation [7].

The output d of this toggle flip-flop is given by equations [16] from equations [1] and [3].

$$d(2n)=(-1)^n*(a(0)-0.5)+0.5$$

$$d(2n+1)=(-1)^n*(a(0)-0.5)+0.5 \qquad [16]$$

FIG. 52 shows the time dependence d(n) of the index n of CLK and d calculated by equations [16]. Note that a period $\tau$ of d(n) is twice a period $\tau_{CLK}$ of CLK and *1 and *2 indicate 0 and 1, respectively, as the initial value a(0).

In this conventional circuit, the field-effect transistor pairs a, b, c, and d hold/store the internal states of the circuit, i.e., play an essential role for the circuit operation.

In the conventional circuit, each of current paths including the field-effect transistor pairs a, b, c, and d has a total of six elements, i.e., two resistors and four field-effect transistors, and the number of these elements cannot be unlimitedly reduced. This is because the circuit is constituted only by field-effect transistors and resistors. This is a limiting condition in improving the operating speed and reducing the consumption power of the circuit.

SUMMARY OF THE INVENTION

It is a principal object of the present invention to provide a periodic waveform generating circuit which utilizes the functionality of an element having negative differential resistance characteristics and has a simple circuit configuration.

It is another object of the present invention to provide a periodic waveform generating circuit which achieves the above object and has a higher operating speed than that of conventional circuits.

It is still another object of the present invention to provide a periodic waveform generating circuit having a lower consumption power than that of conventional circuits.

To achieve the above objects according to the present invention, there is provided a periodic waveform generating circuit comprising first and second series circuits each comprising two semiconductor resistive elements having negative differential characteristics, an oscillating voltage source connected in series with the series-connected semiconductor resistive elements, and a three-terminal switching element connected in parallel with one of the semiconductor elements, first connecting means for connecting a connection point of the two semiconductor resistive elements of the first series circuit to an input of the switching element of the second series circuit, and second connecting means for connecting a connection point of the two semiconductor elements of the second series circuit to an input of the switching element of the first series circuit, wherein the oscillating voltage sources of the first and second series circuits generate oscillating currents of opposite phases, thereby extracting a periodic signal from one node of elements constituting one of the series circuits.

BRIEF DESCRIPTION OF THE DRAWINGS

FIG. 1 is a circuit diagram showing the first embodiment of the present invention;

FIG. 2 is a circuit diagram showing the second embodiment of the present invention;

FIG. 3 is a circuit diagram showing the third embodiment of the present invention;

FIG. 4 is a circuit diagram showing the fourth embodiment of the present invention;

FIG. 5 is a circuit diagram showing the fifth embodiment of the present invention;

FIG. 6 is a circuit diagram showing the sixth embodiment of the present invention;

FIG. 7 is a circuit diagram showing the seventh embodiment of the present invention;

FIG. 8 is a circuit diagram showing the eighth embodiment of the present invention;

FIG. 9 is a circuit diagram showing the ninth embodiment of the present invention;

FIG. 10 is a circuit diagram showing the 10th embodiment of the present invention;

FIG. 11 is a circuit diagram for explaining the principle of operation of the first embodiment of the present invention;

FIGS. 12A and 12B are graphs for explaining the principle of operation of the first embodiment of the present invention;

FIGS. 13A, 13B, and 13C are graphs for explaining the principle of operation of the first embodiment of the present invention;

FIG. 16 is a circuit diagram showing the 11th embodiment of the present invention;

FIG. 17 is a circuit diagram showing the 12th embodiment of the present invention;

FIG. 22 is a circuit diagram showing the 17th embodiment of the present invention;

FIG. 23 is a circuit diagram showing the 18th embodiment of the present invention;

FIGS. 27A and 27B are circuit diagrams showing element circuits of the 21st embodiment of the present invention;

FIG. 28 is a circuit diagram showing the 22nd embodiment of the present invention;

FIGS. 31A and 31B are graphs showing the principle of operation of the element circuit shown in FIG. 30;

FIG. 33 is a circuit diagram showing an element circuit of the 21st embodiment of the present invention;

FIG. 34 is a timing chart of the element circuit shown in FIG. 33;

FIGS. 37A and 37B are circuit diagrams showing modifications of the 21st embodiment of the present invention;

FIG. 40 is a view showing the result of calculations corresponding to the number of element circuits of the operation of the 21st embodiment of the present invention;

FIG. 47 is a timing chart showing the result of calculations of the operations of the 21st to 23rd embodiments of the present invention;

FIGS. 48A, 48B, and 48C are circuit diagrams showing the technical idea of the present invention by abstracting the embodiments of the present invention;

DESCRIPTION OF THE PREFERRED EMBODIMENTS

Figure 14:
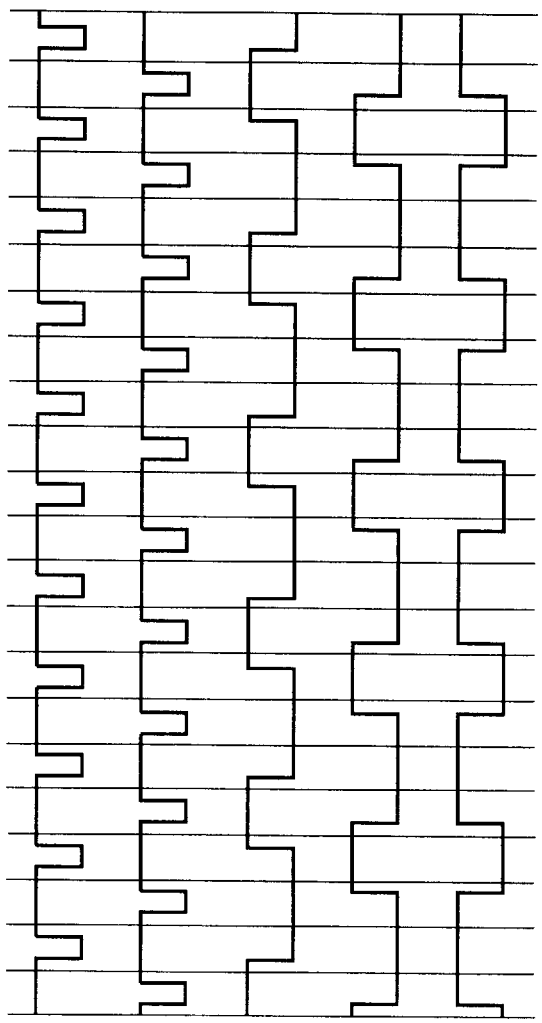
FIGS. 14A, 14B, 14C, 14D, and 14E are timing charts for explaining the principle of operation of the first embodiment of the present invention.
Figure 15:
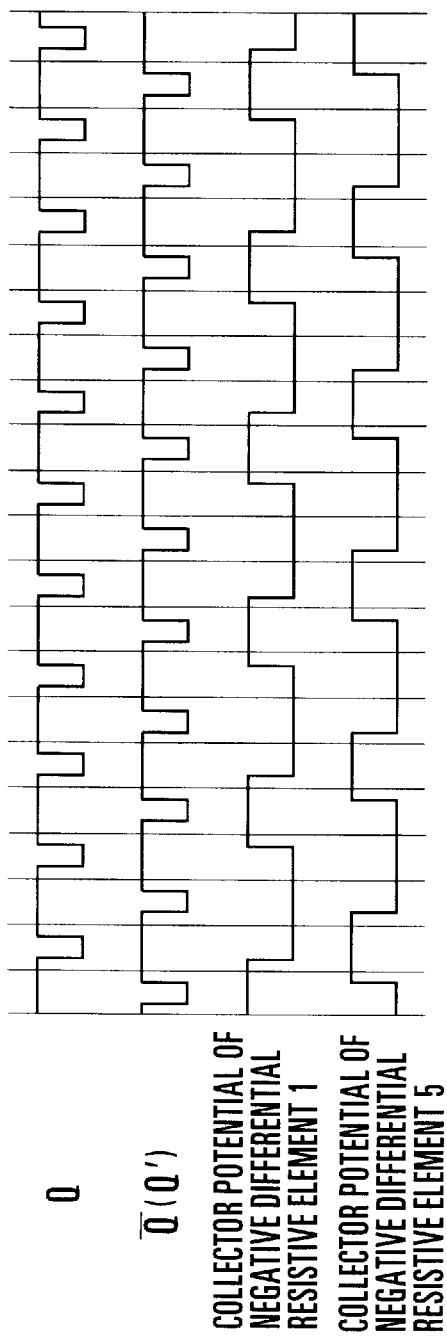
FIGS. 15A, 15B, 15C, and 15D are timing charts for explaining the principle of operation of the fifth embodiment of the present invention.
Figure 18:
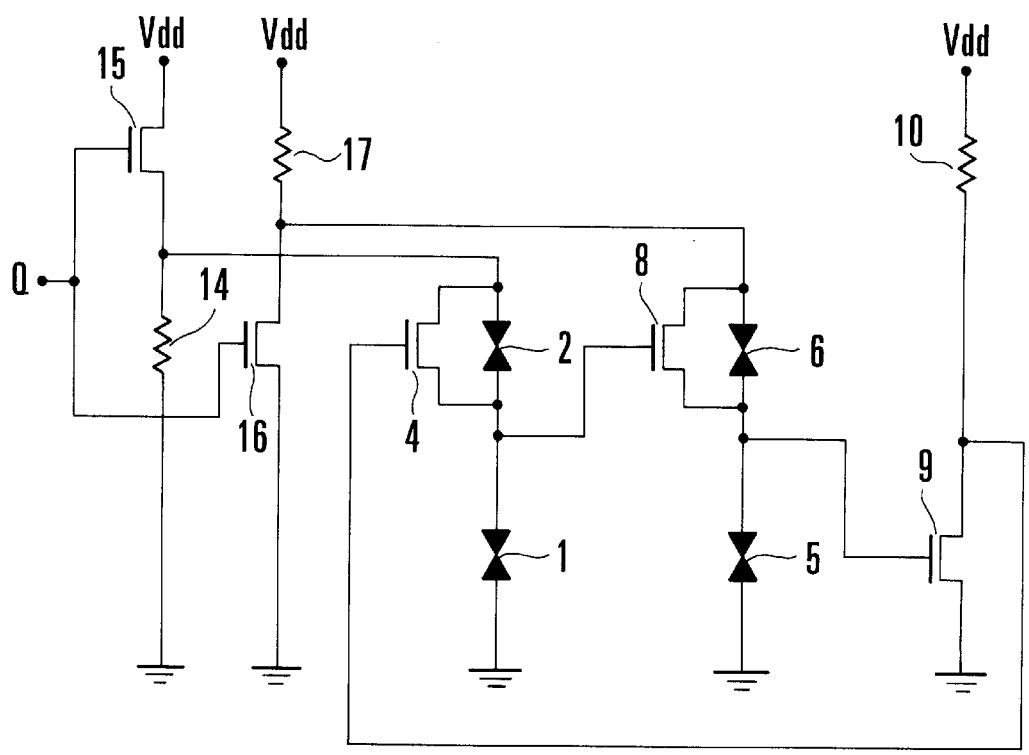
FIG. 18 is a circuit diagram showing the 13th embodiment of the present invention.
Figure 19:
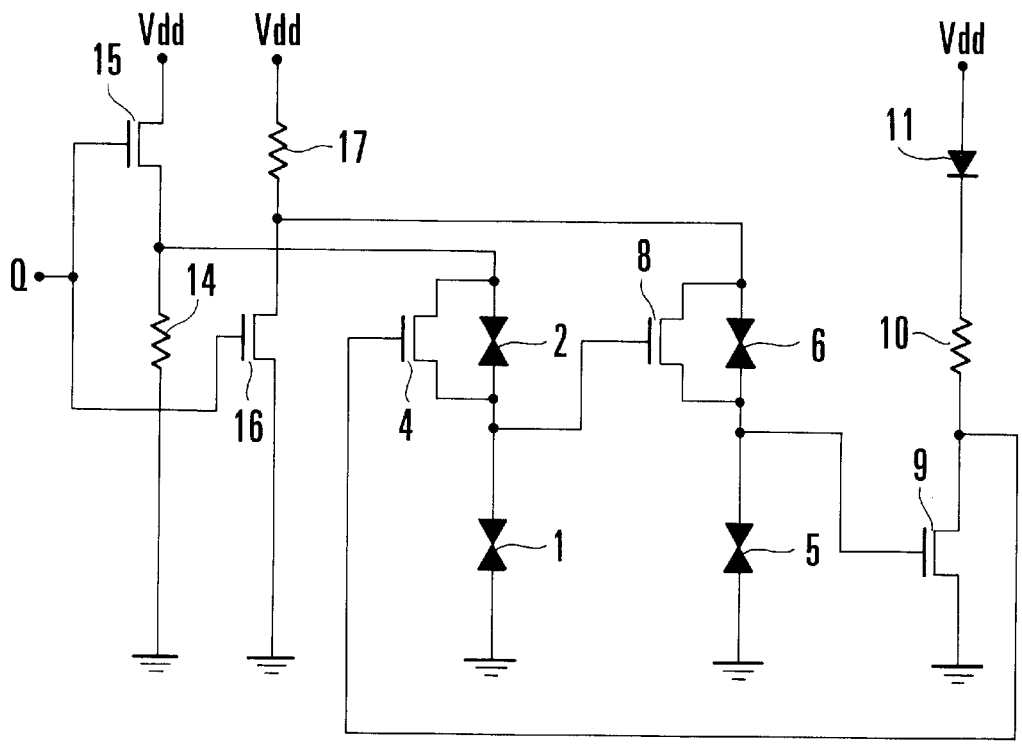
FIG. 19 is a circuit diagram showing the 14th embodiment of the present invention.
Figure 20:
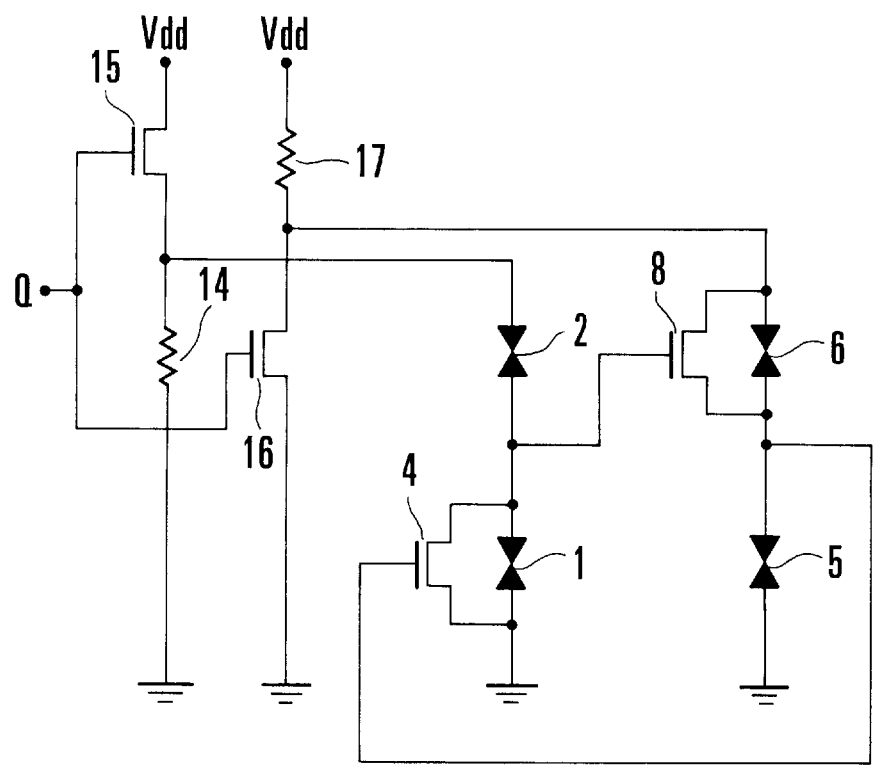
FIG. 20 is a circuit diagram showing the 15th embodiment of the present invention.
Figure 21:
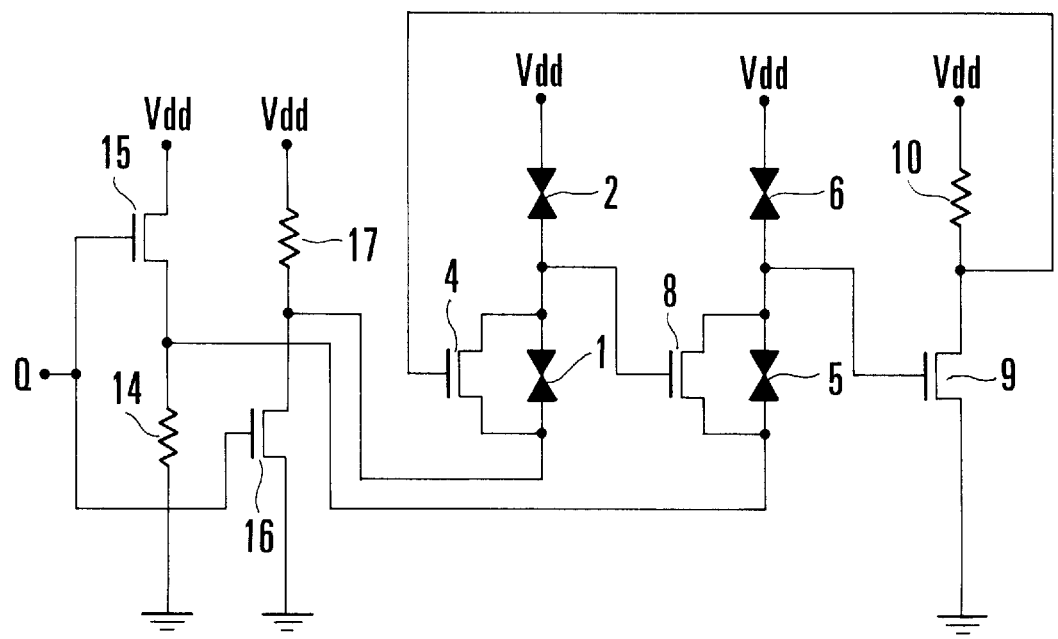
FIG. 21 is a circuit diagram showing the 16th embodiment of the present invention.
Figure 24:
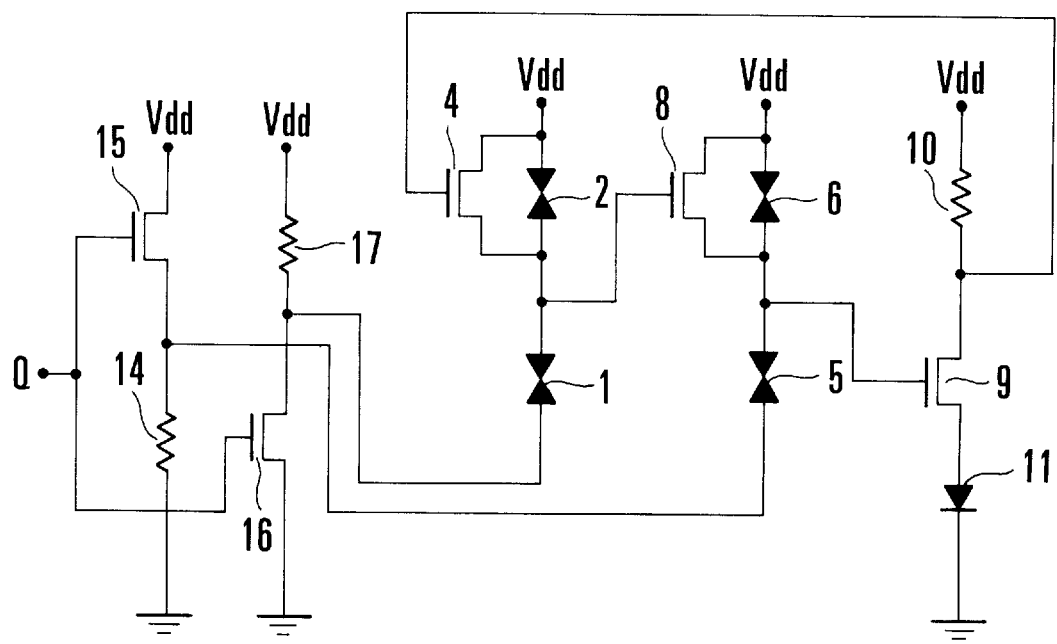
FIG. 24 is a circuit diagram showing the 19th embodiment of the present invention.

The present invention will be described in detail below with reference to the accompanying drawings. FIG. 1 shows the first embodiment of the present invention. Referring to FIG. 1, this periodic waveform generating circuit is constituted as follows.

That is, the emitter electrode of a negative differential resistive element 1 is grounded. The collector electrode of the negative differential resistive element 1 is connected to the emitter electrode of a negative differential resistive element 2. The collector electrode of the negative differential resistive element 2 is connected to the source electrode of a field-effect transistor 3. The drain electrode of the field-effect transistor 3 is connected to a power supply. The source electrode of a field-effect transistor 4 is connected to the emitter electrode of the negative differential resistive element 1. The drain electrode of the field-effect transistor 4 is connected to the collector electrode of the negative differential resistive element 1. In this manner, a first element circuit is constituted.

Also, the emitter electrode of a negative differential resistive element 5 is grounded. The collector electrode of the negative differential resistive element 5 is connected to the emitter electrode of a negative differential resistive element 6. The collector electrode of the negative differential resistive element 6 is connected to the source electrode of a field-effect transistor 7. The drain electrode of the field-effect transistor 7 is connected to a power supply. The source electrode of a field-effect transistor 8 is connected to the emitter electrode of the negative differential resistive element 5. The drain electrode of the field-effect transistor 8 is connected to the collector electrode of the negative differential resistive element 5. In this way, a second element circuit is constituted.

An inverting element circuit is constituted by grounding the source electrode of a field-effect transistor 9, connecting the drain electrode of the field-effect transistor 9 to one terminal of a resistor 10, and connecting the other terminal of the resistor 10 to a power supply.

Additionally, the collector electrode of the negative differential resistive element 1 is connected to the gate electrode of the field-effect transistor 8. The collector electrode of the negative differential resistive element 5 is connected to the gate electrode of the field-effect transistor 9. The drain electrode of the field-effect transistor 9 is connected to the gate electrode of the field-effect transistor 4.

This embodiment is operated as follows. That is, a high-frequency signal is input to the gate electrode of the field-effect transistor 3, and an inverted signal of that input signal is input to the gate electrode of the field-effect transistor 7. By outputting the potential at any of the collector electrode of the negative differential resistive element 1, the collector electrode of the negative differential resistive element 5, and the drain electrode of the field-effect transistor 9, a high frequency which is ½ the input high frequency is obtained as this output signal.

The principle of operation of this embodiment will be described below. First, the electrical behavior of a circuit shown in FIG. 11 as a basic element of this embodiment will be described. In FIG. 11, reference symbols rtd1 and rtd2 denote negative differential resistive elements; and fet1 and fet3, field-effect transistors. The current-voltage characteristics of a parallel circuit of rtd1 and fet1 and that of rtd2 are shown in FIG. 12A. The current-voltage characteristic of the parallel circuit of rtd1 and fet1 changes as shown in FIG. 12A in accordance with whether a potential $V_{in}$ of the gate electrode of fet1 is a high potential (H) or a low potential (L). That is, element parameters are so selected that when the potential $V_{in}$ of the gate electrode of fet1 is the high potential (H), the peak current of the current-voltage characteristic of the parallel circuit of rtd1 and fet1 is larger than the peak current of rtd2, and that when the potential $V_{in}$ of the gate electrode of fet1 is the low potential (L), the peak current of the current-voltage characteristic of the parallel circuit of rtd1 and fet1 is smaller than the peak current of rtd2. In these current-voltage characteristics, a voltage region where negative differential characteristics appear is defined as a region II, a positive voltage region whose voltage is lower than that in the region II is defined as a region I, and a region whose voltage is higher than that in the region II is defined as a region III.

First, the operating point when $V_{in}$ is the low potential (L) is calculated by regarding fet3 of the circuit shown in FIG. 11 as a load resistance. FIG. 12B shows the current-voltage characteristics of a portion except fet3 of the circuit shown in FIG. 11 and those of fet3. In FIG. 12B, the polygonal lines indicate the characteristics of the portion except fet3 of the circuit shown in FIG. 11, and the curves indicate the characteristics of fet3. Note that the characteristics of fet3 are plotted as load curves when a power supply voltage Vd is 0.9 V. Referring to FIG. 12B, the thick straight lines indicate a stable state, and the thin straight lines indicate an unstable state. Reference symbol [i,j] (i=I, II, or III, j=I, II, or III) shows that the operating point of the parallel circuit of rtd1 and fet1 and that of rtd2 exist in the region i and the region j, respectively. Curves 12 and 13 plot the characteristics of fet3 as load curves. The curve 12 is obtained when a gate potential Q of fet3 is the high potential (H), and the curve 13 is obtained when the gate potential Q of fet3 is the low potential (L). The operating point is given by the intersection of a thick line and a curve. Therefore, when the gate potential Q of fet3 is the high potential (H), two operating points exist to result in a bistable state. On the other hand, when the gate potential Q of fet3 is the low potential (L), only one operating point exists to result in a monostable state.

Values of V1 of the circuit in FIG. 11 in the bistable state when the gate potential Q of fet3 is the high potential (H) will be examined below. FIG. 13A shows V1 as a function of V2 in the circuit of FIG. 11. In the bistable state, V2 or a voltage applied to the portion except fet3 of the circuit in FIG. 11 is about 0.8 V as can be seen from FIG. 12B. FIG. 13A shows that when V2 is about 0.8 V, V1 is about 0.16 V (low potential, L) if the operating point is in branch [I,III] and about 0.6 V (high potential, H) if the operating point is in branch [III,I]. Accordingly, when the gate potential Q of fet3 is the high potential (H), V1 can be either the high potential (H) or the low potential (L).

On the other hand, when the gate potential Q of fet3 is the low potential (L), V2 or a voltage applied to the portion except fet3 of the circuit in FIG. 11 is about 0.1 V as shown in FIG. 12B, and V1 is about 0.04 V (low potential, L) as shown in FIG. 13A. When the gate potential Q of fet3 changes from the low potential (L) to the high potential (H), V1 becomes the high potential (H). This is obvious because branch [I,I] is connected to branch [III,I] by a thin line indicating the unstable state in FIG. 13A. In summary, when the gate potential Q of fet3 changes in order of H, L, H, L, . . . , V1 changes as shown in Table 2.

TABLE 2

| (When $V_{in}$ is low potential (L)) | | | | | | |
|---|---|---|---|---|---|---|
| Q | H | L | H | L | H | L |
| V1 (initial value is H) | H | L | H | L | H | L |
| V1 (initial value is L) | L | L | H | L | H | L |

A case where $V_{in}$ is the high potential (H) can be analyzed by similar discussions by using FIGS. 13B and 13C. That is, when the gate potential Q of fet3 changes in order of H, L, H, L, . . . , V1 changes as shown in Table 3.

TABLE 3

| (When $V_{in}$ is high potential (H)) | | | | | | |
|---|---|---|---|---|---|---|
| Q | H | L | H | L | H | L |
| V1 (initial value is H) | H | L | L | L | L | L |
| V1 (initial value is L) | L | L | L | L | L | L |

FIGS. 12B and 13B also reveal that when the gate potential Q of fet3 is the high potential (H), V1 does not change even if $V_{in}$ changes from H to L or vice versa. When the gate potential Q of fet3 is the low potential (L), V1 is always the low potential (L) regardless of the value of $V_{in}$.

On the basis of the basic data described above, the operation of the circuit of the first embodiment shown in FIG. 1 will be examined below.

In the current path at the left end of FIG. 1, the gate potential of the field-effect transistor 4 is equivalent to $V_{in}$ in the above discussions, and the collector potential of the negative differential resistive element 1 is equivalent to V1 in the above discussions. In this embodiment, however, the gate potential of the field-effect transistor 4 equals the potential at the drain electrode of the field-effect transistor 9.

In the central current path, the gate potential of the field-effect transistor 8 is equivalent to $V_{in}$ in the above discussions, and the collector potential of the negative differential resistive element 5 is equivalent to V1 in the above discussions. In this embodiment, however, the gate potential of the field-effect transistor 8 equals the collector potential of the negative differential resistive element 1.

The current path at the right end is a simple inverter. Accordingly, when the potential at the gate electrode of the field-effect transistor 9 is the high potential (H), the potential at the drain electrode of the field-effect transistor 9 is the low potential (L). When the potential at the gate electrode of the field-effect transistor 9 is the low potential (L), the potential at the drain electrode of the field-effect transistor 9 is the high potential (H).

In summary, the operation of this embodiment is shown in FIGS. 14A to 14E. When a high-frequency signal Q is input to the gate electrode of the field-effect transistor 3 and an inverted signal of that input signal is input to the gate electrode of the field-effect transistor 7, a high frequency which is ½ the input high frequency appears in any of the collector electrode of the negative differential resistive element 1, the collector electrode of the negative differential resistive element 5, and the drain electrode of the field-effect transistor 9. This demonstrates that this embodiment operates as a ½ frequency divider. Since each state of the above circuit can be statically held, this embodiment is a ½ static frequency divider.

Figure 49:
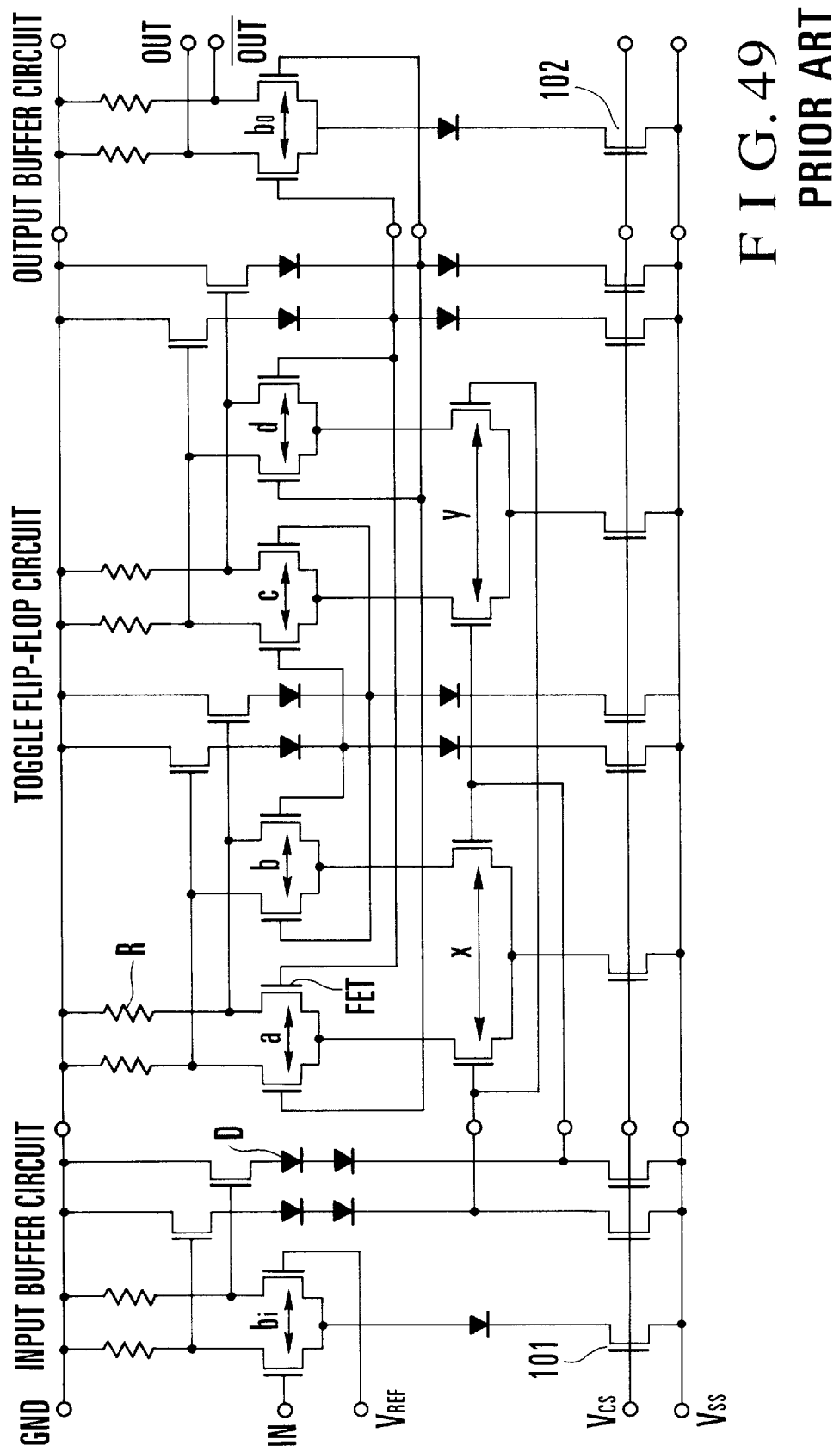
FIG. 49 is a circuit diagram showing an example of a conventional periodic waveform generating circuit.
Figure 50A:
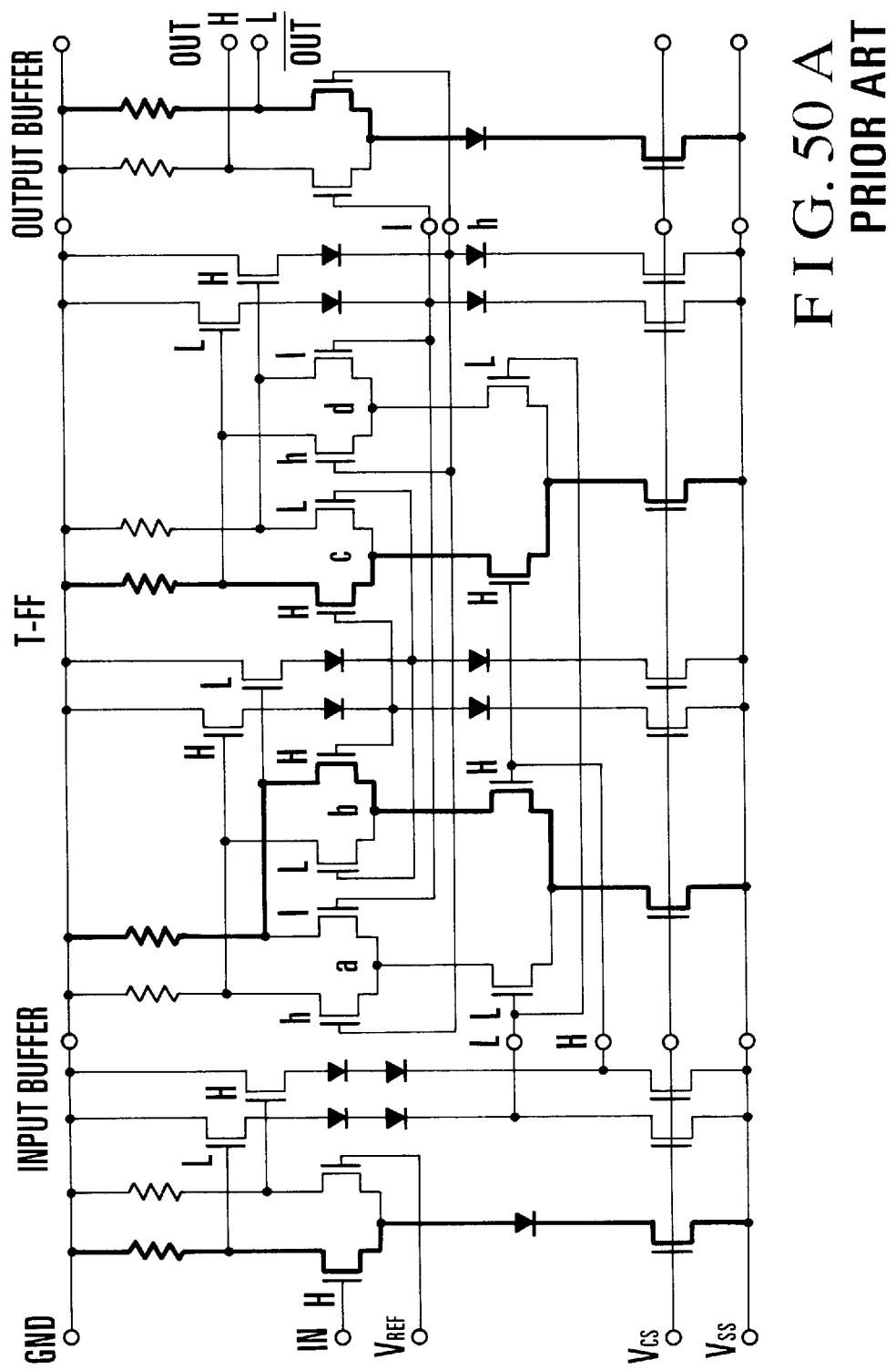
FIGS. 50A and 50B are circuit diagrams for explaining the operation of the conventional circuit shown in FIG. 49.
Figure 50B:
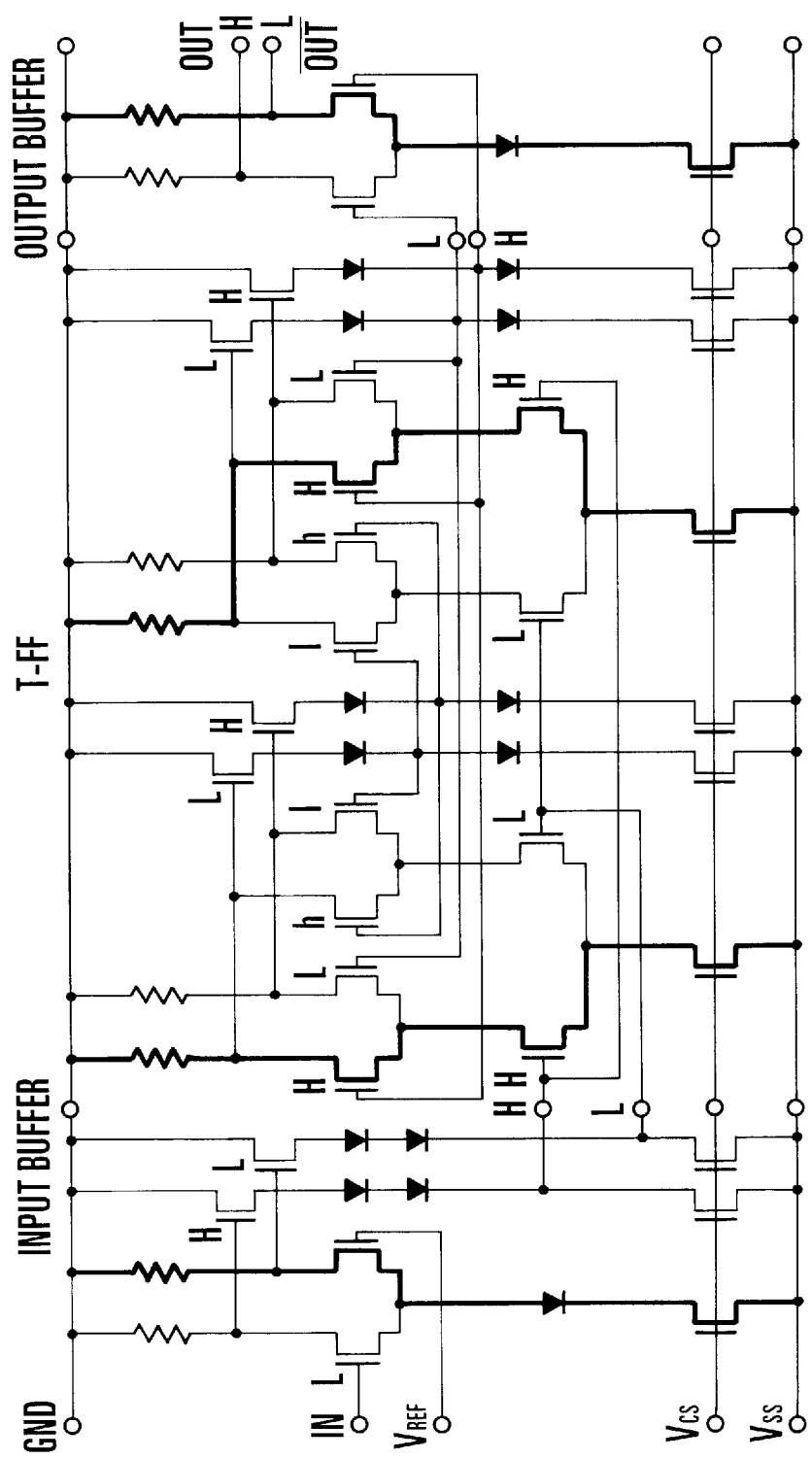
Figure 51A:
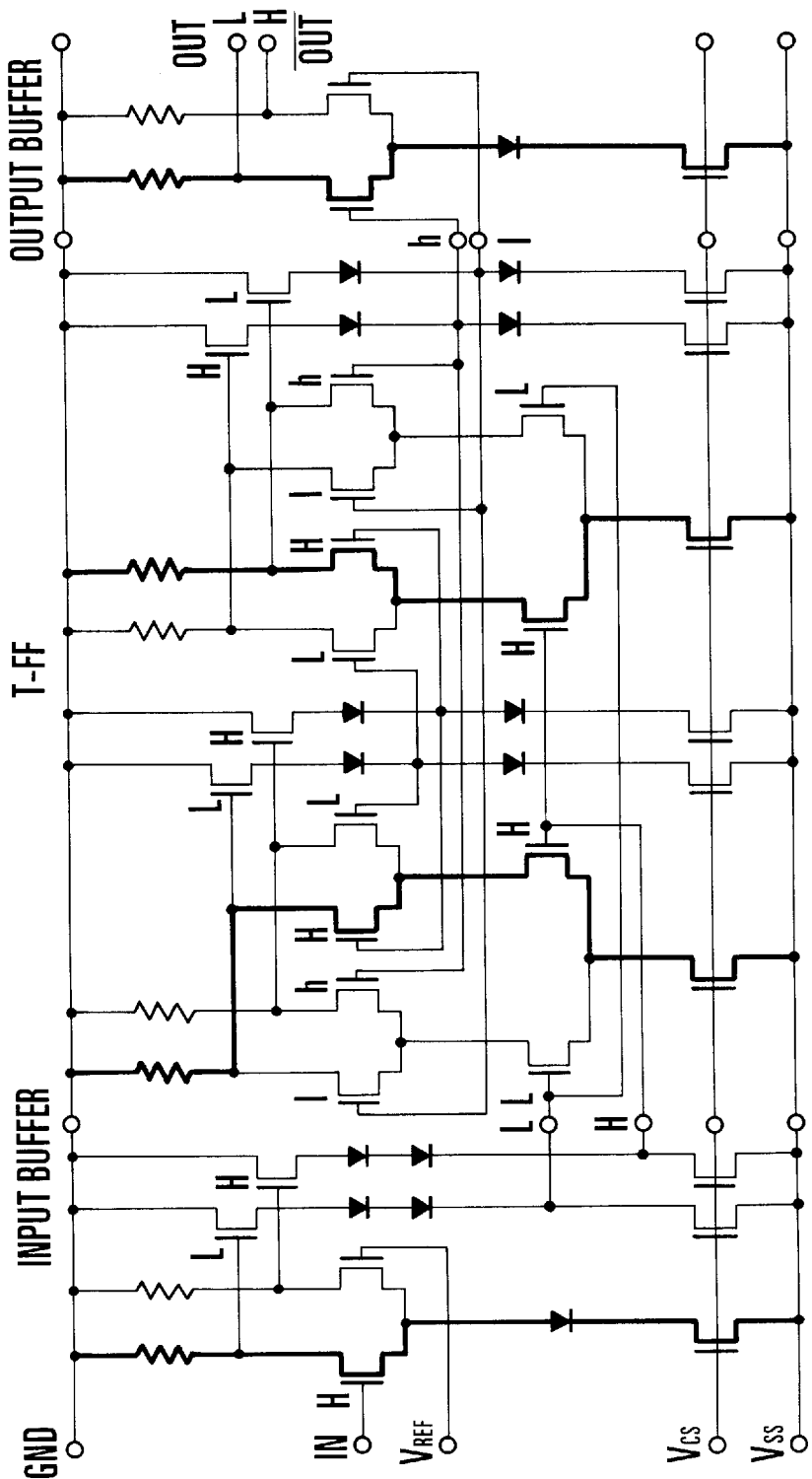
FIGS. 51A and 51B are circuit diagrams for explaining the operation of the conventional circuit shown in FIG. 49.
Figure 51B:
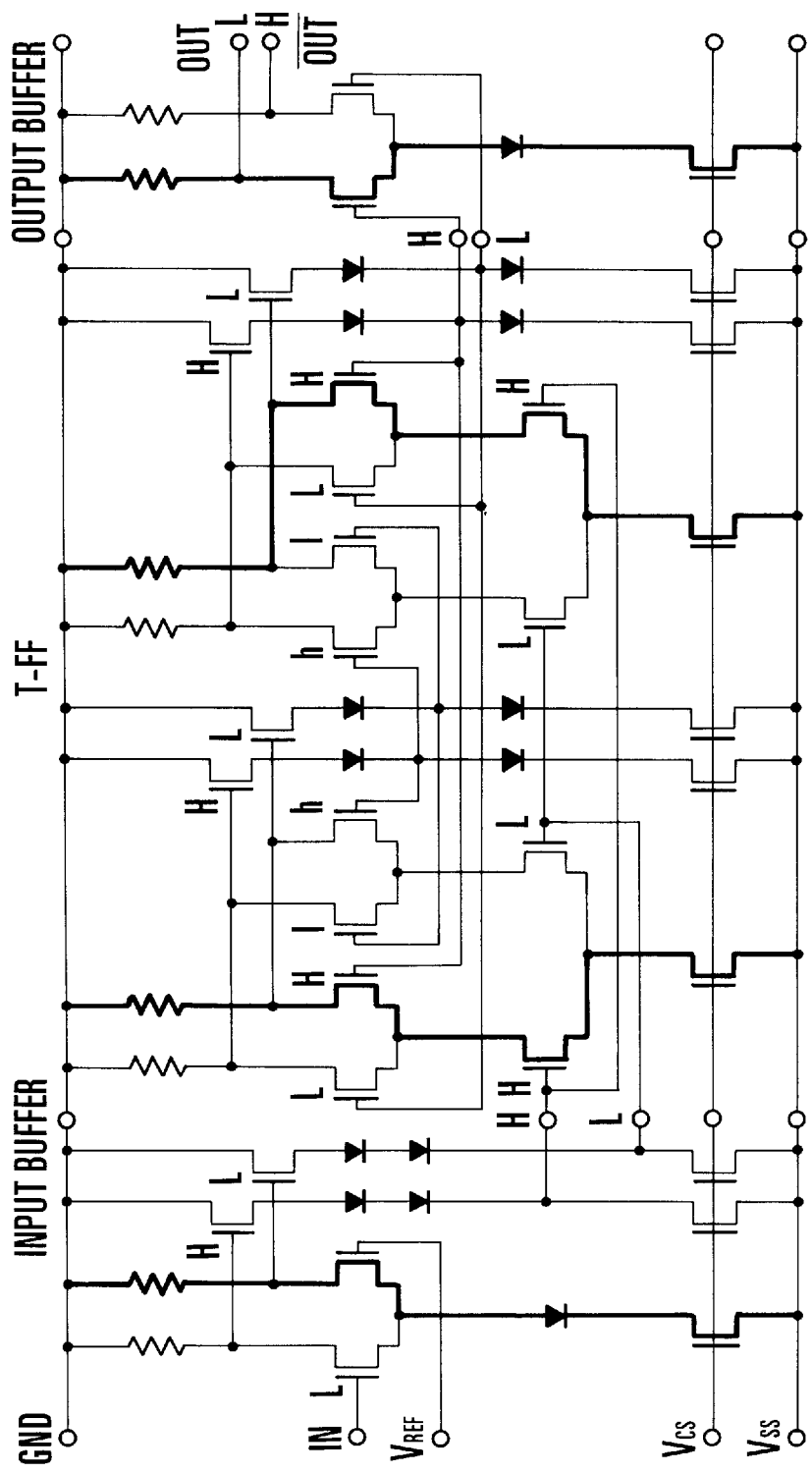
Figure 52:
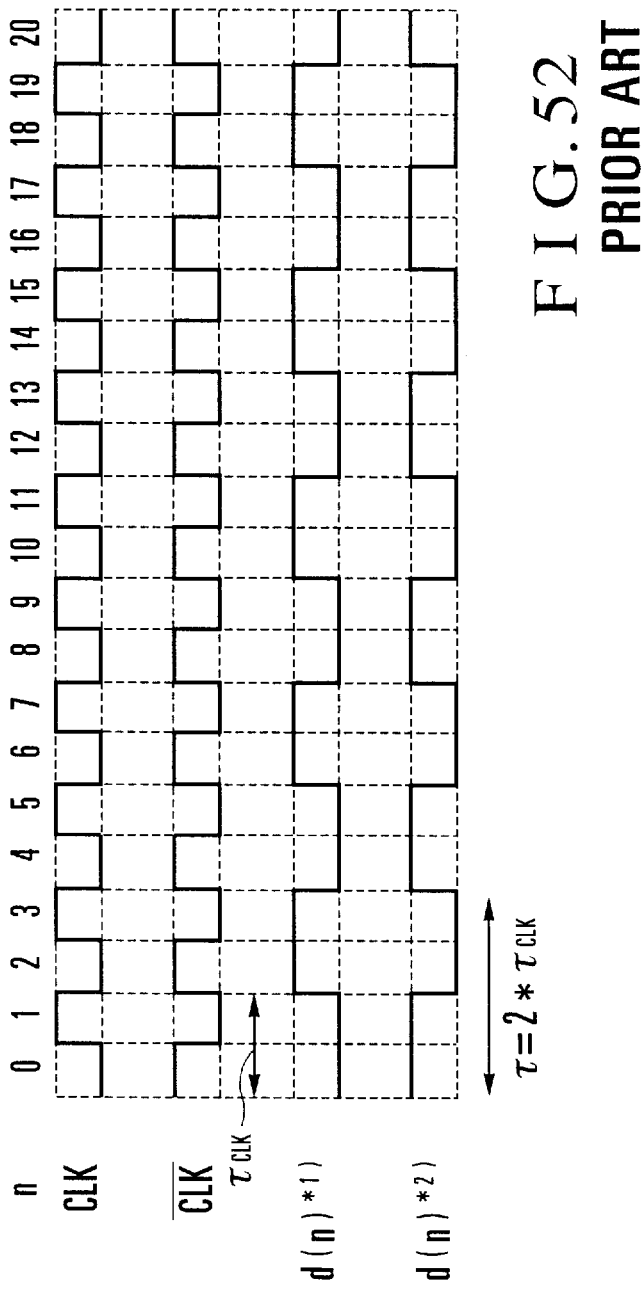
FIG. 52 is a timing chart for explaining the operation of the conventional circuit shown in FIG. 49.

In this embodiment, a ½ static frequency divider is realized by using ten elements: four negative differential resistive elements, five field effect transistors, and a resistor. As shown in FIG. 49, one prior art necessitates 52 elements. This prior art requires 40 elements only in portions having functions equivalent to this embodiment, i.e., in an input buffer circuit and a toggle flip-flop circuit. That is, in this embodiment, the number of elements can be reduced to ¼ to ⅕. Consequently, it is possible to increase the operating speed and reduce the consumption power.

FIG. 2 shows the second embodiment of the present invention. This embodiment is the same as the first embodiment except the following point. In the first embodiment, the drain electrode of the field-effect transistor 9 is connected to one terminal of the resistor 10, and the other terminal of the resistor 10 is connected to the power supply. In this second embodiment, the other terminal of a resistor 10 is connected to the emitter of a level-shift diode 11, and the collector of the level-shift diode 11 is connected to a power supply. The characteristic feature of this embodiment is that the operation margin of the circuit is increased by the level-shift diode. The number of elements of this embodiment is 11, which is smaller than 40 to 52 in the prior art.

FIG. 3 shows the third embodiment of the present invention. This embodiment is the same as the first embodiment except the following point. In the first embodiment, the source electrode of the field-effect transistor 4 is connected to the emitter electrode of the negative differential resistive element 1. The drain electrode of the field-effect transistor 4 is connected to the collector electrode of the negative differential resistive element 1. The source electrode of the field-effect transistor 8 is connected to the emitter electrode of the negative differential resistive element 5. The drain electrode of the field-effect transistor 8 is connected to the collector electrode of the negative differential resistive element 5. In this third embodiment, the source electrode of a field-effect transistor 4 is connected to the emitter electrode of a negative differential resistive element 2. The drain electrode of the field-effect transistor 4 is connected to the collector electrode of the negative differential resistive element 2. The source electrode of a field-effect transistor 8 is connected to the emitter electrode of a negative differential resistive element 6. The drain electrode of the field-effect transistor 8 is connected to the collector electrode of the negative differential resistive element 6.

FIG. 4 shows the fourth embodiment of the present invention. This embodiment is the same as the third embodiment except the following point. In the third embodiment, the drain electrode of the field-effect transistor 9 is connected to one terminal of the resistor 10, and the other terminal of the resistor 10 is connected to the power supply. In this fourth embodiment, the other terminal of a resistor 10 is connected to the emitter of a level-shift diode 11, and the collector of the level-shift diode 11 is connected to a power supply.

The third and fourth embodiments of the present invention are obtained by slightly modifying the first and second embodiments, respectively. That is, in the first and second embodiments, the field-effect transistors to be connected in parallel with the negative differential resistive elements are arranged in parallel with the first and third negative differential resistive elements, i.e., the negative differential resistive elements in the first stage from the ground. In the third and fourth embodiments, the field-effect transistors to be connected in parallel with the negative differential resistive elements are arranged in parallel with the second and fourth negative differential resistive elements, i.e., the negative differential resistive elements in the second stage from the ground. This circuit configuration can also accomplish the function of a ½ static frequency divider.

FIG. 5 shows the fifth embodiment of the present invention. The emitter electrode of a negative differential resistive element 1 is grounded. The collector electrode of the negative differential resistive element 1 is connected to the emitter electrode of a negative differential resistive element 2. The collector electrode of the negative differential resistive element 2 is connected to the source electrode of a field-effect transistor 3. The drain electrode of the field-effect transistor 3 is connected to a power supply. The source electrode of a field-effect transistor 4 is connected to the emitter electrode of the negative differential resistive element 1. The drain electrode of the field-effect transistor 4 is connected to the collector electrode of the negative differential resistive element 1. Also, the emitter electrode of a negative differential resistive element 5 is grounded. The collector electrode of the negative differential resistive element 5 is connected to the emitter electrode of a negative differential resistive element 6, and the collector electrode of the negative differential resistive element 6 is connected to the source electrode of a field-effect transistor 7. The drain electrode of the field-effect transistor 7 is connected to a power supply. The source electrode of a field-effect transistor 8 is connected to the emitter electrode of the negative differential resistive element 6. The drain electrode of the field-effect transistor 8 is connected to the collector electrode of the negative differential resistive element 6. Additionally, the collector electrode of the negative differential resistive element 1 is connected to the gate electrode of the field-effect transistor 8. The collector electrode of the negative differential resistive element 5 is connected to the gate electrode of the field-effect transistor 4.

This embodiment is operated as follows. A high-frequency signal is applied to the gate electrode of the field-effect transistor 3, and an inverted signal of that input signal is applied to the gate electrode of the field-effect transistor 7. The potential at either the collector electrode of the negative differential resistive element 1 or the collector electrode of the negative differential resistive element 5 is extracted as an output signal. The operation of this embodiment is shown in FIGS. 15A to 15D. It is evident from FIGS. 15A to 15D that this circuit operates as a ½ frequency divider. Since each state of the circuit of this embodiment can be statically held, this embodiment is a ½ static frequency divider.

In this embodiment, the field-effect transistors to be connected in parallel with the negative differential resistive elements are arranged in parallel with the first and fourth negative differential resistive elements, i.e., the negative differential resistive element in the first stage from the ground on the left-side current path and the negative differential resistive element in the second state from the ground on the right-side current path. This obviates the need for the inverter provided as the current path at the right end in each of the first to fourth embodiments. This further reduces the number of elements to 8 which is smaller than in the first to fourth embodiments. Consequently, it is possible to further increase the operating speed and reduce the consumption power.

The 11th to 15th embodiments of the present invention will be described below. In each of the first to fifth embodiments of the circuit of the present invention, the collector electrode of the negative differential resistive element 2 is connected to the source electrode of the field-effect transistor 3. The collector electrode of the negative differential resistive element 6 is connected to the source electrode of the field-effect transistor 7. The function of the field-effect transistor 3 is to determine the potential at the collector electrode of the negative differential resistive element 2 in accordance with the potential Q at the gate electrode of the field-effect transistor 3. The function of the field-effect transistor 7 is to determine the potential at the collector electrode of the negative differential resistive element 6 in accordance with the potential Q at the gate electrode of the field-effect transistor 7. In the first to fifth embodiments of this circuit, the relationships between the input potential Q and these collector potentials are as shown in Table 4.

TABLE 4

| Q | Potential at collector electrode of second negative differential resistive element 2 | Potential at collector electrode of fourth negative differential resistive element 6 |
| --- | --- | --- |
| H | H | L |
| L | L | H |

Accordingly, no problem arises in the circuit operation even when the field-effect transistors 3 and 7 are removed and, instead, power supplies or power supply circuits which generate the potentials shown in Table 4 are directly connected to the collector electrodes of the negative differential resistive elements 2 and 6. FIGS. 16 to 20 illustrate the 11th to 15th embodiments, respectively, of the present invention in which the field-effect transistors 3 and 7 used in the first to fifth embodiments are removed and, instead, the collector electrodes of negative differential resistive elements 2 and 6 are connected to power supply circuits.

The operations of the 11th to 15th embodiments of the circuit of the present invention will be described below with reference to FIGS. 16 to 20. When an input Q is a high potential (H), a field-effect transistor 15 is turned on, and most of a power supply voltage Vdd is applied across a resistor 14. Accordingly, the potential at the collector electrode of the negative differential resistive element 2 becomes the high potential (H), i.e., the same as the input Q. Also, since a field-effect transistor 16 is turned on, most of the power supply voltage Vdd is applied across a resistor 17. Accordingly, the potential at the collector electrode of the negative differential resistive element 6 becomes a low potential (L), i.e., the same as an inverted signal of the input Q. When the input Q is the low potential (L), the potential at the collector electrode of the negative differential resistive element 2 becomes the low potential (L), i.e., the same as the input Q. The potential at the collector electrode of the negative differential resistive element 6 becomes the high potential (H), i.e., the same as an inverted signal of the input Q. The relationships between the input potential Q and these collector potentials in the 11th to 15th embodiments of this circuit are summarized in Table 5.

TABLE 5

| Q | Potential at collector electrode of second negative differential resistive element 2 | Potential at collector electrode of fourth negative differential resistive element 6 |
| --- | --- | --- |
| H | H | L |
| L | L | H |

Table 5 is identical with Table 4. This demonstrates that the 11th to 15th embodiments of this circuit operate in the same manner as the first to fifth embodiments, respectively, of the circuit.

The 11th to 15th embodiments of this circuit use the power supply circuit in which the resistor 14, the field-effect transistors 15 and 16, the resistor 17, and the power supply are connected as shown in FIGS. 16 to 20. However, any other power supply circuit can also be used, provided that the input signal Q and the potentials at the individual collector electrodes meet the relationships shown in Table 4.

FIG. 6 shows the sixth embodiment of the present invention. Referring to FIG. 6, the source electrode of a field-effect transistor 3 is grounded. The drain electrode of the field-effect transistor 3 is connected to the emitter electrode of a negative differential resistive element 1. The collector electrode of the negative differential resistive element 1 is connected to the emitter electrode of a negative differential resistive element 2. The collector electrode of the negative differential resistive element 2 is connected to a power supply. The source electrode of a field-effect transistor 4 is connected to the emitter electrode of the negative differential resistive element 1. The drain electrode of the field-effect transistor 4 is connected to the collector electrode of the negative differential resistive element 1.

The source electrode of a field-effect transistor 7 is grounded. The drain electrode of the field-effect transistor 7 is connected to the emitter electrode of a negative differential resistive element 5. The collector electrode of the negative differential resistive element 5 is connected to the emitter electrode of a negative differential resistive element 6. The collector electrode of the negative differential resistive element 6 is connected to a power supply. The source electrode of a field-effect transistor 8 is connected to the emitter electrode of the negative differential resistive element 5. The drain electrode of the field-effect transistor 8 is connected to the collector electrode of the negative differential resistive element 5.

The source electrode of a field-effect transistor 9 is grounded. The drain electrode of the field-effect transistor 9 is connected to one terminal of a resistor 10. The other terminal of the resistor 10 is connected to a power supply.

The collector electrode of the negative differential resistive element 1 is connected to the gate electrode of the field-effect transistor 8. The collector electrode of the negative differential resistive element 5 is connected to the gate electrode of the field-effect transistor 9. The drain electrode of the field-effect transistor 9 is connected to the gate electrode of the field-effect transistor 4.

FIG. 7 shows the seventh embodiment of the present invention. This embodiment is the same as the sixth embodiment except the following point. In the sixth embodiment, the source electrode of the field-effect transistor 9 is grounded. In this seventh embodiment, the emitter of a level-shift diode 11 is grounded, and the collector of the level-shift diode 11 is connected to the source electrode of a field-effect transistor 9.

FIG. 8 shows the eighth embodiment of the present invention. This embodiment is the same as the sixth embodiment except the following point. In the sixth embodiment, the source electrode of the field-effect transistor 4 is connected to the emitter electrode of the negative differential resistive element 1. The drain electrode of the field-effect transistor 4 is connected to the collector electrode of the negative differential resistive element 1. The source electrode of the field-effect transistor 8 is connected to the emitter electrode of the negative differential resistive element 5. The drain electrode of the field-effect transistor 8 is connected to the collector electrode of the negative differential resistive element 5. In this eighth embodiment, the source electrode of a field-effect transistor 4 is connected to the emitter electrode of a negative differential resistive element 2. The drain electrode of the field-effect transistor 4 is connected to the collector electrode of the negative differential resistive element 2. The source electrode of a field-effect transistor 8 is connected to the emitter electrode of a negative differential resistive element 6. The drain electrode of the field-effect transistor 8 is connected to the collector electrode of the negative differential resistive element 6.

FIG. 9 shows the ninth embodiment of the present invention. This embodiment is the same as the eighth embodiment except the following point. In the eighth embodiment, the source electrode of the field-effect transistor 9 is grounded. In this ninth embodiment, the emitter electrode of a level-shift diode 11 is grounded, and the collector electrode of the level-shift diode 11 is connected to the source electrode of a field-effect transistor 9.

FIG. 10 shows the 10th embodiment of the present invention. This embodiment is the same as the fifth embodiment except the following point. In the fifth embodiment, the emitter electrode of the negative differential resistive element 1 is grounded. The collector electrode of the negative differential resistive element 2 is connected to the source electrode of the field-effect transistor 3. The drain electrode of the field-effect transistor 3 is connected to the power supply. The emitter electrode of the negative differential resistive element 5 is grounded. The collector electrode of the negative differential resistive element 6 is connected to the source electrode of the field-effect transistor 7. The drain electrode of the field-effect transistor 7 is connected to the power supply. In this 10th embodiment, the source electrode of a field-effect transistor 3 is grounded. the drain electrode of the field-effect transistor 3 is connected to the emitter electrode of a negative differential resistive element 1. The collector electrode of a negative differential resistive element 2 is connected to a power supply. The source electrode of a field-effect transistor 7 is grounded. The drain electrode of the field-effect transistor 7 is connected to the emitter electrode of a negative differential resistive element 5. The collector electrode of a negative differential resistive element 6 is connected to a power supply.

The sixth to 10th embodiments are obtained by slightly modifying the first to fifth embodiments, respectively. That is, in the first to fifth embodiments, the field-effect transistors to be connected in series with the negative differential resistive elements are connected on the power supply side. In the sixth to 10th embodiments, these field-effect transistors are connected on the ground side. This circuit configuration can also realize a ½ frequency dividing operation in the same manner as in the first to fifth embodiments.

The 16th to 20th embodiments of the present invention will be described below. FIGS. 21 to 25 illustrate the 16th to 20th embodiments of the circuit of the present invention in which the field-effect transistors 3 and 7 in the sixth to 10th embodiments are removed and, instead, the source electrodes of negative differential resistive elements 1 and 5 are connected to power supply circuits. When applied with an input signal Q, this power supply circuit generates the same potential as generated in the source electrodes of the negative differential resistive elements 1 and 5 in the sixth to 10th embodiments in the source electrodes of the negative differential resistive elements 1 and 5 in the 16th to 20th embodiments. Accordingly, the 16th to 20th embodiments operate in the same manner as the sixth to 10th embodiments. That is, each embodiment operates as a ½ frequency divider.

In each of the first to 20th embodiments described above, a resonant tunnel diode consisting of an n-type InGaAs semiconductor layer as the emitter and the collector and an undoped AlAs semiconductor layer as the barrier layer can be used as each negative differential resistive element. It is also possible to use an Esaki diode as the negative differential resistive element. Furthermore, any device, regardless of whether the device is a single element or circuit, can be used as the negative differential resistive element of the present invention as long as the device has negative differential resistance characteristics.

Also, in each of the first to 20th embodiments described above, any device, such as a metal thin film resistor, a semiconductor thin film resistor, or a field-effect transistor in which the gate electrode and the source electrode are connected, can be used as the resistor of the present invention, provided that the device causes a voltage drop when a current flows.

In the above first to 20th embodiments, circuits for performing ½ frequency division have been explained. Periodic waveform generating circuits for generating more complicated waveforms will be described below.

Figure 25:
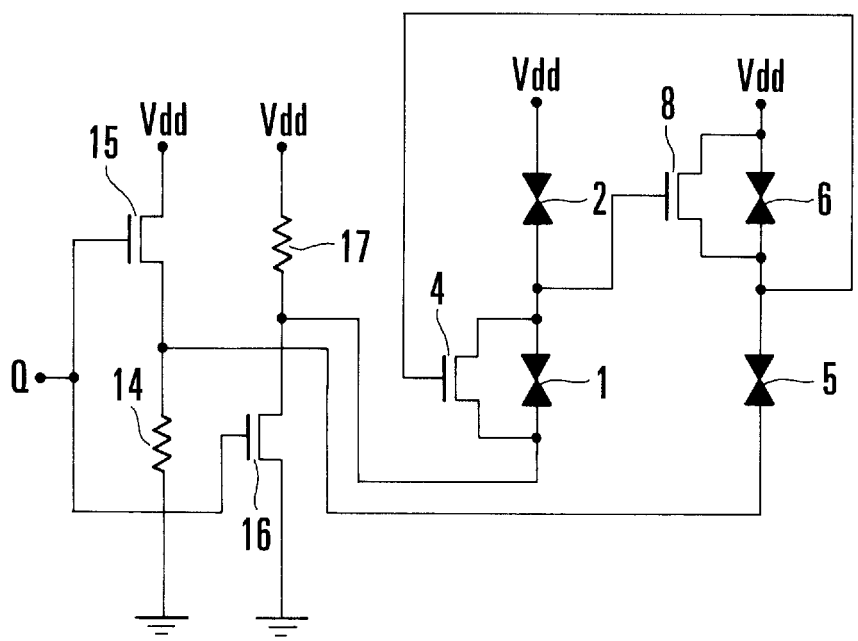
FIG. 25 is a circuit diagram showing the 20th embodiment of the present invention.
Figure 26:
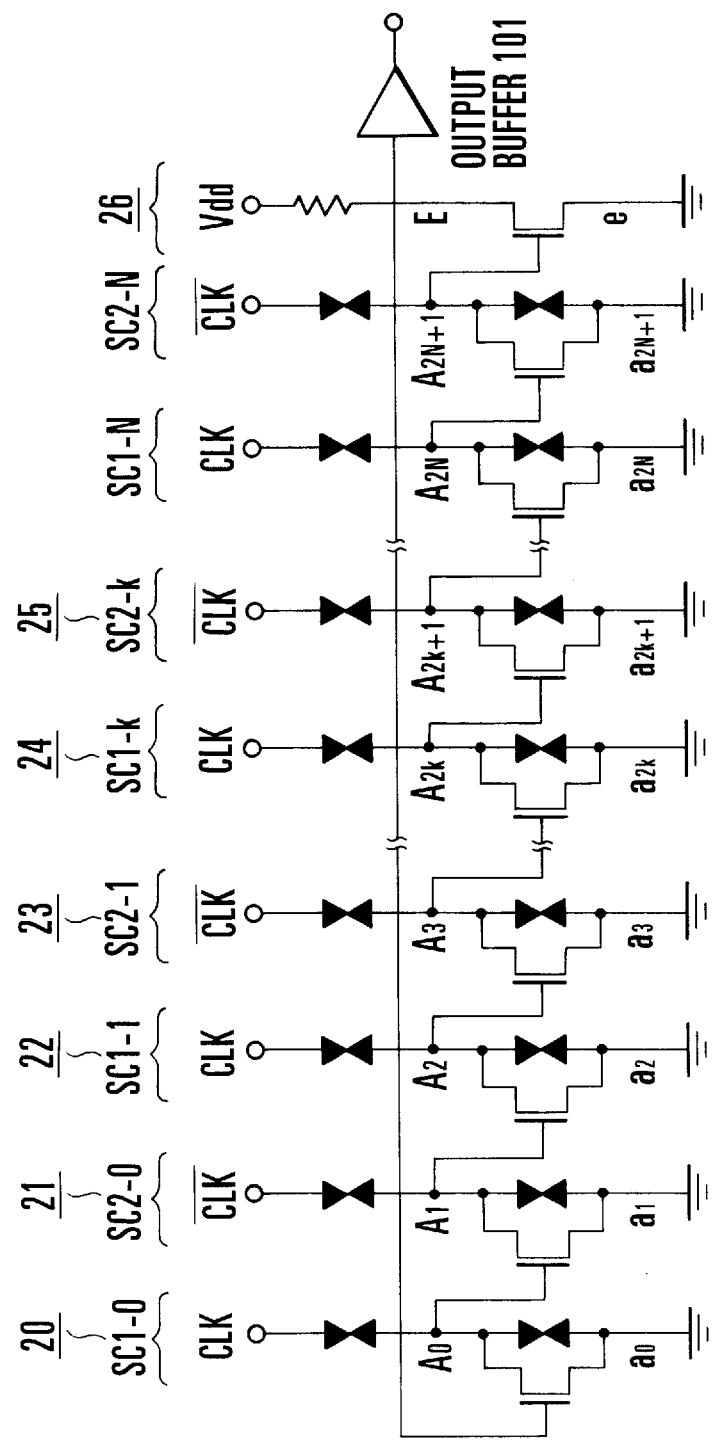
FIG. 26 is a circuit diagram showing the 21st embodiment of the present invention.

FIG. 26 shows the 21st embodiment of the present invention. This embodiment comprises first element circuits 20, 22, 24, . . . , second element circuits 21, 23, 25, . . . , and an inverting element circuit 26. In FIG. 25, reference symbol SC1 denotes a first element circuit; and SC2, a second element circuit. -0, . . . , -N following these reference symbols indicate the ordinal numbers.

As shown in FIG. 27A, the first element circuit consists of negative differential resistive elements 27 and 28 and a field-effect transistor 29. The emitter electrode of the negative differential resistive element 27 is connected to ground 30. A collector electrode 31 (also called a node) of the negative differential resistive element 28 is connected to a first power supply. The collector electrode of the negative differential resistive element 27 is connected to the emitter electrode of the negative differential resistive element 28. The source and drain electrodes of the field-effect transistor 29 are connected to the emitter and collector electrodes, respectively, of the negative differential resistive element 27. The potential at the gate electrode of the field-effect transistor 29 is an input 32. The potential at the collector electrode of the negative differential resistive element 27 is an output 33.

The second element circuit is the same as the first element circuit except that the collector of the negative differential resistive element 28 in the first element circuit is connected to a second power supply. This embodiment includes the same numbers ((N+1) in FIG. 26; N is a non-negative integer) of the first element circuits and the second element circuits and one inverting element circuit.

The output of the first element circuit SC1-0 is connected to the input of the second element circuit 21, the output of the second element circuit SC2-0 is connected to the input of the first element circuit 22, the output of the first element circuit SC1-k is connected to the second element circuit SC2-k, the output of the second element circuit SC2-k is connected to the input of the first element circuit SC1-(k+1) (k is a non-negative integer smaller than N), the output of the first element circuit SC1-N is connected to the input of the second element circuit SC2-N, the output of the second element circuit SC2-N is connected to the input of the inverting element circuit, and the output of the inverting element circuit is connected to the input of the first element circuit SC1-0.

In this embodiment, the potential at the output terminal of the inverting element circuit is output.

Figure 30:
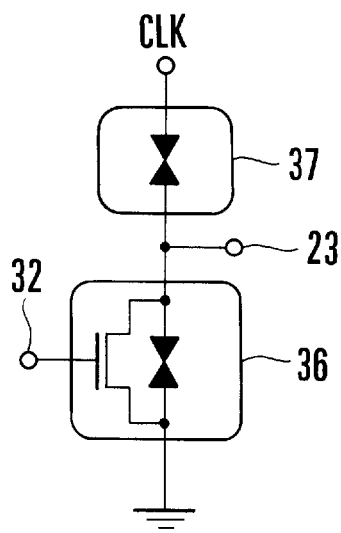
FIG. 30 is a circuit diagram showing an element circuit of the 21st embodiment of the present invention.

The principle of operation of this embodiment will be described below. First, the operation of the first element circuit as a basic circuit will be described. The first element circuit is easy to understand when it is divided into a driver unit 36 and a load unit 37 as shown in FIG. 30. The driver unit is a parallel connection of a resonant tunneling diode and a field-effect transistor. Therefore, the driver current changes in accordance with an input $V_{in}$ to the gate electrode of the field-effect transistor. FIG. 31A shows the current-voltage characteristics of the driver and the load. What is important is that individual element parameters are so set that, as shown in FIG. 31A, a peak current 38 of the driver when the input $V_{in}$ to the gate electrode of the field-effect transistor is H is larger than a peak current 39 of the load, and a peak current 40 of the driver when the input $V_{in}$ to the gate electrode of the field-effect transistor is L is smaller than the peak current 39 of the load.

The operating point of this element circuit will be described below. In a first case in which a voltage (CLK in FIG. 30, or a voltage applied to the collector electrode 31 of the second negative differential resistive element in FIG. 27A) applied to this element circuit is sufficiently low as indicated by $V_{dd1}$ in FIG. 31B, the operating point of this element circuit is uniquely given as the intersection of the current-voltage characteristics of the driver and the load as indicated by reference symbol □41 in FIG. 31B. Assume that the applied voltage at that time is L. In a second case in which the voltage (CLK in FIG. 30, or the voltage applied to the collector electrode 31 of the second negative differential resistive element in FIG. 27A) applied to this element circuit is sufficiently high as indicated by $V_{dd2}$ in FIG. 31B, the operating point of this element circuit is uniquely given as the intersection of the current-voltage characteristics of the driver and the load as indicated by reference symbol Δ42 in FIG. 31B. However, in a third case in which the voltage applied to this element circuit (the voltage applied to the collector electrode 31 of the second negative differential resistive element in FIG. 27A) is higher than in the first case and lower than in the second case as indicated by $V_{dd3}$ in FIG. 31B, the operating point of this element circuit can take two values 43 and 44 as indicated by reference symbols ○ in FIG. 31B. Assume that the applied voltage at that time is H. Whether the operating point takes the value 43 or 44 is determined by the past history as will be explained below. In this embodiment, this function of the element circuit is used to temporarily store information.

Figure 32:
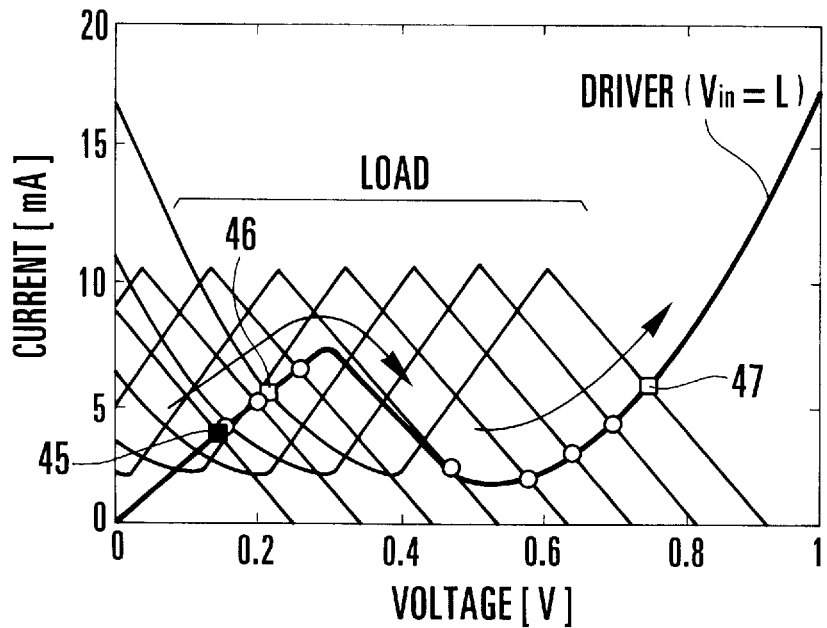
FIGS. 32A, 32B, 32C, and 32D are graphs showing the principle of operation of the element circuit of the 21st embodiment of the present invention.
Figure 32:
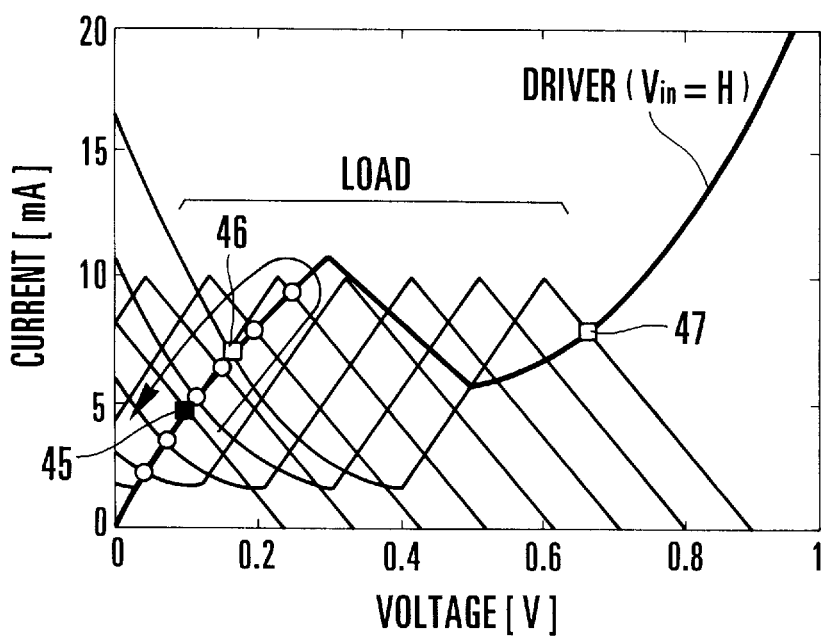
Figure 32:
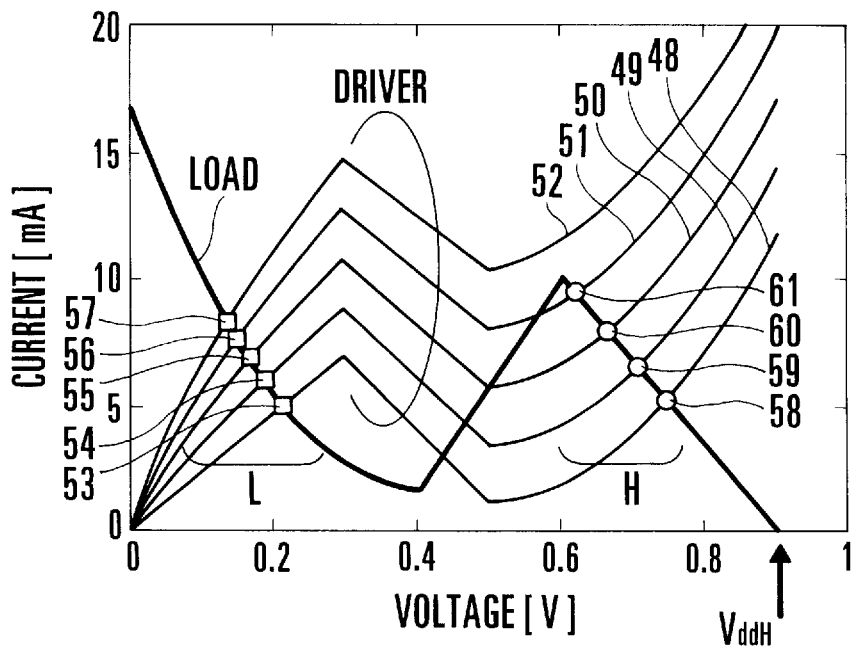
Figure 32:
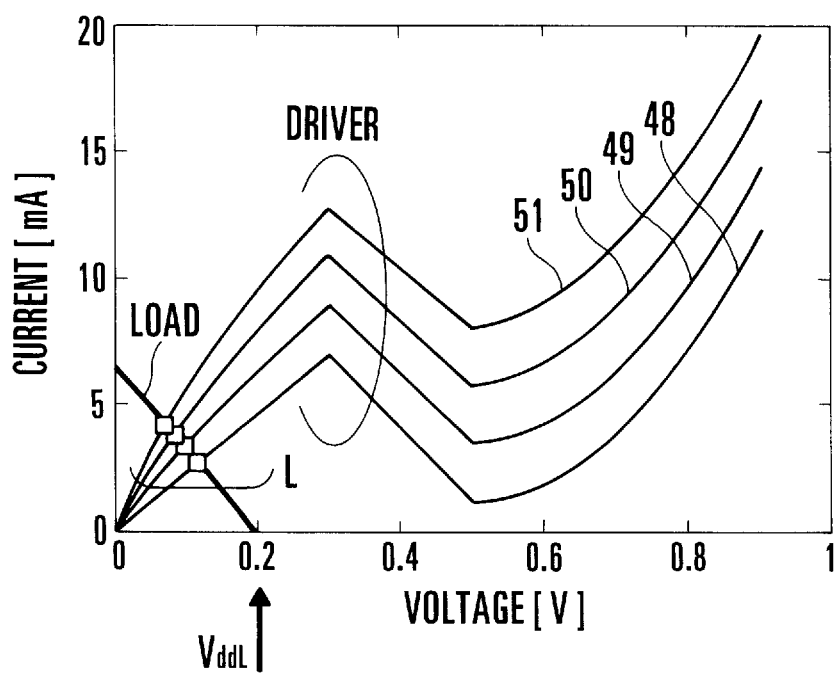
Figure 35:
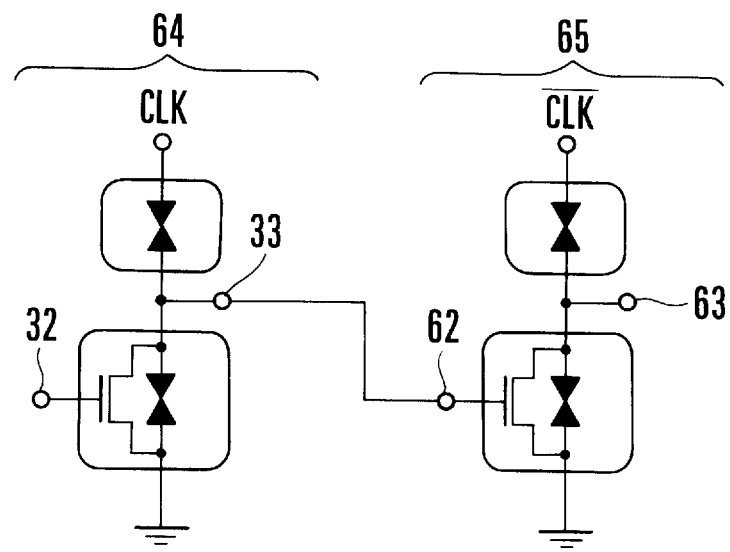
FIGS. 35A and 35B are circuit diagrams showing pairs of first and second elements of the 21st embodiment of the present invention.
Figure 35:
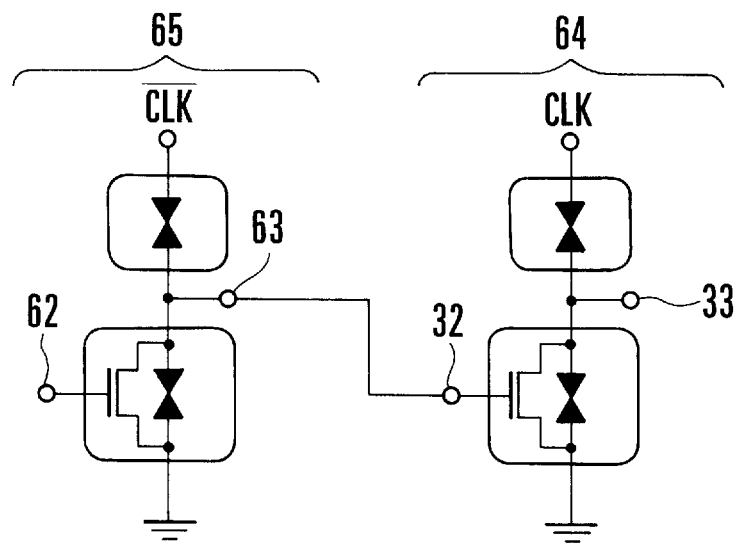

The operation of this element circuit will be described below. Assume that the initial state is the first case described above, i.e., the case in which the voltage applied to this element circuit (the voltage applied to the collector electrode 31 of the second negative differential resistive element in FIG. 27A) is sufficiently low. When the applied voltage is raised to that in the third case described above, the response of this element circuit in a case where the input to the element circuit is L entirely differs from that in a case where this input is H. First, the change of the operating point when the input 32 to this element circuit is L will be examined. In this case, as described previously, the peak current value of the current-voltage characteristic of the driver is smaller than that of the load. FIG. 32A shows the calculation results. FIG. 32A plots the current-voltage characteristic of the driver unit and the load curves of the load unit corresponding to several applied voltages to the node 31. The operating point is initially 45 and moves to the right as the applied voltage increases. Finally, of two operating points 46 and 47, the right-side operating point 47 is selected. This realizes a state in which a high voltage is applied to the driver unit and a low voltage is applied to the load unit. That is, H is output to the output 33. This is because the peak current in the driver unit is smaller than the peak current in the load unit, so the voltage applied to the load unit is always lower than the peak voltage.

FIG. 32B shows the change of the operating point when the input 32 to this element circuit is H. In this case, as described previously, the peak current in the driver unit is larger than that in the load unit. FIG. 32B plots the current-voltage characteristic of the driver unit and the load curves of the load unit corresponding to several applied voltages to the node 31. The operating point moves in a complicated manner; it moves from the point 45 to the right as the applied voltage increases but returns to the left in the middle of the movement. Finally, the left-side one of two operating points is selected. This accomplishes a state in which a low voltage is applied to the driver unit and a high voltage is applied to the load unit. That is, L is output to the output 33. This is because the peak current in the driver unit is larger than that in the load unit, so the voltage applied to the driver unit is always lower than the peak voltage.

The response of this element circuit when the voltage (CLK in FIG. 30, or the voltage applied to the collector electrode 31 of the second negative differential resistive element in FIG. 27A) applied to the element circuit is fixed to a high potential H (=$V_{ddH}$) and the input 32 to the element circuit changes will be described below with reference to FIG. 32C. First, assume that the output of this element circuit, i.e., the output 33 of the element circuit is initially at a high potential H and the operating point is 59. At that time, the current-voltage characteristic of the driver unit of this element circuit is a curve 49. As the value of the input 32 to the element circuit is decreased, the current-voltage characteristic of the driver unit changes as indicated by a curve 48. When the value of the input 32 is increased, the characteristic changes as indicated by curves 50 and 51. Accordingly, the operating point changes within the range of points 58, 59, 60 and 61, but the value of the output 33 remains the high potential H. If the input is too large, the current-voltage characteristic of the driver unit becomes a curve 52, and the operating point moves to a point 57 at the low potential L. When the circuit is so designed that the input does not take such a too large value, the potential at the output 33 is held as long as the voltage (CLK in FIG. 30, or the voltage applied to the collector electrode 31 of the second negative differential resistive element in FIG. 27A) applied to this element circuit remains the high potential H, even if the input potential to the input 32 varies between the low potential L and the high potential H.

The output when the voltage (CLK in FIG. 30, or the voltage applied to the collector electrode 31 of the second negative differential resistive element in FIG. 27A) applied to this element circuit is the low potential L will be examined below. FIG. 32D shows the load curve of this element circuit in this case. When the input potential to the input 32 is changed, the current-voltage characteristic of the driver unit changes as indicated by curves 48, 49, 50, and 51. Under this voltage application condition, however, the low potential L is continually applied to the driver unit, and the high potential H is not applied thereto.

In summary, the operation of this element circuit (FIG. 30) is as follows.

(1) When CLK is at the low potential L, the output is at the low potential L at all times regardless of the input.

(2) When the CLK is at the high potential H, the output maintains the initial value regardless of the variation of the input.

(3) The inversion of the input when CLK changes from the low potential L to the high potential H is output.

FIG. 34 shows the timing chart of this element circuit shown in FIG. 33. As described in item (1) above, when CLK is the low potential L, the output is always the low potential L. As can be seen from an output $V_{out}$ when the input $V_{in}$ changes, a change in the input has no effect on the output. At time u, CLK is at the high potential H and the input changes. If this is the case, as described in item (2) above, the output maintains the value immediately before the input changes. In FIG. 34, reference symbols $t_1$ to $t_6$ denote times at which CLK changes from the low potential L to the high potential H. At the times $t_1$, $t_3$, and $t_6$, the input is at the high potential H, so the output is at the low potential L as described in item (3) above. At the times $t_2$, $t_4$, and $t_5$, the input is at the low potential L, so the output is at the high potential H as described in item (3).

Figure 36:
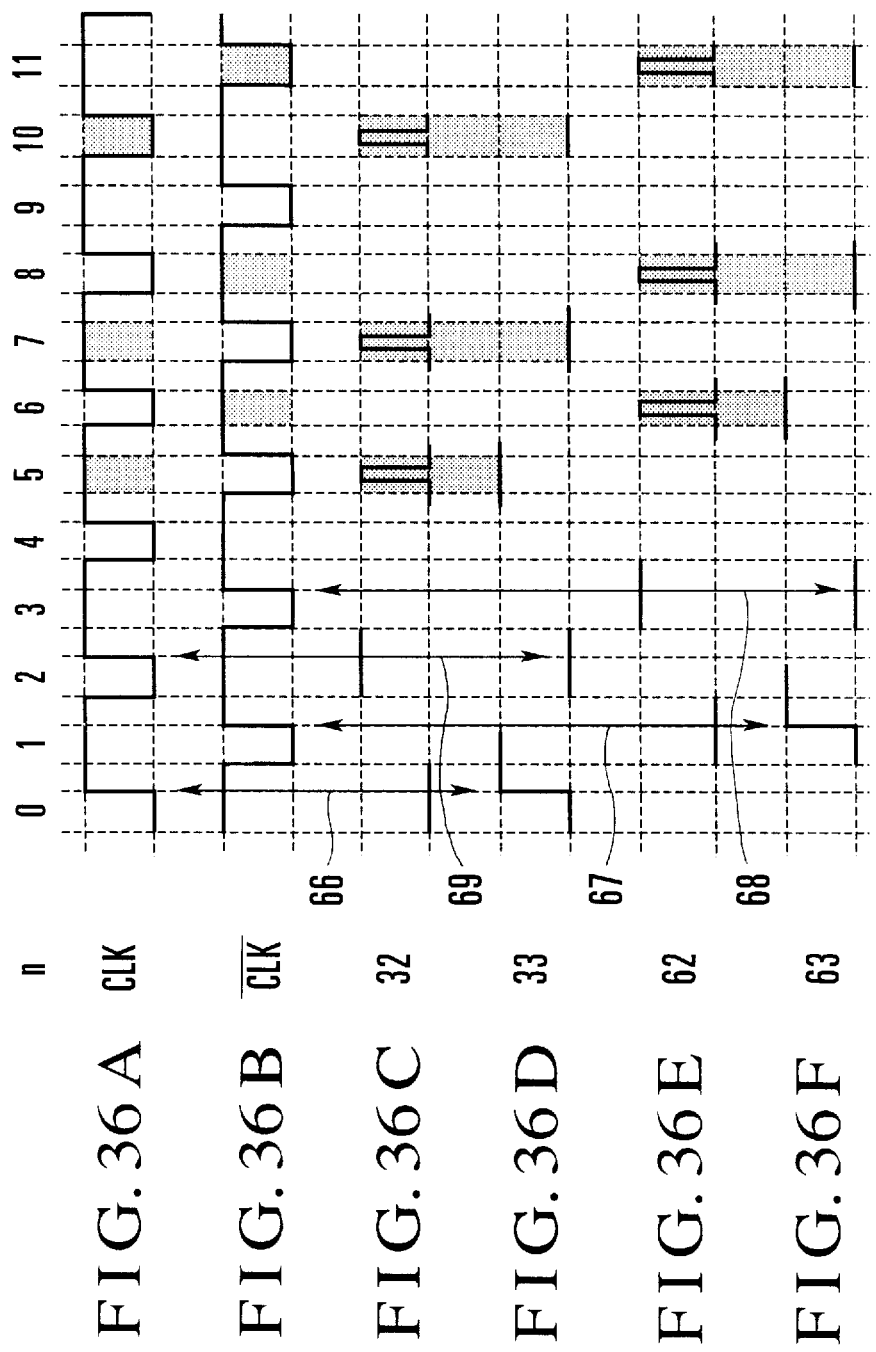
FIGS. 36A to 36F are timing charts related to the pairs of elements shown in FIGS. 35A and 35B.
Figure 38:
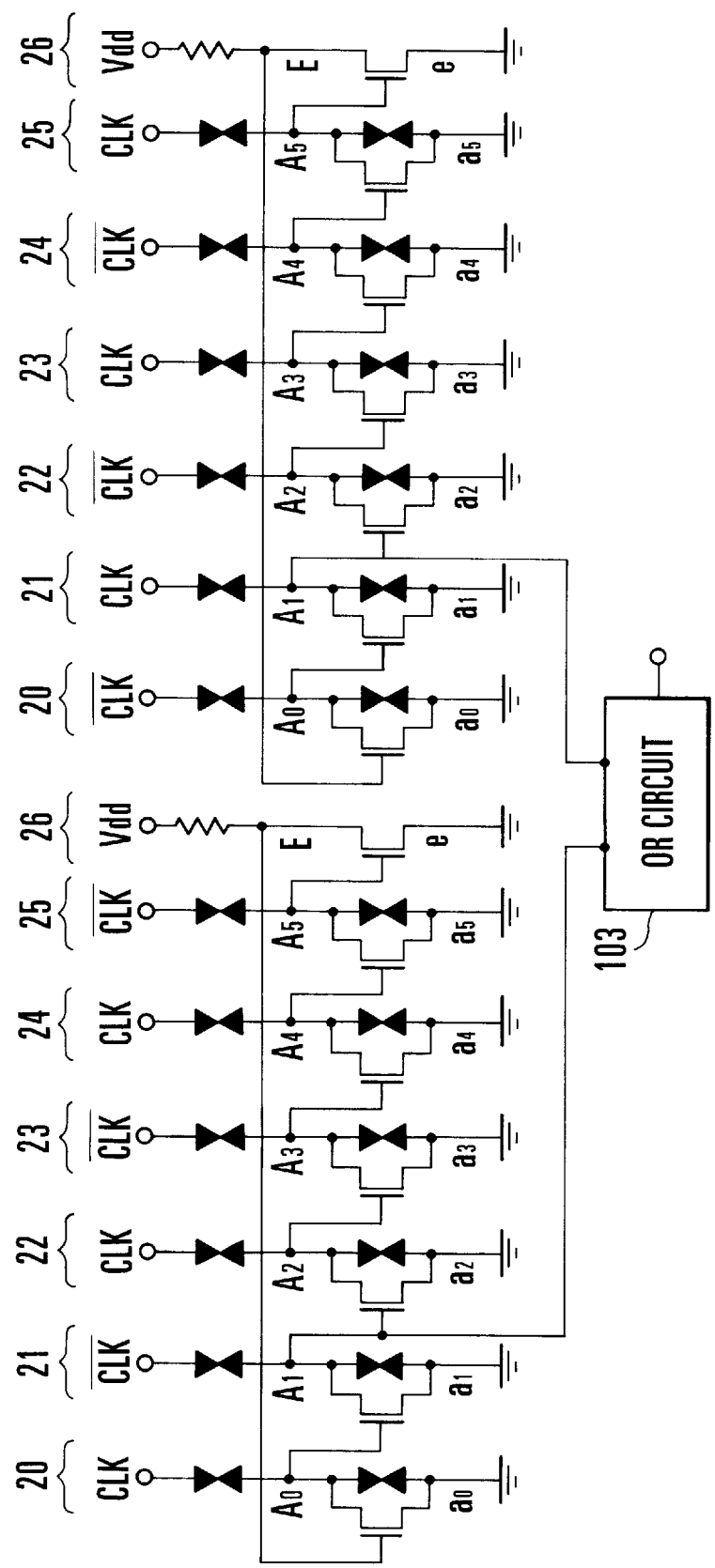
FIG. 38 is a circuit diagram showing still another modification of the 21st embodiment of the present invention.
Figure 39:
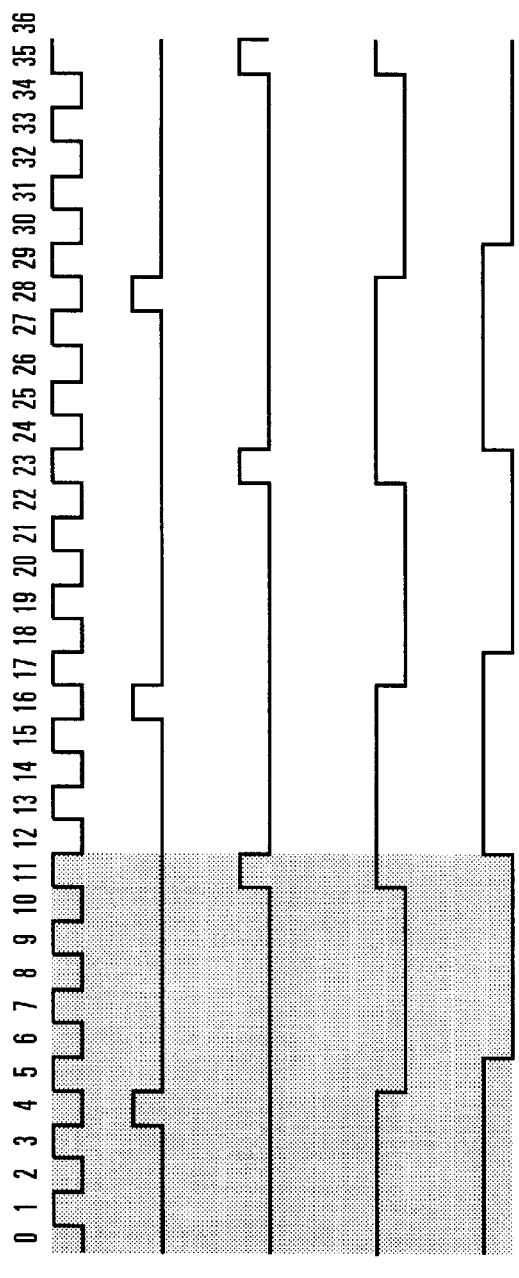
FIGS. 39A to 39D are timing charts of the circuit shown in FIG. 38.
Figure 41:
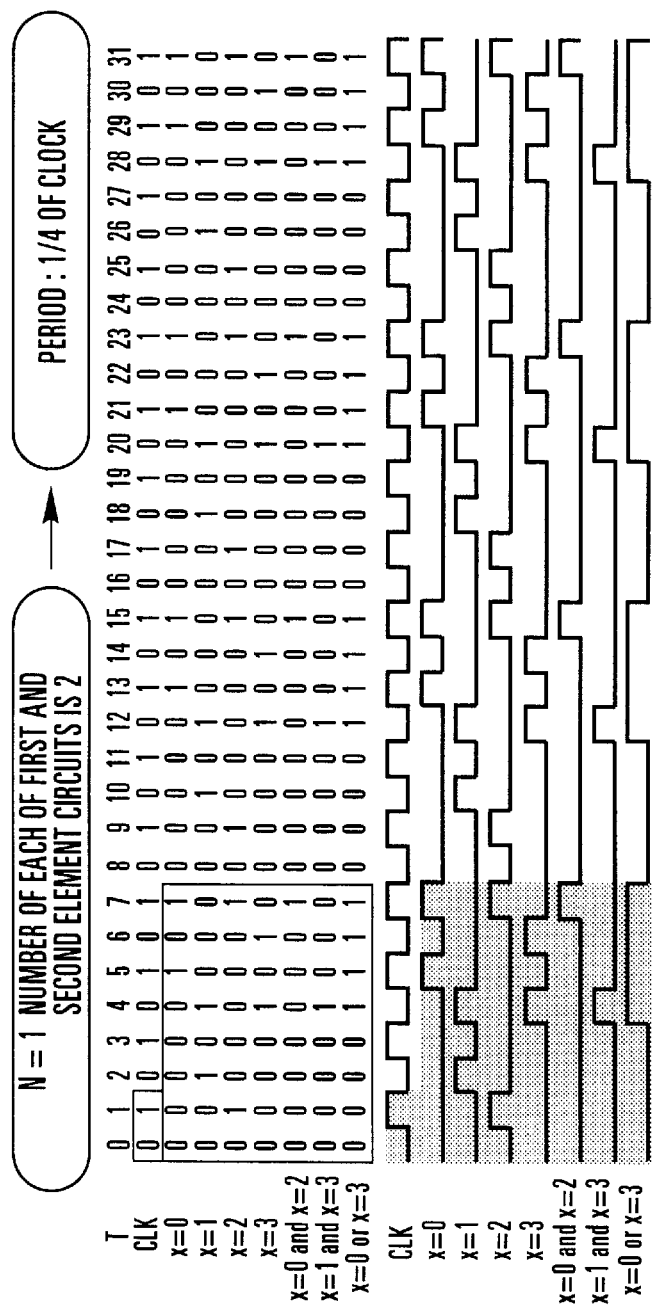
FIG. 41 is a view showing the result of calculations corresponding to the number of element circuits of the operation of the 21st embodiment of the present invention.

The principle of operation of the 21st embodiment shown in FIG. 26 will be described below. In this embodiment, the first element circuits and the second element circuits are alternately arranged. Referring to FIG. 26, the first element circuits are given even-number indices, and their outputs are represented by $A_0, A_2, \ldots, A_{2N}$. The second element circuits are given odd-number indices, and their outputs are represented by $A_1, A_3, \ldots, A_{2N+1}$. The input potentials to the first element circuits are represented by $a_0, a_2, \ldots, a_{2N}$. The input potentials to the second element circuits are represented by $a_1, a_3, \ldots, a_{2N+1}$. This circuit will be referred to as an Nth-order circuit hereinafter. The first power supply or the clock CLK and the second power supply or a clock bar $\overline{CLK}$ are indexed as shown in FIGS. 36A and 36B. A value of more than 50% is chosen as the duty ratios of the clock pulse and the clock bar pulse to set a time period during which the clock and the clock bar are simultaneously at the high potential H. This is done for the sake of convenience of explanation and is not necessarily essential as will be described later. For simplicity in the following analysis, the output potential and the input potential of an element circuit k at time m are represented by A(k,m) and a(k,m), respectively.

First, equations describing the behavior of each potential in the circuit are derived. Since the potentials at nodes directly connected by lines are equal, equations [17] to [19] hold.

$$A(k,m)=a(k+1,m) \quad [17]$$

$$A(2N+1,m)=e(m) \quad [18]$$

$$E(m)=a(0,m) \quad [19]$$

Also, since the potential is the low potential L at the time the first and second power supplies are indexed with an even number and an odd number, respectively, equations [20] and [21] hold. Furthermore, equation [22] holds due to the characteristics of the inverting element circuit.

$$A(2k,2n)=0 \quad [20]$$

$$A(2k+1,2n+1)=0 \quad [21]$$

$$E(m)=1-e(m) \quad [22]$$

Equations [23] and [24] hold due to the dynamics of the first and second element circuits.

$$A(2k,2n+1)=1-a(2k,2n) \quad [23]$$

$$A(2k+1,2n)=1-a(2k+1,2n-1) \quad [24]$$

Equation [23] indicates that the inversion of an input a(2k,2n) to the first element circuit is an output A(2k,2n+1) of that element circuit at leading edges 66 and 69 of the clock shown in FIG. 36A. Equation [24] indicates that the inversion of an input a(2k+1,2n-1) to the second element circuit is an output A(2k+1,2n) of that element circuit at leading edges 67 and 68 of the clock bar shown in FIG. 36B.

Equations [17] to [24] are a set of equations describing the operation of this embodiment. A solution of this equation set is obtained as follows. Eliminating a from equations [17], [23], and [24] yields equations [25] and [26].

$$A(2k,2n+1)=1-A(2k-1,2n) \quad [25]$$

$$A(2k+1,2n)=1-A(2k,2n-1) \quad [26]$$

When a relation including only the first element circuit is calculated from equations [25] and [26], i.e., when A having the odd-number element circuit indices are eliminated, the following equation is obtained.

$$A(2k+2,2n+1)=1-A(2k+1,2n)=A(2k,2n-1)$$

Comparing the leftmost side with the rightmost side reveals that equation [27] where m is an arbitrary integer holds.

$$A(2k,2n+1)=A(2k-2m,2n+1-2m) \quad [27]$$

Equation [27] shows that all node potentials in the form of A(2k,2n+1) are reduced into the form of A(0,2p+1). In the following description, an equation containing only terms in the form of A(0,2p+1) is derived and solved to obtain a practical solution of A(0,2p+1).

If k=0 in equation [23], $$A(0,2n+1)=1-a(0,2n) \quad [28]$$

On the other hand, from equations [18], [19], and [22], $$a(0,2n)=E(2n)=1-e(2n)=1-A(2N+1,2n) \quad [29]$$

The following equation is obtained by eliminating a from equations [28] and [29].

$$A(0,2n+1)=A(2N+1,2n)$$

Equation [30] is obtained by matching time 2n on the right side with 2n+1 on the left side by using the relationship of equation [25] and rearranging the result by equation [27].

$$A(0,2(n+N+1)+1)=1-A(0,2n+1) \quad [30]$$

Equation [30] is related to A(0,2p+1), and practical solution [31] can be obtained.

$$A(0,2m+1)=(-1)^{INT((2m+1)/2/(N+1))}*(A(0,MOD(2m+1,2N+2)-0.5)+0.5 \quad [31]$$

where INT(x) is a maximum integer not exceeding x and MOD(x,y) is a remainder when x is divided by y. Equation [31] contains N parameters A(0,1), A(0,3), A(0,5), . . . , A(0,2N+1). These parameters are initial values (or boundary conditions) of this equation.

A more general solution A(2k,2n+1) can be written as equation [32] by using equation [27].

$$\begin{aligned}A(2k, 2n+1) &= A(0, 2(n-k)+1) \\ &= (-1)\,INT((2n-k)+1)/2/(N+1))* \\ &\quad (A(0, MOD(2(n-k)+1, 2N+2)-0.5)+0.5\end{aligned} \quad [32]$$

Other solutions different in whether the argument is an even- or odd-number are written as follows by using equations [20], [21], and [26].

$$A(2k+1,2n)=1-A(2k,2n-1) \qquad [33]$$

$$A(2k,2n)=0 \qquad [34]$$

$$A(2k+1,2n+1)=0 \qquad [35]$$

It turns out from the above examinations that the changes with time of the potentials at the individual nodes in this embodiment are described by equations [32] to [35]. The following is immediately obvious from these equations. First, an equation below holds from equation [32].

$$\begin{aligned} A(2k, 2n+1+2N+2) &= (-1)\,\mathrm{INT}((2n-k)+1)+2N+2)/2/(N+1)\,*\\ &\quad (A(0, \mathrm{MOD}(2(n-k)+1+2N+2,\\ &\quad 2N+2))-0.5)+0.5\\ &= (-1)\hat{}(\mathrm{INT}((2(n-k)+1)/2/(N+1))+1)\,*\\ &\quad (A(0, \mathrm{MOD}(2(n-k)+1, 2N+2))-0.5)+\\ &\quad 0.5\\ &= -1 * (-1)\hat{}\mathrm{INT}((2(n-k)+1)/2/(N+1))\,*\\ &\quad (A(0, \mathrm{MOD}(2(n-k)+1, 2N+2))-0.5)+\\ &\quad 0.5\\ &= 1 - A(2k, 2n+1) \end{aligned}$$

Accordingly, A(2k,2n+1) is found to be a periodic function which inverts at a time interval of 2N+2 and has a period of 2*(2N+2). The clock period is 2 as shown in FIG. 36A. Therefore, the output A(2k,2n+1) of the element circuit with index 2k of this embodiment is a periodic function whose period is (2N+2) times the clock. Also, equation [33] shows that A(2k+1,2n) has the same period as A(2k,2n+1). This demonstrates that this embodiment is a 1/(2N+2) frequency dividing circuit assuming the order of the circuit is N. That is, frequency dividers of ratios 1/2, 1/4, 1/6, 1/8, 1/10, . . . , can be manufactured with a simple arrangement by selecting 0, 1, 2, 3, 4, . . . , as N. The above discussions do not use practical initial conditions (or boundary conditions). Accordingly, the above conclusion generally holds for the first embodiment regardless of the initial conditions.

Practical solutions will be explained below. FIGS. 40, 41, 42, and 43 illustrate the calculation results of this embodiment when the order N of the circuit is 0, 1, 2, and 3. Calculations were performed for outputs of all element circuits contained in the circuit. In FIGS. 40 to 43, x denotes the index of an element circuit. That is, x=0, 1, 2, 3, 4, 5, 6, and 7 represent the outputs of the element circuits A0, A1, A2, A3, A4, A5, A6, and A7. In this calculation example, all initial values contained in equation [31] are 0.

As already described in the general discussions, the calculation result of the output of each element circuit is such that the period of the output is 2*(N+1) times the clock, i.e., the output frequency is 1/(2N+2) times the clock. The output from each element circuit is a string of (N+1) pulses whose pulse width is equal to that of the clock pulse. The results of logical operations of outputs from a plurality of element circuits are also shown. Such logical operations are performed by, e.g., an AND circuit 102A and an OR circuit 103 shown in FIGS. 37A and 37B. In FIGS. 40 to 43, (x=0 and x=2) represent logical products of A0 and A2. A wider variety of pulse strings can be obtained by performing logical operations for outputs from a plurality of element circuits. For example, when the order N of the circuit is 2 (FIG. 42), the output from each element circuit is a pulse string containing three pulses in a unit period. However, the number of pulses in the unit period can be changed to 1 or 2 by performing suitable logical operations. Pulse strings of the same kind having different phases can be obtained in accordance with the manner of logical operations. For example, in FIG. 42, (x=0 and x=4) or (x=1 and x=5) are pulse strings of the same kind different only in phase. Also, ORing A0 and A5 yields a pulse string whose period is six times (2*(N+1)) the clock and duty ratio is 50%. Furthermore, it is possible to arrange a plurality of circuits of this embodiment and perform logical operations for outputs from individual element circuits.

FIG. 28 shows the 22nd embodiment of the present invention. The above 21st embodiment includes only the first and second element circuits as element circuits. This 22nd embodiment includes third and fourth element circuits in addition to the first and second element circuits. The sum of the numbers of the first and third element circuits equals the sum of the numbers of the second and fourth element circuits. The sum of the numbers of the third and fourth element circuits and an inverting element circuit must be an odd number.

The third element circuit is identical with the first element circuit except the following point. That is, the source and drain electrodes of a field-effect transistor are connected to the emitter and collector electrodes, respectively, of a second negative differential resistive element. In the first element circuit, these electrodes are connected to the first negative differential resistive element, and this is the difference. The fourth element circuit is identical with the second element circuit except the following point. That is, the source and drain electrodes of a field-effect transistor are connected to the emitter and collector electrodes, respectively, of a second negative differential resistive element. In the second element circuit, these electrodes are connected to the first negative differential resistive element, and this is the difference. The above characteristic features of the first, second, third, and fourth element circuits are summarized in Table 6.

TABLE 6

|  | First element circuit | Second element circuit | Third element circuit | Fourth element circuit |
| --- | --- | --- | --- | --- |
| Power supply | First power supply | Second power supply | First power supply | Second power supply |
| Parallel field-effect transistor | First NDR element | First NDR element | Second NDR element | Second NDR element |

The 22nd embodiment shown in FIG. 28 includes one fourth element circuit 21' and one third element circuit 24'. Equations describing the operation of the 21st embodiment are equations [17] to [24]. Equations describing this embodiment are the same as the 21st embodiment except that equations [23] and [24] are replaced with equations [36] and [37], respectively.

$$A(2k, 2n+1) = \begin{cases} a(2k, 2n) & k=2 \\ 1-a(2k, 2n) & k \ne 2 \end{cases} \qquad [36]$$

$$A(2k+1, 2n) = \begin{cases} a(2k+1, 2n-1) & k=0 \\ 1-a(2k+1, 2n-1) & k \ne 0 \end{cases} \qquad [37]$$

The operation of this embodiment is described by equations [17] to [22], [36], and [37]. When solutions are calculated following the same method as in the 21st embodiment, equations [38] to [43] are obtained.

$$A(0,2n+1)=(-1)\hat{}\mathrm{INT}((2n+1)/6)*(A(0,\mathrm{MOD}(2n+1,6))-0.5)+0.5 \qquad [38]$$

$$A(1,2n)=A(0,2n-1) \qquad [39]$$

$$A(2,2n+1)=1-A(0,2n-1) \qquad [40]$$

$$A(3,2n)=A(0,2n-3) \quad [41]$$

$$A(4,2n+1)=A(0,2n-3) \quad [42]$$

$$A(5,2n)=A(0,2n+1) \quad [43]$$

Examining equation [38] in the same manner as done for equation [32] in the explanation of the 21st embodiment shows that an output $A(0,2p+1)$ of an element circuit with index 0 in the 22nd embodiment is a periodic function which inverts at a time interval of $(2N+2)$ and has a period of $2*(2N+2)$ (in this embodiment, $(2N+2)=6$ because $N=2$). It is also obvious that the other element circuits have similar periodic functions because their outputs have linear functions of $A(0,2p+1)$ from equations [39] to [43]. Since the clock period is 2, the period of this embodiment is $(2N+2)$ times the clock. That is, this circuit is a frequency divider whose period is $1/(2N+2)$.

Figure 29:
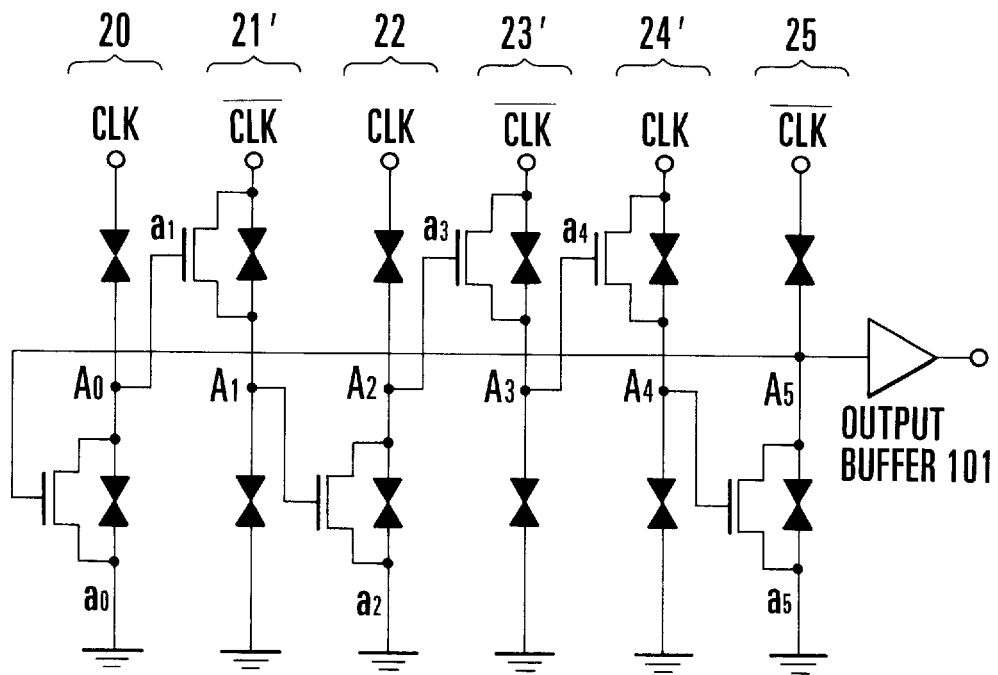
FIG. 29 is a circuit diagram showing the 23rd embodiment of the present invention.

FIG. 29 shows the 23rd embodiment of the present invention. This embodiment is mostly the same as the second embodiment except that no inverting element circuit is included. The sum of the numbers of first and third element circuits is made equal to the sum of the numbers of second and fourth element circuits. The sum of the numbers of the third and fourth element circuits must be an odd number. In the embodiment shown in FIG. 29, one third element circuit 24' and two fourth element circuits 21' and 23' are used. Analysis analogous to those in the first and second embodiments shows that this embodiment is also a periodic function which inverts at a time interval of $(2N+2)$ and has a period of $2*(2N+2)$.

Comparison of the time dependences of outputs of the six element circuits in the 21st to 23rd embodiments is summarized in Table 7. Relations of the output $A(0,2n+1)$ of the first element circuit with index 0 are the same. Outputs of element circuits having other indices are described by using, e.g., $A(0,2n+1)$, to facilitate mutual comparison. It is evident from Table 7 that the outputs of the element circuits with indices 0, 4, and 5 in the 22nd embodiment equal those in the 21st embodiment and the outputs of the element circuits with indices 1, 2, and 3 in the 22nd embodiment equal the inversions of the respective counterparts in the 21st embodiment. Similarly, the outputs of the element circuits with indices 0 and 3 in the 23rd embodiment equal those in the 21st embodiment and the outputs of the element circuits with indices 1, 2, 4, and 5 in the 23rd embodiment equal the inversions of the respective counterparts in the 21st embodiment.

TABLE 7

|  | 21st embodiment | 22nd embodiment | 23rd embodiment |
|---|---|---|---|
| $A(0,2n+1)$ | * | * | * |
| $A(1,2n)$ | $1-a(0,2n-1)$ | $A(0,2n-1)$ | $A(0,2n-1)$ |
| $A(2,2n+1)$ | $A(0,2n-1)$ | $1-A(0,2n-1)$ | $1-A(0,2n-1)$ |
| $A(3,2n)$ | $1-A(0,2n-3)$ | $A(0,2n-3)$ | $1-A(0,2n-3)$ |
| $A(4,2n+1)$ | $A(0,2n-3)$ | $A(0,2n-3)$ | $1-A(0,2n-3)$ |
| $A(5,2n)$ | $A(0,2n+1)$ | $A(0,2n+1)$ | $1-A(0,2n+1)$ |

*) $A(0,2n+1) = (-1)^{INT(t/2/(N+1))} * (A(0,MOD(t,2(N+1))) - 0.5) + 0.5$

The above results can be understood as follows. That is, the influence of a signal appearing in an output of index 0 at a certain time propagates with clocks to the right in FIGS. 27, 28, and 29. In the 21st embodiment (FIG. 26), all element circuits output the inversion of the input signal. However, the 22nd and 23rd embodiments (FIGS. 28 and 29) include the third element circuit 24' and the fourth element circuits 21' and 23', and these element circuits operate in a different way from that in the 21st embodiment; i.e., they directly output the input signal without inverting it. The present inventors have focused attention on this difference and checked how the output Q of the element circuit with index 0 changes while propagating with clocks through the element circuits in the next and subsequent stages. The results are shown in Table 8. In the 21st embodiment, the output from each element circuit is always the inversion of the input, so Q and $\overline{Q}$ alternately appear in the output from each element circuit. Note that $\overline{Q}$ is the inversion of Q. The 22nd embodiment has the fourth element circuit in the position of index 1 and the third element circuit in the position of index 3. Accordingly, the outputs from the individual element circuits are as shown in Table 8.

Figure 42:
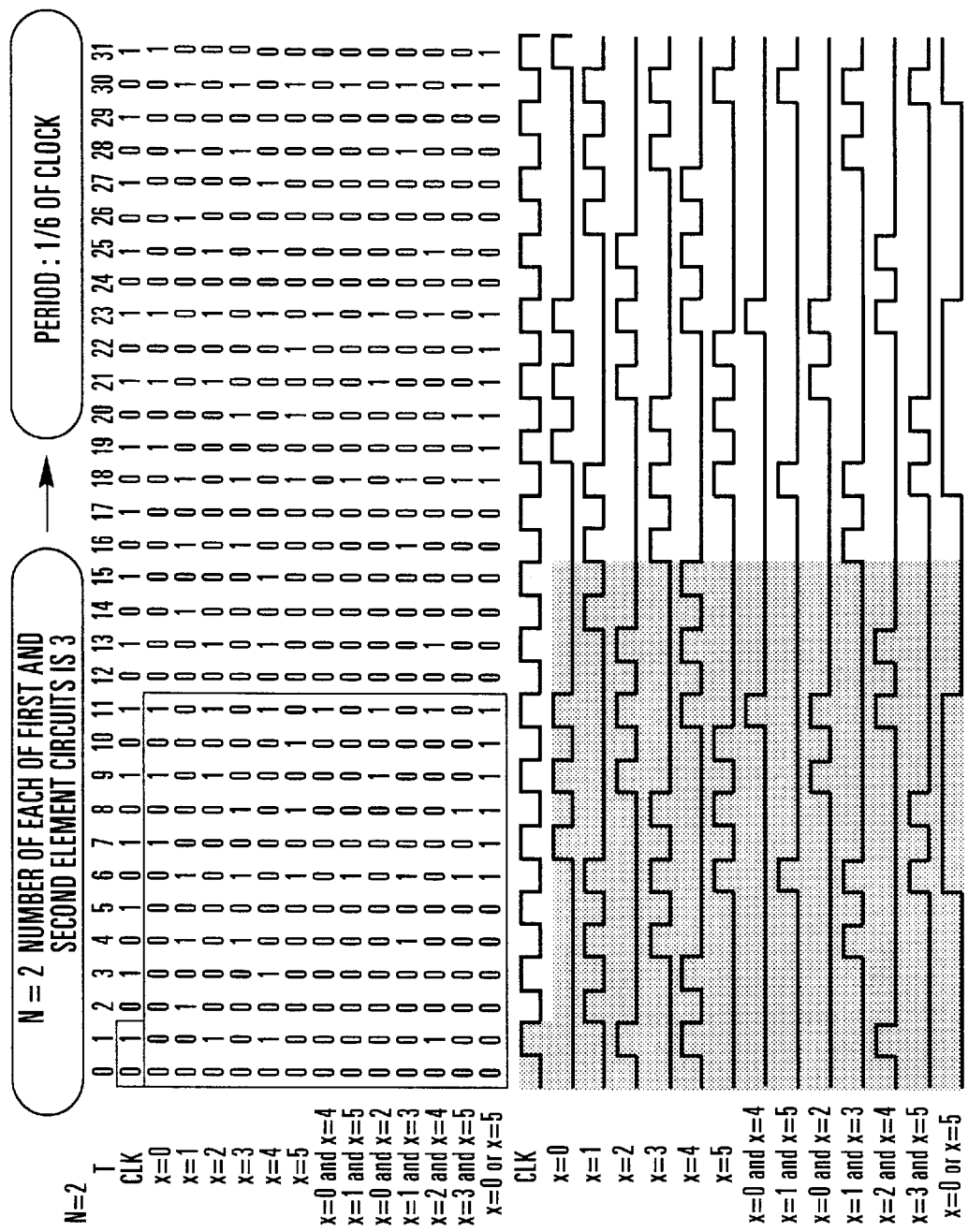
FIG. 42 is a view showing the result of calculations corresponding to the number of element circuits of the operation of the 21st embodiment of the present invention.
Figure 43:
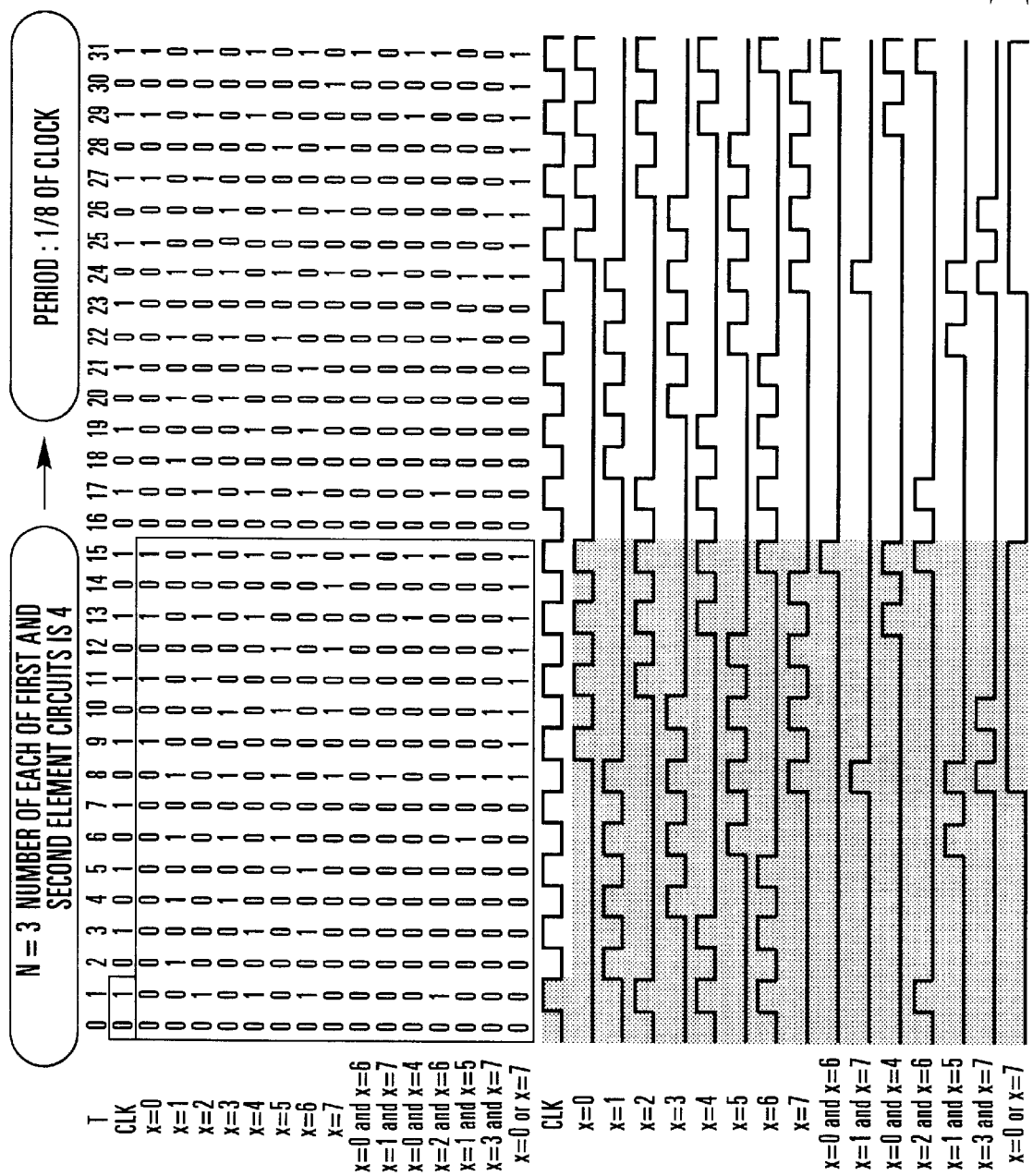
FIG. 43 is a view showing the result of calculations corresponding to the number of element circuits of the operation of the 21st embodiment of the present invention.
Figure 44:
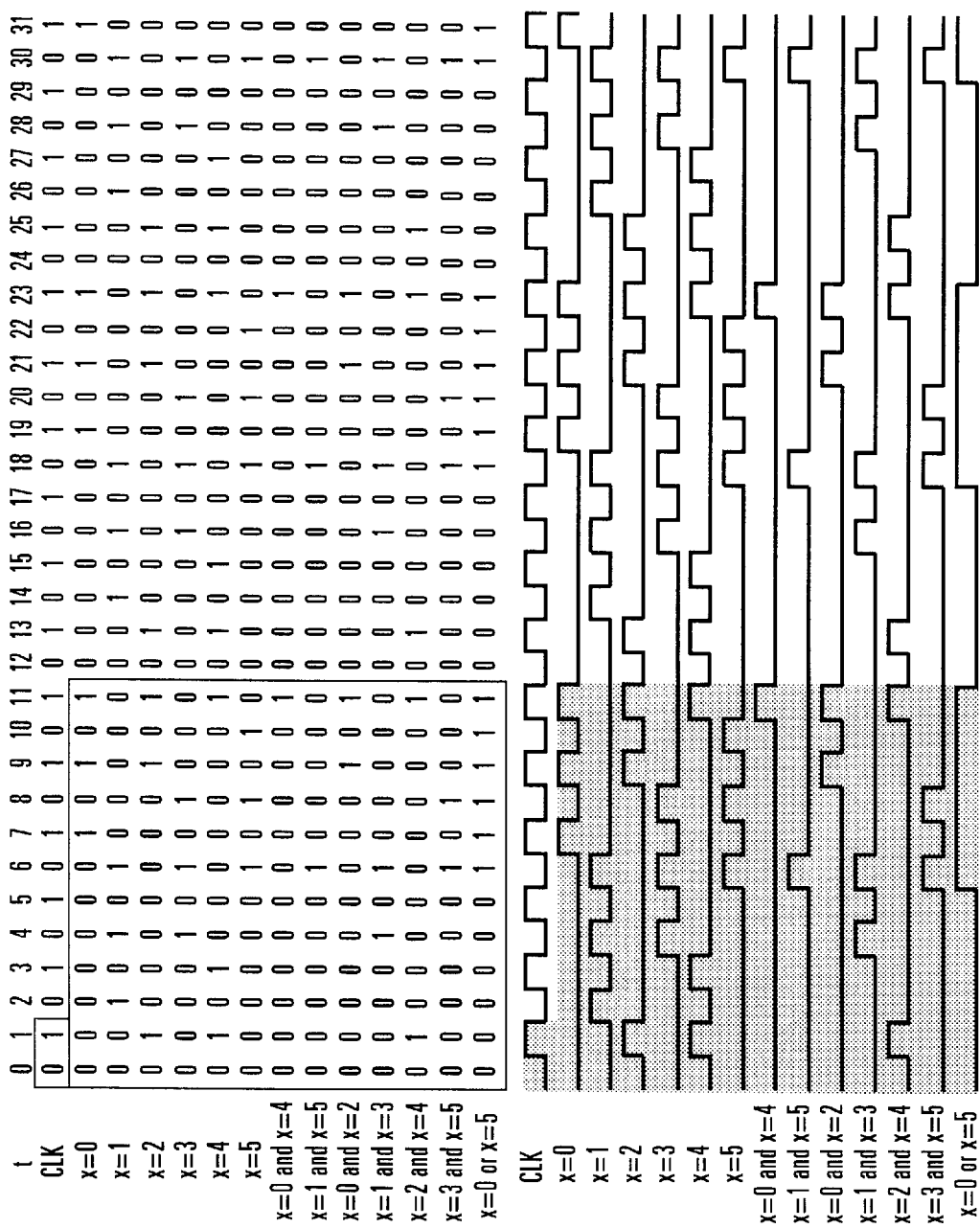
FIG. 44 is a view showing the result of calculations of the operation of the 21st embodiment of the present invention.
Figure 45:
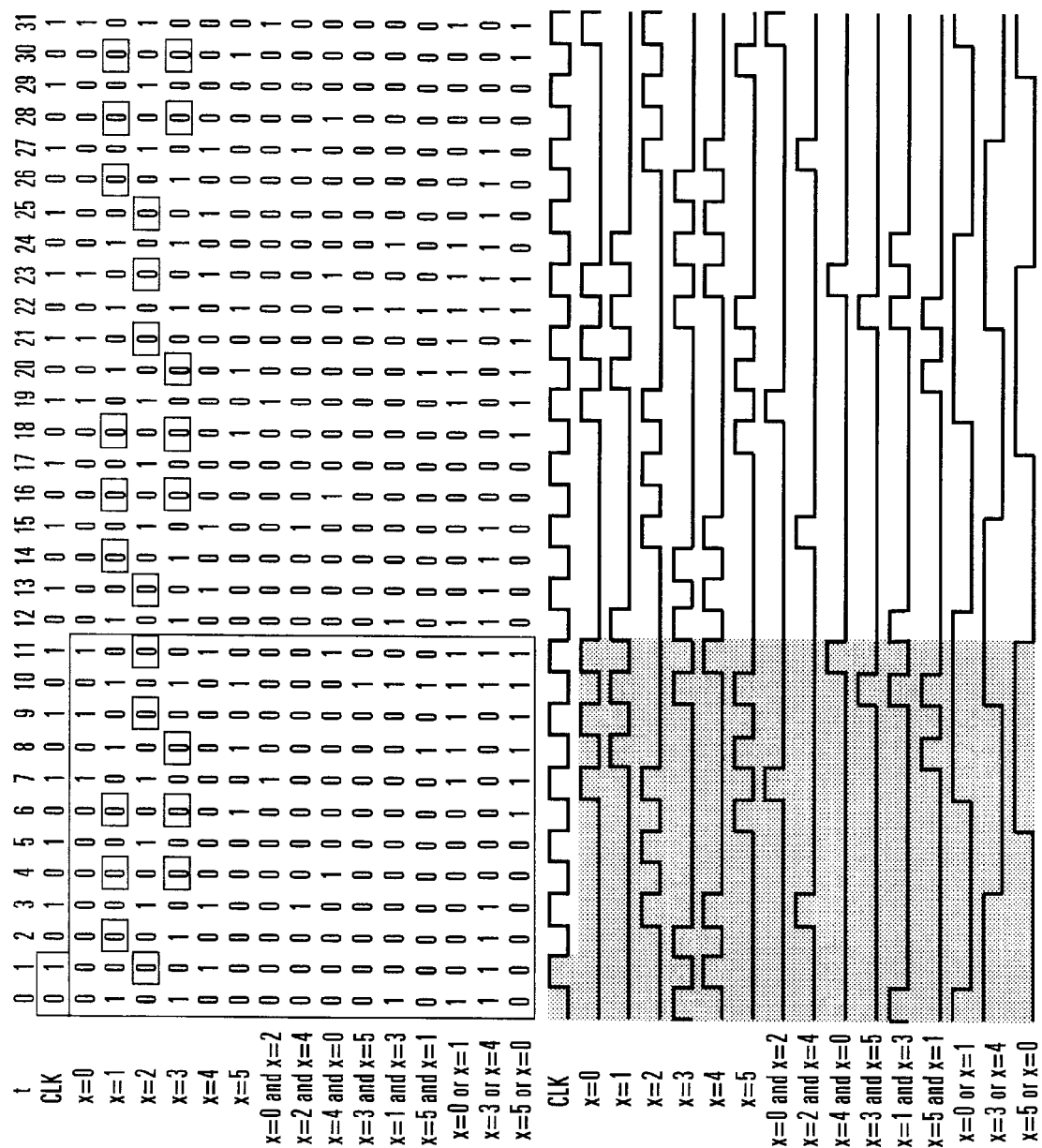
FIG. 45 is a view showing the result of calculations of the operation of the 22nd embodiment of the present invention.
Figure 46:
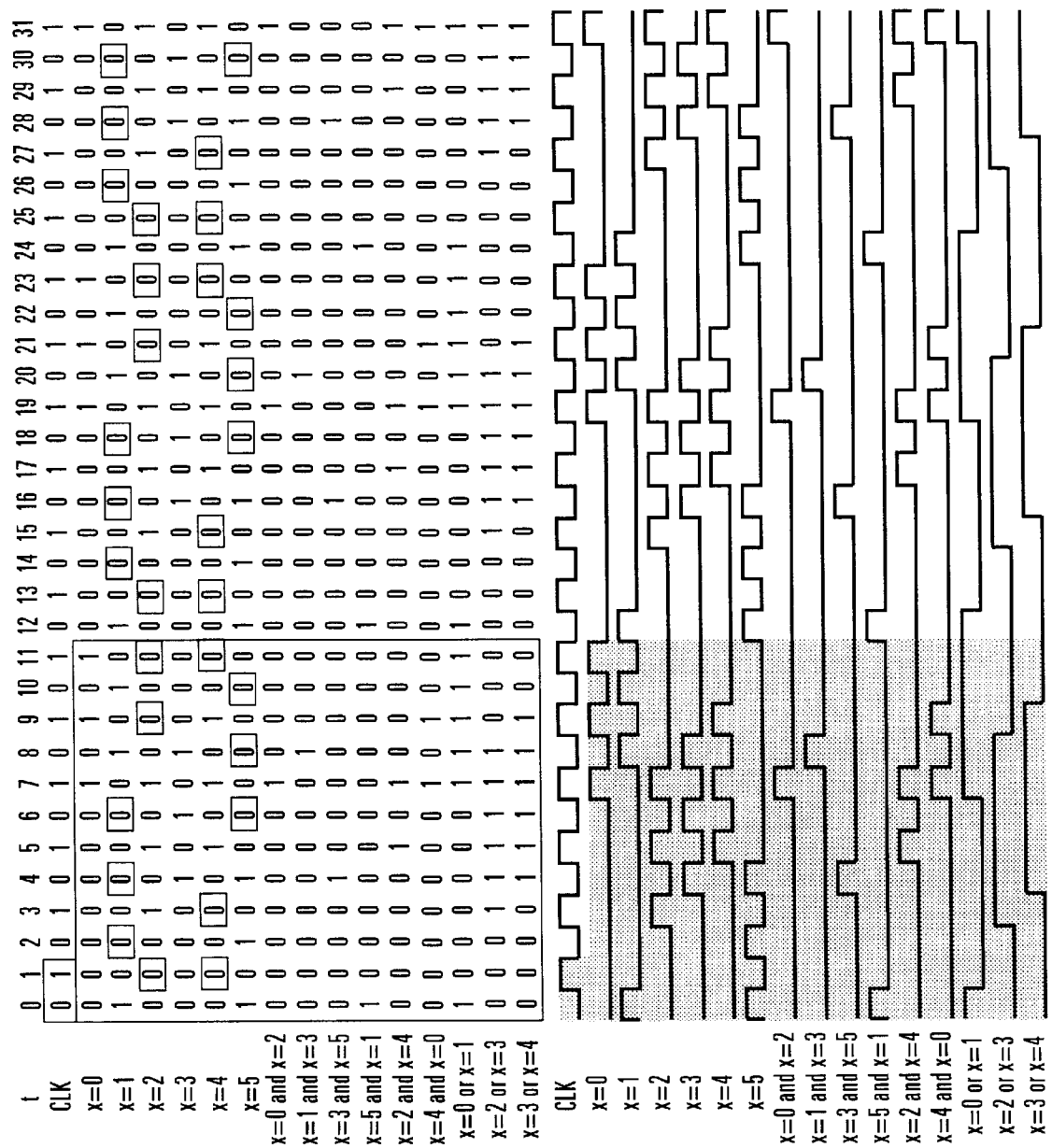
FIG. 46 is a view showing the result of calculations of the operation of the 23rd embodiment of the present invention.

The outputs in the 21st and 22nd embodiments will be compared below. These two embodiments have the same outputs in the element circuits at the positions of indices 0, 4, and 5. However, the outputs in one embodiment are the inversions of the outputs in the other in the element circuits at the positions of indices 1, 2, and 3. This accords with Table 7. The 21st and 23rd embodiments also have output differences corresponding to Table 7 because the 23rd embodiment includes the third and fourth element circuits. FIGS. 44, 45, and 46 illustrate the calculation results of the operations of the 21st, 22nd, and 23rd embodiments (FIG. 44 is identical with FIG. 42). In FIGS. 45 and 46, cells where the output is 1 in the 21st embodiment but is not 1 in the 22nd or 23rd embodiment are enclosed with double lines. FIG. 45 shows that the element circuits with indices 1, 2, and 3 in the 22nd embodiment output the inversions of the outputs of the respective counterparts in the 21st embodiment. For example, the element circuit (x=1) with index 1 in the 21st embodiment will be checked. Since it is already known that the period is 12, it is only necessary to check from time 0 to time 11. This element circuit outputs 1 at times 2, 4, and 6. However, the same element circuit outputs 0 at the same times in the 22nd embodiment. On the other hand, at times 8, 10, and 1 at which 0 is output in the 21st embodiment, 1 is output in the 22nd embodiment. This demonstrates that the outputs in the 22nd embodiment are the inversions of the same outputs in the 21st embodiment. Note that the output is always 0 at times 1, 3, 5, 7, 9, and 11, so no discussion is necessary. Likewise, FIG. 46 shows that the element circuits with indices 1, 2, 4, and 5 in the 23rd embodiment output the inversions of the outputs of the respective counterparts in the first embodiment.

From the above discussions, a method of simply calculating the responses of the 22nd and 23rd embodiment is known. First, in the corresponding 21st embodiment, the third element circuit is replaced with the first element circuit, the fourth element circuit is replaced with the second element circuit, and the operation of the resulting circuit is checked. Subsequently, Table 8 is formed, and the difference between the operations of the resulting embodiment and the 21st embodiment is checked. Finally, outputs which are to be inverted in the operation of the 21st embodiment are inverted. The result is the operation of this embodiment.

TABLE 8

| Time | −1 | 0 | 1 | 2 | 3 | 4 |
|---|---|---|---|---|---|---|
| Index of element circuit 21st | 0 | 1 | 2 | 3 | 4 | 5 |

TABLE 8-continued

| Time | -1 | 0 | 1 | 2 | 3 | 4 |
|---|---|---|---|---|---|---|
| embodiment | | | | | | |
| Element circuit | 1st | 2nd | 1st | 2nd | 1st | 2nd |
| Output | Q | $\bar{Q}$* | Q | $\bar{Q}$ | Q | $\bar{Q}$ |
| 22nd embodiment | | | | | | |
| Element circuit | 1st | 4th | 1st | 2nd | 3rd | 2nd |
| Output | Q | Q | $\bar{Q}$ | Q | Q | $\bar{Q}$ |
| 23rd embodiment | | | | | | |
| Element circuit | 1st | 4th | 1st | 4th | 3rd | 2nd |
| Output | Q | Q | $\bar{Q}$ | $\bar{Q}$ | $\bar{Q}$ | Q |

*) $\bar{Q}$ is inversion of Q

FIGS. 44, 45, 46, and 47 also illustrate examples of the results of logical operations on outputs of the individual element circuits in these embodiments. As shown in FIGS. 44 to 47, various pulse strings can also be obtained in the 22nd and 23rd embodiments as in the 21st embodiment. In particular, it is possible to obtain a pulse string whose period is six times the clock and pulse width is equal to the clock pulse and a pulse string whose period is six times the clock and duty ratio is 50%. However, an element circuit logical operation method for this purpose in one embodiment is not necessarily the same as in another. Also, the phase of a pulse string differs from one embodiment to another. Accordingly, these embodiments can be used to obtain pulse strings having different phases.

The circuit shown in FIG. 28 is merely one example of the 22nd embodiment. Therefore, the numbers of the third and fourth element circuits and their positions are, of course, not limited by the example in FIG. 28. Likewise, the circuit shown in FIG. 29 is merely one example of the 23rd embodiment, so the numbers of the third and fourth element circuits and their positions are not limited by the example in FIG. 29.

FIGS. 48A, 48B, and 48C show abstracted circuits of the first to 23rd embodiments described above.

In FIGS. 48A to 48C, reference numeral 70 denotes a first element circuit; 71, a fourth element circuit; 72, a first element circuit; 73, a second element circuit; 74, a third element circuit; 75, a second element circuit; 76, an inverting element circuit; 77, a first partial circuit; 78, a power supply terminal of the first partial circuit; 79, an input terminal of the first partial circuit; 80, an output terminal of the first partial circuit; 81, a second partial circuit; 82, a power supply terminal of the second partial circuit; 83, an input terminal of the second partial circuit; and 84, an output terminal of the second partial circuit. In the following description, the input and output terminals are also referred to as an input and an output, respectively, and the power supply terminal is also referred to as a power supply. The basic operation of the first partial circuit 77 is as follows.

(1) When the potential of the power supply 78 is a low potential L, the output 80 is the low potential L regardless of the input 79.

(2) When the potential of the power supply 78 is a high potential H, the output 80 keeps its initial value regardless of variations of the input 79.

(3) The inversion of the potential of the input 79 when the power supply 78 changes from the low potential L to the high potential H has the potential of the output 80. The basic operation of the second partial circuit 81 follows items (1) and (2) above and item (3)' below.

(3)' The potential of the input 83 when the power supply 82 changes from the low potential L to the high potential H is the potential of the output 84. As described previously, the first and second partial circuits can be constituted by using negative differential resistive elements and field-effect transistors. However, any circuit constituted by some other method is equally usable as long as the circuit performs the above basic operation. The first and second partial circuits using CLK as a power supply are defined as the first and third element circuits, and the first and second partial circuits using $\overline{CLK}$ as a power supply are defined as the second and fourth element circuits.

The sum of the numbers of the first and third element circuits and the sum of the numbers of the second and fourth element circuits are equally (N+1) (N is a non-negative integer). The sum of the numbers of the third and fourth element circuits and the inverting element circuit is an odd number. One electrical group is formed by connecting the outputs and inputs of the first to fourth element circuits and the inverting element circuit. As described previously, if only the first and second partial circuits meet the above conditions, the above function can be achieved regardless of practical methods of constituting the individual partial circuits.

In each of the first to 23rd embodiments described above, a high-mobility field-effect transistor (HEMT) having an undoped InGaAs semiconductor layer as a channel layer and an InAlAs layer as a barrier layer can be used as each field-effect transistor. Furthermore, any transistor which operates as a field-effect transistor, e.g., a metal-semiconductor field-effect transistor (MESFET) or a junction gate field-effect transistor (JFET), can be used as the field-effect transistor of the present invention. Also, a bipolar transistor can be used instead of a field-effect transistor.

In each of the above embodiments, the same voltage Vdd is applied to each power supply terminal. However, the applied power supply voltage can also be changed from one power supply terminal to another.

As has been described above, the present invention makes use of the functionality of an element having negative differential resistance characteristics and realizes a function of generating various pulse strings from a clock signal with a smaller number of elements and a simpler circuit configuration than in conventional techniques. This reduces the consumption power and increases the operating speed of the circuit.

What is claimed is:

1. A periodic waveform generating circuit comprising:
   first and second series circuits each comprising two semiconductor resistive elements having negative differential characteristics, an oscillating voltage source connected in series with said series-connected semiconductor resistive elements, and a three-terminal switching element connected in parallel with one of said semiconductor elements;
   first connecting means for connecting a connection point of said two semiconductor resistive elements of said first series circuit to an input of said switching element of said second series circuit; and
   second connecting means for connecting a connection point of said two semiconductor elements of said second series circuit to an input of said switching element of said first series circuit,
   wherein said oscillating voltage sources of said first and second series circuits generate oscillating currents of opposite phases, thereby extracting a periodic signal from one node of elements constituting one of said series circuits.

2. A circuit according to claim 1, wherein one of said first and second connecting means comprises an inverting element circuit.

3. A circuit according to claim 1, wherein each of said oscillating voltage sources comprises a field-effect transistor having source and drain output electrodes one of which is connected to a constant-voltage source, and an oscillating signal is supplied to a gate electrode of said field-effect transistor.

4. A circuit according to claim 1, wherein each of said switching elements comprises a field-effect transistor.

5. A circuit according to claim 1, wherein one terminal of each of said first and second series circuits is connected to a common potential.

6. A circuit according to claim 1, wherein a periodic output is extracted from one node of elements constituting each of said series circuits.

7. A periodic waveform generating circuit comprising:
not less than two cascaded units each comprising
first and second series circuits each comprising two semiconductor resistive elements having negative differential characteristics, an oscillating voltage source connected in series with said series-connected semiconductor resistive elements, and a three-terminal switching element connected in parallel with one of said semiconductor elements, and
first connecting means for connecting a connection point of said two semiconductor resistive elements of said first series circuit to an input of said switching element of said second series circuit;
second connecting means for connecting a connection point of said two semiconductor elements of said second series circuit in a last unit to an input of said switching element of said first series circuit of a first unit; and
third connecting means provided between intermediate units to connect a connection point of said two semiconductor elements of said second series circuit in a preceding unit to an input of said switching element of said first series circuit in a succeeding unit,
wherein said oscillating voltage sources of said first and second series circuits generate oscillating currents of opposite phases, thereby extracting a periodic signal from one node of elements constituting one of said series circuits in one of said units.

8. A circuit according to claim 7, wherein said second connecting means comprises an inverting element circuit.

9. A circuit according to claim 7, further comprising a logic circuit connected to an output of each of said units.

10. A circuit according to claim 7, wherein said second connecting means comprises an output circuit.

11. A periodic waveform generating circuit comprising a plurality of groups each comprising not less than two cascaded units each comprising
first and second series circuits each comprising two semiconductor resistive elements having negative differential characteristics, an oscillating voltage source connected in series with said series-connected semiconductor resistive elements, and a three-terminal switching element connected in parallel with one of said semiconductor elements, and
first connecting means for connecting a connection point of said two semiconductor resistive elements of said first series circuit to an input of said switching element of said second series circuit;
second connecting means for connecting a connection point of said two semiconductor elements of said second series circuit in a last unit to an input of said switching element of said first series circuit of a first unit; and
third connecting means provided between intermediate units to connect a connection point of said two semiconductor elements of said second series circuit in a preceding unit to an input of said switching element of said first series circuit in a succeeding unit,
wherein in each of said groups, said oscillating voltage sources of said first and second series circuits generate oscillating currents of opposite phases, thereby extracting a periodic signal from one node of elements constituting one of said series circuits further comprising, and
further comprising a logic circuit connected to one node of elements constituting one of said series circuits in one of said units in each group.

* * * * *

UNITED STATES PATENT AND TRADEMARK OFFICE
CERTIFICATE OF CORRECTION

PATENT NO. : 5,770,958
DATED : June 23, 1998
INVENTOR(S) : Arai et al.

It is certified that error appears in the above-identified patent and that said Letters Patent is hereby corrected as shown below:

In column 23, in table 7, at line 53, please delete "1-a(0,2n-1)" and insert --1-A(0,2n-1)--.

Signed and Sealed this

Sixth Day of July, 1999

*Attest:*

Q. TODD DICKINSON

*Attesting Officer*     *Acting Commissioner of Patents and Trademarks*